US012332565B2

(12) United States Patent
Ogihara et al.

(10) Patent No.: US 12,332,565 B2
(45) Date of Patent: *Jun. 17, 2025

(54) THERMOSETTING IODINE- AND SILICON-CONTAINING MATERIAL, COMPOSITION CONTAINING THE MATERIAL FOR FORMING RESIST UNDERLAYER FILM FOR EUV LITHOGRAPHY, AND PATTERNING PROCESS

(71) Applicant: SHIN-ETSU CHEMICAL CO., LTD., Tokyo (JP)

(72) Inventors: Tsutomu Ogihara, Joetsu (JP); Tsukasa Watanabe, Joetsu (JP); Yusuke Biyajima, Joetsu (JP); Masahiro Kanayama, Joetsu (JP); Ryo Mitsui, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/340,442

(22) Filed: Jun. 23, 2023

(65) Prior Publication Data

US 2023/0333472 A1    Oct. 19, 2023

Related U.S. Application Data

(62) Division of application No. 16/660,992, filed on Oct. 23, 2019.

(30) Foreign Application Priority Data

Nov. 21, 2018 (JP) .................................. 2018-218483

(51) Int. Cl.
*G03F 7/075* (2006.01)
*C07F 7/18* (2006.01)
(Continued)

(52) U.S. Cl.
CPC .......... *G03F 7/0752* (2013.01); *C07F 7/1804* (2013.01); *C08G 77/14* (2013.01);
(Continued)

(58) Field of Classification Search
CPC .......... G03F 7/11; G03F 7/0757; G03F 7/091; G03F 7/0752; G03F 7/36
See application file for complete search history.

(56) References Cited

U.S. PATENT DOCUMENTS 3,669,796 A    6/1972   Hall et al.
4,564,579 A    1/1986   Morita et al.
(Continued)

FOREIGN PATENT DOCUMENTS

EP    2 426 558 A1    3/2012
EP    2 628 744 A1    8/2013
(Continued)

OTHER PUBLICATIONS

Hutchinson. John M., "The Shot Noise Impact on Resist Roughness in EUV Lithography", SPIE, vol. 3331, pp. 531-536, (1998).
(Continued)

*Primary Examiner* — John S. Chu
(74) *Attorney, Agent, or Firm* — Oliff PLC

(57) ABSTRACT

The present invention is a thermosetting silicon-containing material containing one or more of a repeating unit shown by the following general formula (Sx-1), a repeating unit shown
(Continued)

by the following general formula (Sx-2), and a partial structure shown by the following general formula (Sx-3):

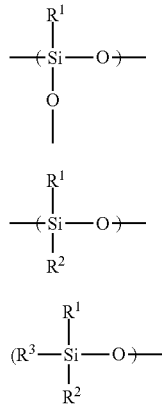

where $R^1$ represents an iodine-containing organic group; and $R^2$ and $R^3$ are each independently identical to $R^1$, a hydrogen atom, or a monovalent organic group having 1 to 30 carbon atoms. This provides: a thermosetting silicon-containing material used for forming a resist underlayer film which is capable of contributing to sensitivity enhancement of an upper layer resist while keeping LWR thereof from degrading; a composition for forming a silicon-containing resist underlayer film, the composition containing the thermosetting silicon-containing material; and a patterning process using the composition.

12 Claims, 1 Drawing Sheet

(51) Int. Cl.
C08G 77/14 (2006.01)
C08G 77/18 (2006.01)
C08G 77/24 (2006.01)
G03F 7/09 (2006.01)
G03F 7/11 (2006.01)
G03F 7/36 (2006.01)

(52) U.S. Cl.
CPC .............. *C08G 77/18* (2013.01); *C08G 77/24* (2013.01); *G03F 7/0751* (2013.01); *G03F 7/0757* (2013.01); *G03F 7/091* (2013.01); *G03F 7/11* (2013.01); *G03F 7/36* (2013.01)

(56) References Cited

U.S. PATENT DOCUMENTS

| | | |
|---|---|---|
| 2004/0236057 A1 | 11/2004 | Chevalier et al. |
| 2009/0136869 A1 | 5/2009 | Ogihara et al. |
| 2010/0069603 A1 | 3/2010 | Tanaka et al. |
| 2012/0052685 A1 | 3/2012 | Ogihara et al. |
| 2013/0210236 A1 | 8/2013 | Ogihara et al. |
| 2013/0280912 A1 | 10/2013 | Ogihara et al. |
| 2013/0323645 A1 | 12/2013 | Komuro et al. |
| 2014/0232018 A1 | 8/2014 | Shigaki et al. |
| 2014/0235796 A1 | 8/2014 | Ogihara et al. |
| 2017/0154766 A1 | 6/2017 | Ogihara et al. |
| 2017/0322491 A1 | 11/2017 | Shibayama et al. |
| 2018/0267402 A1 | 9/2018 | Hatakeyama et al. |
| 2018/0292753 A1 | 10/2018 | Tanaka et al. |
| 2018/0366319 A1* | 12/2018 | Coley .................... C09D 5/006 |
| 2020/0159120 A1 | 5/2020 | Ogihara et al. |
| 2020/0233303 A1 | 7/2020 | Ogihara et al. |
| 2020/0319550 A1 | 10/2020 | Fukushima et al. |

FOREIGN PATENT DOCUMENTS

| | | |
|---|---|---|
| JP | S60-17443 A | 1/1985 |
| JP | S60-80844 A | 5/1985 |
| JP | H04-107461 A | 4/1992 |
| JP | 2004-536210 A | 12/2004 |
| JP | 2009-126940 A | 6/2009 |
| JP | 2012-053253 A | 3/2012 |
| JP | 2013-167669 A | 8/2013 |
| JP | 2013-224279 A | 10/2013 |
| JP | 2014-006489 A | 1/2014 |
| JP | 2014-157242 A | 8/2014 |
| JP | 2017-095643 A | 6/2017 |
| KR | 10-2014-0089350 A | 7/2014 |
| KR | 10-2018-0106938 A | 10/2018 |
| TW | 200846400 A | 12/2008 |
| WO | 2013/051558 A1 | 4/2013 |
| WO | 2016/093172 A1 | 6/2016 |

OTHER PUBLICATIONS

Apr. 29, 2020 Extended Search Report issued in European Patent Application No. 19210759.7.
Yoshifumi, Maegawa et al., "A New Synthetic Approach for Functional Triisopropoxyorganosilanes Using Molecular Building Blocks", Tetrhedron, Elsevier Science Publishers, Amsterdam, NL, vol. 69, No. 26, pp. 5312-5318, XP028551479.
Feb. 22, 2021 Office Action issued in Korean Patent Application No. 10-2019-0149730.
Feb. 3, 2021 Office Action issued in Taiwanese Application No. 108142057.
Nov. 2, 2021 Office Action issued in Taiwanese Application No. 108142057.
Sep. 27, 2022 Office Action issued in Japanese Application No. 2019-183751.
Feb. 28, 2023 Office Action issued in Japanese Application 2019-183751.
Apr. 8, 2024 Office Action issued in U.S. Appl. No. 18/184,709.

* cited by examiner

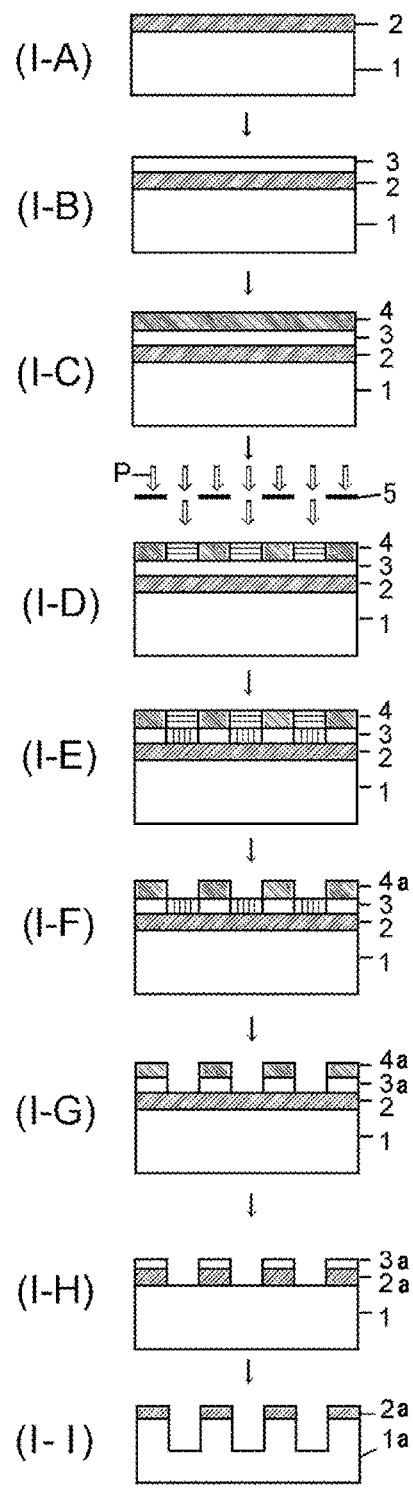

THERMOSETTING IODINE- AND SILICON-CONTAINING MATERIAL, COMPOSITION CONTAINING THE MATERIAL FOR FORMING RESIST UNDERLAYER FILM FOR EUV LITHOGRAPHY, AND PATTERNING PROCESS

CROSS REFERENCE TO RELATED APPLICATION

This application is a divisional application of U.S. application Ser. No. 16/660,992, filed Oct. 23, 2019, the contents of which are incorporated herein by reference.

TECHNICAL FIELD

The present invention relates to a thermosetting iodine- and silicon-containing material, a composition containing this material for forming a resist underlayer film for EUV lithography, and a patterning process.

BACKGROUND ART

As LSIs advance toward higher integration and higher processing speed, miniaturization of pattern rule is progressing rapidly. Particularly, logic devices used in smartphones and so forth lead this miniaturization, and 10 nm-node logic devices are mass-produced by employing a multiple-exposure process in ArF lithography (multiple patterning lithography).

The lithography for the next 7 nm-node or 5 nm-node appears to have problems that the multiple exposures increase the cost and affect the superposition precision. Hence, the advent of EUV lithography which requires fewer exposures has been sought.

The wavelength of an extreme ultraviolet (EUV), which is 13.5 nm, is $1/10$ or shorter than that of an ArF excimer laser, which is 193 nm. Thus, high contrast light and high resolution are expected from EUV lithography. Since EUV has short wavelength and high energy density, an acid generator is sensitized with a small amount of the photons. The number of the photons in EUV exposure is said to be $1/14$ of that of ArF exposure. In EUV exposure, phenomena in which variations of the photons degrade line width roughness (LWR) and hole critical dimension uniformity (CDU) are considered as a problem (Non Patent Document 1). Further, it is also pointed out that these properties are possibly influenced by the localization and agglomeration of a base polymer and an acid generator as well as the diffusion of acids generated from an acid generator.

As the countermeasure, it is possible to decrease LWR, for example, by decreasing the temperature for post exposure bake (PEB), but the sensitivity of an EUV resist is decreased. Further, LWR is also decreased by adding a quencher in a larger amount. Nevertheless, in this approach also, the sensitivity is decreased. For the practical application of an EUV resist, the trade-off relationship between sensitivity and LWR has to be overcome.

CITATION LIST

Non Patent Literature

Non Patent Document 1: SPIE, Vol. 3331, p. 531 (1998)

SUMMARY OF INVENTION

Technical Problem

In order to practically employ EUV lithography as a mass-production process of semiconductor devices, there are many issues to be addressed. Above all, as particularly important properties to be improved, it is necessary to increase sensitivity while keeping LWR.

The present invention has been made in view of the above-described circumstances. An object of the present invention is to provide: a thermosetting silicon-containing material used for forming a resist underlayer film which is capable of contributing to sensitivity enhancement of an upper layer resist while keeping LWR thereof from degrading; a composition for forming a silicon-containing resist underlayer film, the composition containing the thermosetting silicon-containing material; and a patterning process using this composition.

Solution to Problem

To achieve the object, the present invention provides a thermosetting silicon-containing material comprising one or more of a repeating unit shown by the following general formula (Sx-1), a repeating unit shown by the following general formula (Sx-2), and a partial structure shown by the following general formula (Sx-3):

wherein $R^1$ represents an iodine-containing organic group; and $R^2$ and $R^3$ are each independently identical to $R^1$, a hydrogen atom, or a monovalent organic group having 1 to 30 carbon atoms.

Such a thermosetting silicon-containing material makes it possible to obtain a composition for forming a resist underlayer film which is capable of contributing to sensitivity enhancement of an upper layer resist while keeping LWR thereof from degrading.

The $R^1$ is preferably shown by the following general formula (Sx-R1):

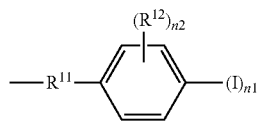
(Sx-R1)

wherein $R^{11}$ represents a single bond or a divalent organic group; $R^{12}$ represents a monovalent organic group having 1 to 10 carbon atoms, a hydroxyl group, or a halogen atom other than iodine; n1 is 1, 2, or 3; and n2 is 0, 1, or 2.

Such a thermosetting silicon-containing material can make a composition for forming a resist underlayer film which is capable of contributing to further sensitivity enhancement of an upper layer resist while keeping LWR thereof from degrading.

Moreover, the present invention provides a composition for forming a silicon-containing resist underlayer film for EUV lithography, comprising:
the above-described thermosetting silicon-containing material; and
a crosslinking catalyst.

Such a composition for forming a silicon-containing resist underlayer film in EUV lithography can form a resist underlayer film which is capable of contributing to sensitivity enhancement of an upper layer resist while keeping LWR thereof from degrading.

In this case, the crosslinking catalyst may be a sulfonium salt, an iodonium salt, a phosphonium salt, an ammonium salt, a polysiloxane having a structure containing one of these salts as a part, or an alkaline metal salt.

Such a crosslinking catalyst in combination with the inventive thermosetting silicon-containing material makes it possible to obtain a resist underlayer film which is capable of contributing to further sensitivity enhancement of an upper layer resist while keeping LWR thereof from degrading.

The inventive composition for forming a silicon-containing resist underlayer film for EUV lithography may further comprise at least one compound shown by the following general formula (P-0):

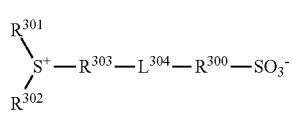
(P-O)

wherein $R^{300}$ represents a divalent organic group substituted with one or more fluorine atoms; $R^{301}$ and $R^{302}$ each independently represent a linear, branched, or cyclic monovalent hydrocarbon group having 1 to 20 carbon atoms optionally substituted with a hetero atom or optionally containing a hetero atom; $R^{303}$ represents a linear, branched, or cyclic divalent hydrocarbon group having 1 to 20 carbon atoms optionally substituted with a hetero atom or optionally containing a hetero atom; $R^{301}$ and $R^{302}$, or $R^{301}$ and $R^{303}$, are optionally bonded to each other to form a ring with a sulfur atom in the formula; and $L^{304}$ represents a single bond or a linear, branched, or cyclic divalent hydrocarbon group having 1 to 20 carbon atoms optionally substituted with a hetero atom or optionally containing a hetero atom.

Such a compound (acid generator) in combination with the inventive thermosetting silicon-containing material can make a resist underlayer film which is capable of contributing to the formation of an upper layer resist having a rectangular cross section while keeping the LWR of the upper layer resist from degrading.

In this case, the compound shown by the general formula (P-0) is preferably a compound shown by the following general formula (P-1):

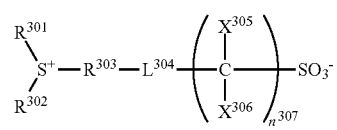
(P-1)

wherein $X^{305}$ and $X^{306}$ each independently represent a hydrogen atom, a fluorine atom, or a trifluoromethyl group, but both are not hydrogen atoms simultaneously; n307 represents an integer of 1 to 4; and $R^{301}$, $R^{302}$, $R^{303}$, and $L^{304}$ are as defined above.

When the compound shown by the general formula (P-0) is a compound shown by the general formula (P-1), the effects of the present invention are more sufficiently exhibited.

Further, the present invention provides a patterning process comprising:
forming an organic underlayer film on a body to be processed by using a coating-type organic underlayer film material;
forming a silicon-containing resist underlayer film on the organic underlayer film by using the above-described composition for forming a silicon-containing resist underlayer film;
forming a photoresist film on the silicon-containing resist underlayer film by using a chemically amplified resist composition;
after heat treatment, exposing the photoresist film to an EUV beam and dissolving an exposed part of the photoresist film by using an alkaline developer to form a positive pattern;
transferring the pattern to the silicon-containing resist underlayer film by dry etching using the photoresist film having the formed pattern as a mask;
transferring the pattern to the organic underlayer film by dry etching using the silicon-containing resist underlayer film having the transferred pattern as a mask; and
further transferring the pattern to the body to be processed by dry etching using the organic underlayer film having the transferred pattern as a mask.

When such a patterning process using the inventive composition for forming a silicon-containing resist underlayer film is carried out, by optimizing the combination with the organic underlayer film, the pattern formed in the photoresist can be formed onto the substrate without changing the size during the transfer.

Furthermore, the present invention provides a patterning process comprising:
forming an organic hard mask mainly containing carbon on a body to be processed by a CVD method;
forming a silicon-containing resist underlayer film on the organic hard mask by using the above-described composition for forming a silicon-containing resist underlayer film;

forming a photoresist film on the silicon-containing resist underlayer film by using a chemically amplified resist composition;

after heat treatment, exposing the photoresist film to an EUV beam and dissolving an exposed part of the photoresist film by using an alkaline developer to form a positive pattern;

transferring the pattern to the silicon-containing resist underlayer film by dry etching using the photoresist film having the formed pattern as a mask;

transferring the pattern to the organic hard mask by dry etching using the silicon-containing resist underlayer film having the transferred pattern as a mask; and further transferring the pattern to the body to be processed by dry etching using the organic hard mask having the transferred pattern as a mask.

When such a patterning process using the inventive composition for forming a silicon-containing resist underlayer film is carried out, by optimizing the combination with the CVD film, the pattern formed in the photoresist can be formed onto the substrate without changing the size during the transfer.

In these cases, the body to be processed may be a semiconductor device substrate, a metal film, an alloy film, a metal carbide film, a metal oxide film, a metal nitride film, a metal oxycarbide film, or a metal oxynitride film.

In the inventive patterning processes, the organic underlayer film or CVD film is formed on the body to be processed, so that the pattern can be formed onto the substrate (film) precisely without changing the size during the transfer.

Moreover, the metal of the body to be processed may be silicon, gallium, titanium, tungsten, hafnium, zirconium, chromium, germanium, copper, aluminum, cobalt, iron, or an alloy thereof.

When such a metal is used, the body to be processed is etched precisely, so that a positive pattern can be transferred with high precision to the body to be processed.

Advantageous Effects of Invention

A resist underlayer film having an iodine atom-substituted aromatic ring has the following characteristics. Since the resist underlayer film contains iodine atoms capable of showing high light absorption, secondary electrons generated from the iodine atoms produce a sensitization effect during light exposure. Further, an iodine atom has such a large atomic weight that the iodine produces a high effect of suppressing the acid diffusion from an upper layer resist into the resist underlayer film. The resist underlayer film is capable of increasing the sensitivity of the resist upper layer film while keeping the intrinsic LWR property of the resist upper layer film.

Furthermore, this resist underlayer film has high etching selectivity relative to an organic material, so that a photoresist pattern formed in the resist underlayer film can be successively transferred from the silicon-containing resist underlayer film to an organic underlayer film or CVD organic hard mask by dry etching process. Particularly, as the semiconductor-device manufacturing process progresses toward miniaturization recently, a photoresist film tends to be formed thinner to prevent pattern collapse after development, thereby making it difficult to transfer a pattern to a resist underlayer film. In contrast, the use of the inventive composition for forming a silicon-containing resist underlayer film makes it possible to suppress deformation of a photoresist pattern during dry etching and transfer this pattern to a substrate with high precision, even when a thin photoresist film is used as an etching mask.

BRIEF DESCRIPTION OF DRAWINGS

FIG. 1 is a flow diagram showing a patterning process of the present invention.

DESCRIPTION OF EMBODIMENTS

As described above, it has been desired to develop: a thermosetting silicon-containing material used for forming a resist underlayer film which can contribute to sensitivity enhancement of an upper layer resist while keeping LWR thereof from degrading; a composition for forming a silicon-containing resist underlayer film, the composition containing the thermosetting silicon-containing material; and a patterning process using the composition.

The present inventors have earnestly studied to achieve the above object and consequently found that the sensitivity of an upper layer resist can be improved without degrading the LWR thereof by introducing iodine atoms into a silicon-containing resist underlayer film. Thus, the present invention has been completed.

That is, the present invention is a thermosetting silicon-containing material comprising one or more of
a repeating unit shown by the following general formula (Sx-1),
a repeating unit shown by the following general formula (Sx-2), and
a partial structure shown by the following general formula (Sx-3):

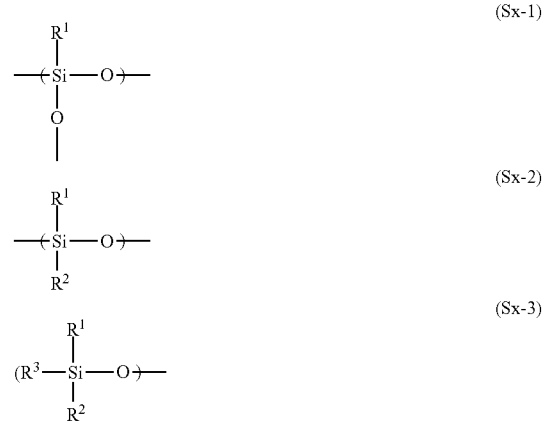

wherein $R^1$ represents an iodine-containing organic group; and $R^2$ and $R^3$ are each independently identical to $R^1$, a hydrogen atom, or a monovalent organic group having 1 to 30 carbon atoms.

Hereinafter, the present invention will be described in detail, but the present invention is not limited thereto.

[Thermosetting Silicon-Containing Material]

The inventive thermosetting silicon-containing material (Sx) contains one or more of a repeating unit shown by the general formula (Sx-1), a repeating unit shown by the general formula (Sx-2), and a partial structure shown by the general formula (Sx-3).

In each formula, $R^1$ is an iodine-containing organic group. In the present invention, the term "organic group" means a group containing carbon which may further contain hydrogen and also nitrogen, oxygen, sulfur, silicon, a halogen atom, or the like (the same applies hereinafter).

$R^1$ is not particularly limited as long as it is an iodine-containing organic group, and is preferably an organic group in which at least one hydrogen atom of an aromatic ring of an aryl group or an aralkyl group is substituted with an iodine atom.

The thermosetting silicon-containing material having such an iodine atom-substituted aromatic ring has the following characteristics. Specifically, since the thermosetting silicon-containing material contains iodine atoms capable of absorbing light greatly, when the thermosetting silicon-containing material is used to form a resist underlayer film, a sensitization effect is produced because of secondary electrons generated from the iodine atoms during exposure. Further, since an iodine atom has a large atomic weight, iodine has a high effect of suppressing the acid diffusion from an upper layer resist into the resist underlayer film. Moreover, the thermosetting silicon-containing material is capable of increasing the sensitivity of the resist upper layer film while keeping the LWR property the resist upper layer film intrinsically has.

$R^1$ having an iodine atom-substituted aromatic ring is preferably shown by the following general formula (Sx-R1):

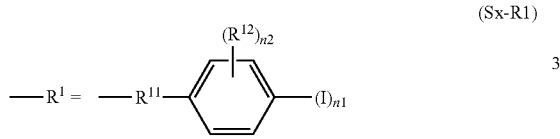

where $R^{11}$ represents a single bond or a divalent organic group; $R^{12}$ represents a monovalent organic group having 1 to 10 carbon atoms, a hydroxyl group, or a halogen atom other than iodine; n1 is 1, 2, or 3; and n2 is 0, 1, or 2.

In the case where $R^{11}$ is a divalent organic group, the divalent organic group is not particularly limited, but examples thereof include substituted or unsubstituted alkylene groups, substituted or unsubstituted alkenylene groups, substituted or unsubstituted arylene groups, substituted or unsubstituted aralkylene groups, —O—, —NH—, —CO—, —OCO—, —COO—, —OCOO—, and combinations thereof.

Specific examples of $R^{11}$ include a single bond, a methylene group, an ethylene group, a carbonyloxymethylene group, a carbonyloxyethylene group, a carbonyloxypropylene group, an oxymethylene group, an oxyethylene group, and an oxypropylene group.

$R^{12}$ is a monovalent organic group having 1 to 10 carbon atoms, a hydroxyl group, or a halogen atom other than iodine. Specific examples of $R^{12}$ include a methyl group, an ethyl group, a propyl group, a butyl group, a pentyl group, a hexyl group, a heptyl group, an octyl group, a nonyl group, a decyl group, a cyclopentyl group, a cyclohexyl group, a cycloheptyl group, a cyclopentylmethyl group, a cyclohexylmethyl group, a 4-methylcyclohexyl group, a vinyl group, an allyl group, a phenyl group, an ethynyl group, a methoxy group, an ethoxy group, a propoxy group, a butoxy group, a pentyloxy group, a hexyloxy group, a cyclopentyloxy group, a cyclohexyloxy group, a phenoxy group, a methoxymethyl group, an ethoxymethyl group, a propoxymethyl group, a butoxymethyl group, a p-methoxyphenyl group, a p-butoxyphenyl group, an acetoxymethyl group, a benzoyloxymethyl group, a methoxycarbonyl group, an ethoxycarbonyl group, a butoxycarbonyl group, a trimethylsilyl group, a triethylsilyl group, a hydroxyl group, fluorine, chlorine, bromine, and the like.

$R^2$ and $R^3$ are each independently identical to $R^1$, or a hydrogen atom or a monovalent organic group having 1 to 30 carbon atoms.

Examples of the organic group (Sx-R1) having an iodine atom-substituted aromatic ring shown as $R^1$ in the inventive iodine-containing, thermosetting silicon-containing materials (Sx-1), (Sx-2), and (Sx-3) include ones having structures shown by the following formulae. Note that, in the following formulae, (Si) is depicted to show a bonding site to Si.

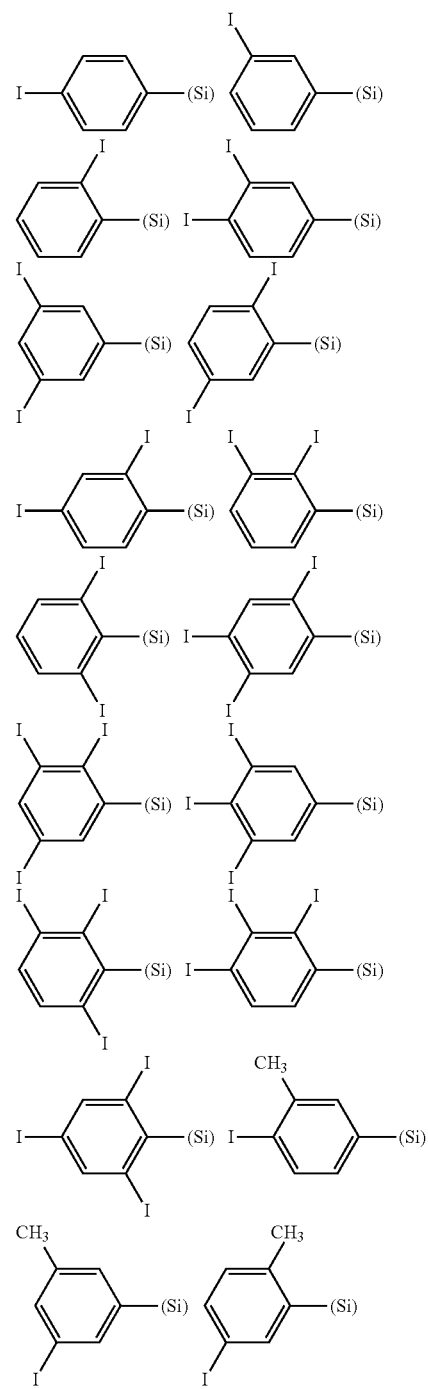

-continued
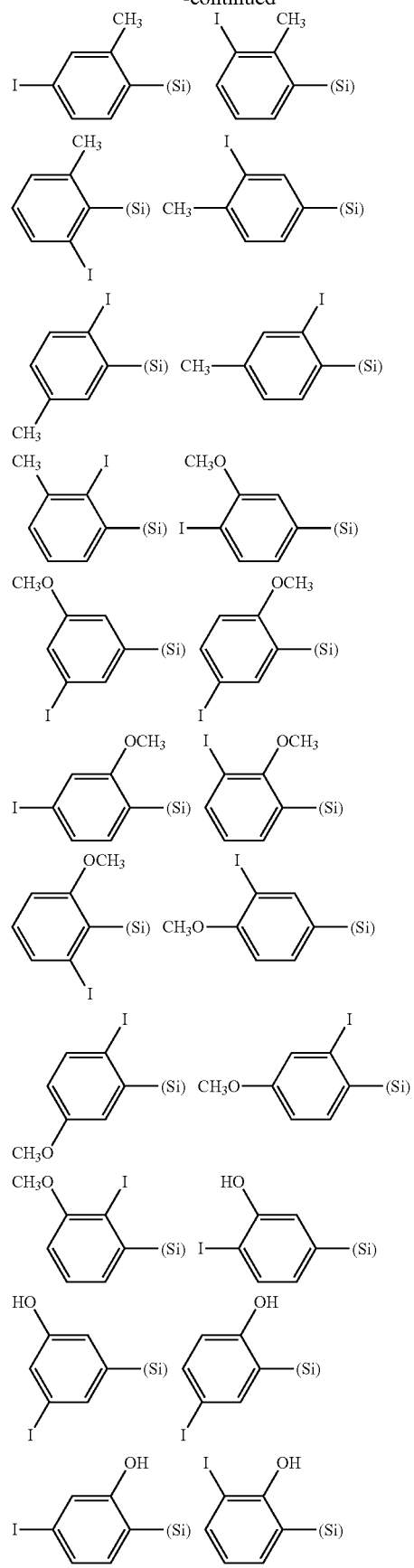
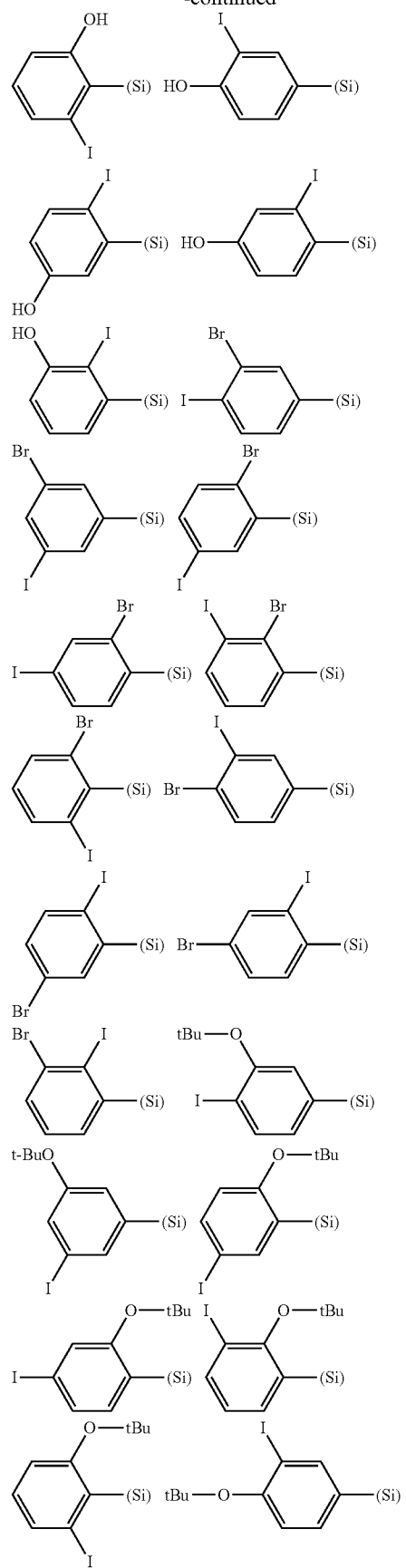

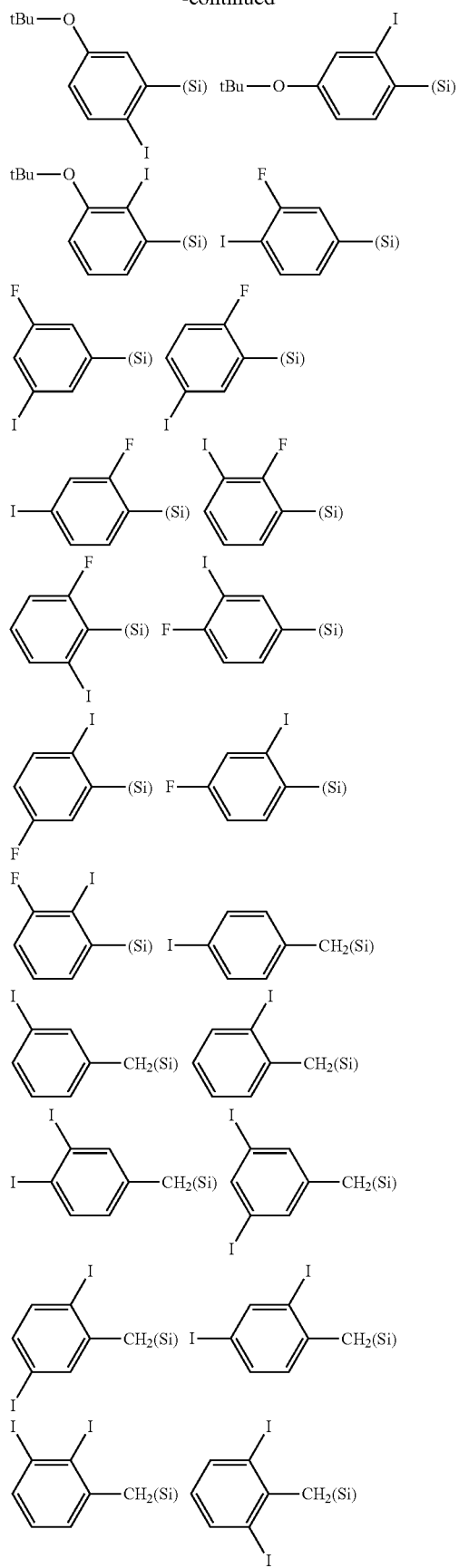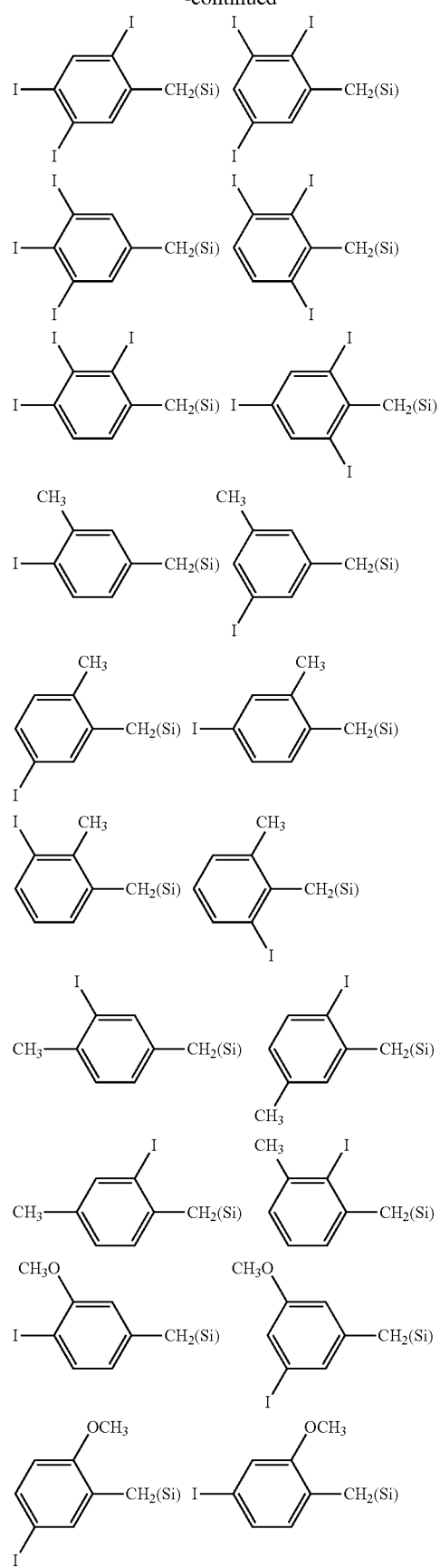

-continued
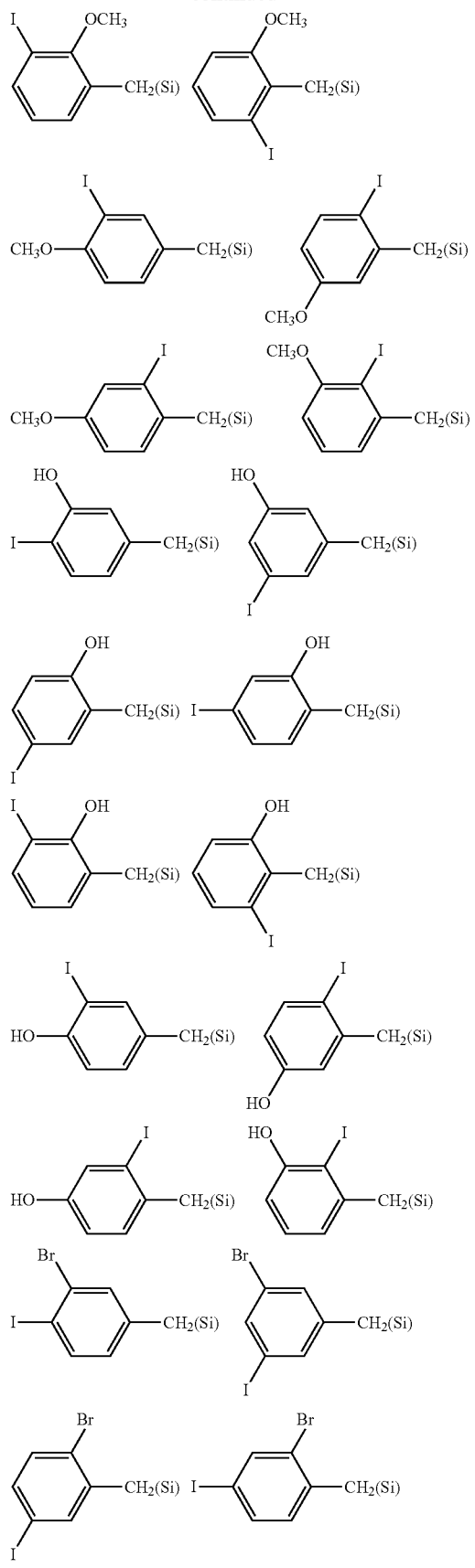
-continued
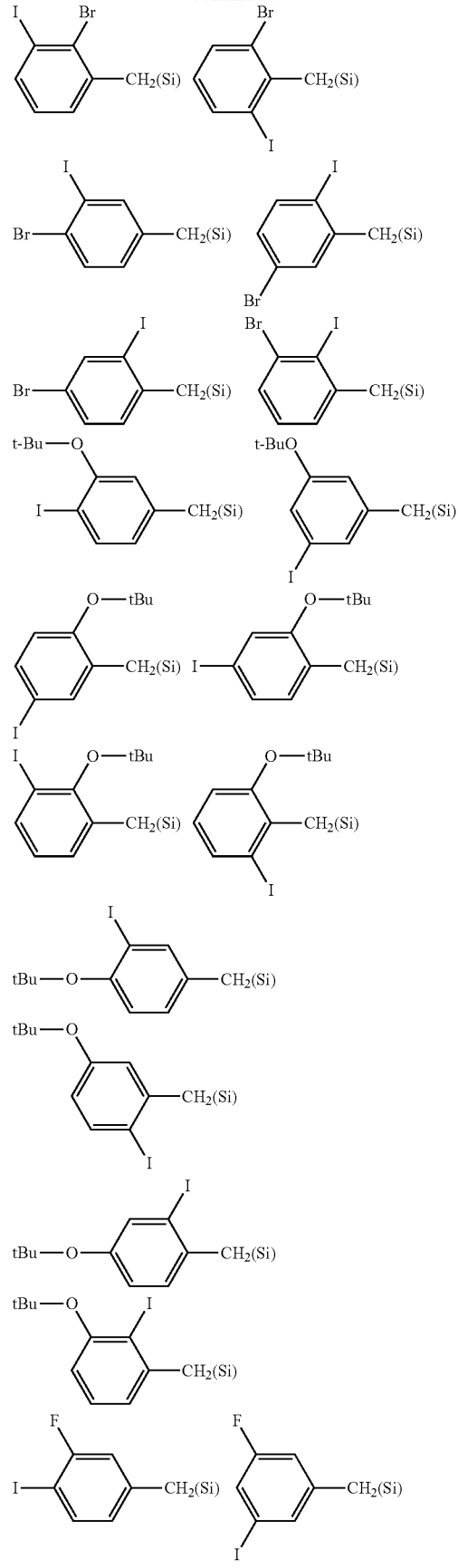

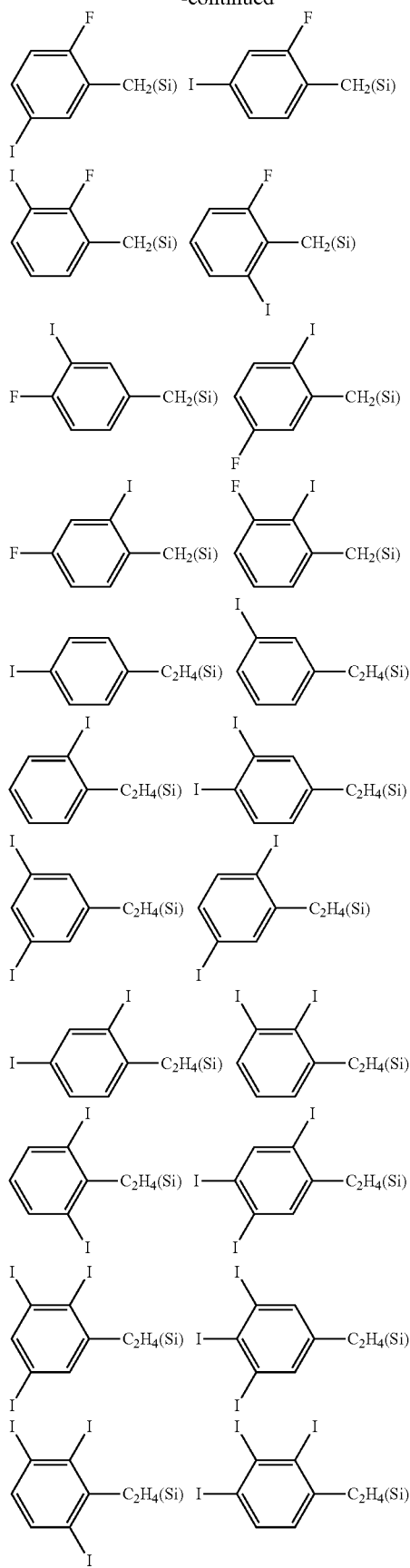
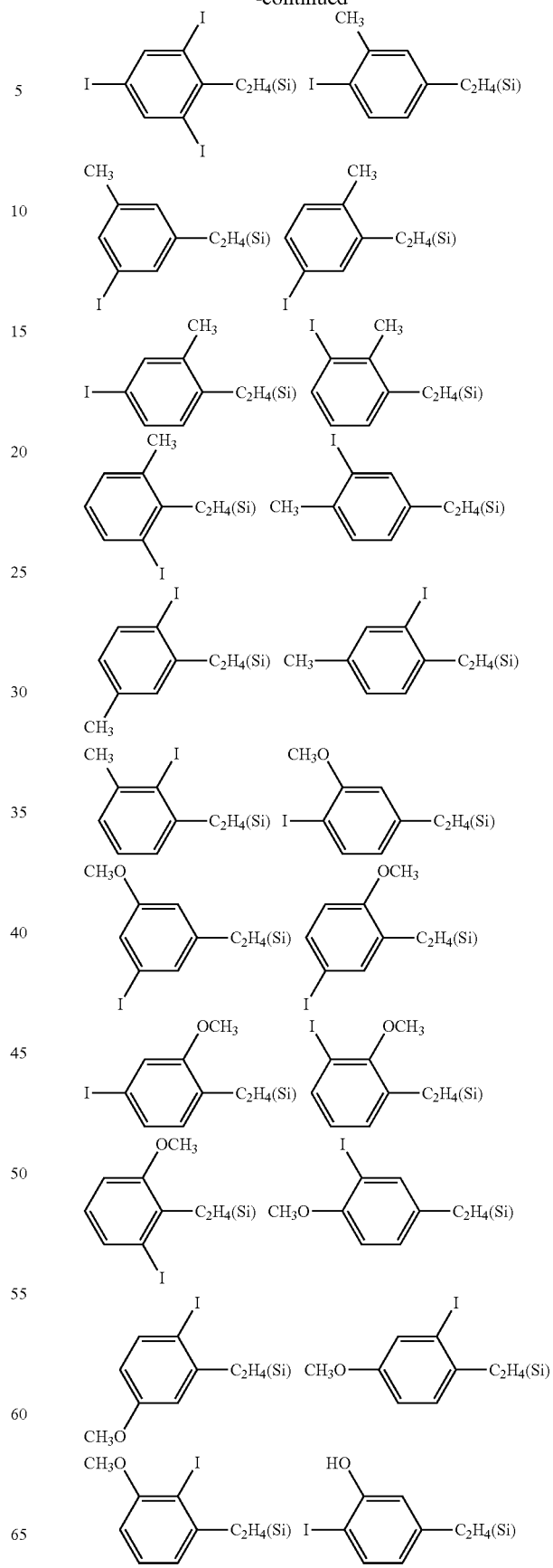

-continued
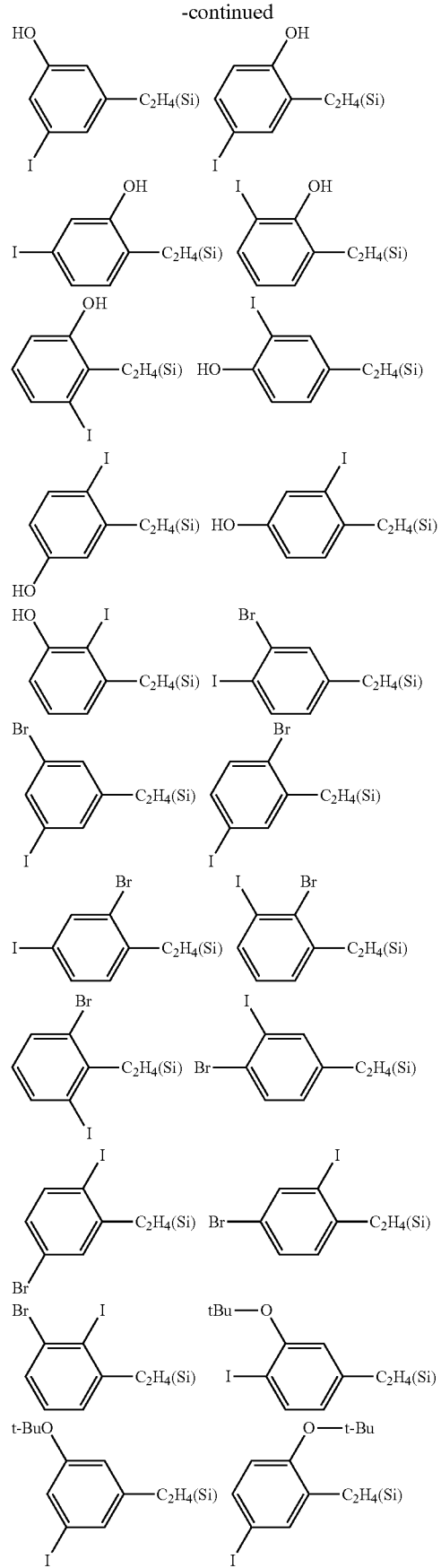
-continued
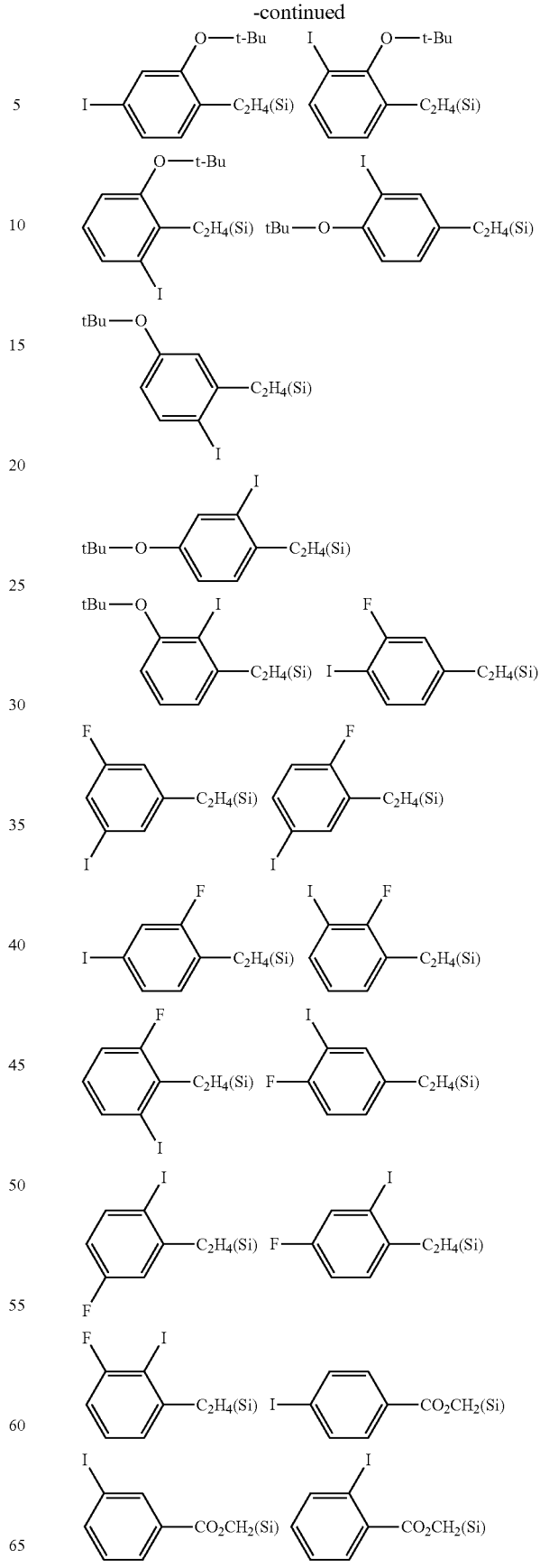

-continued
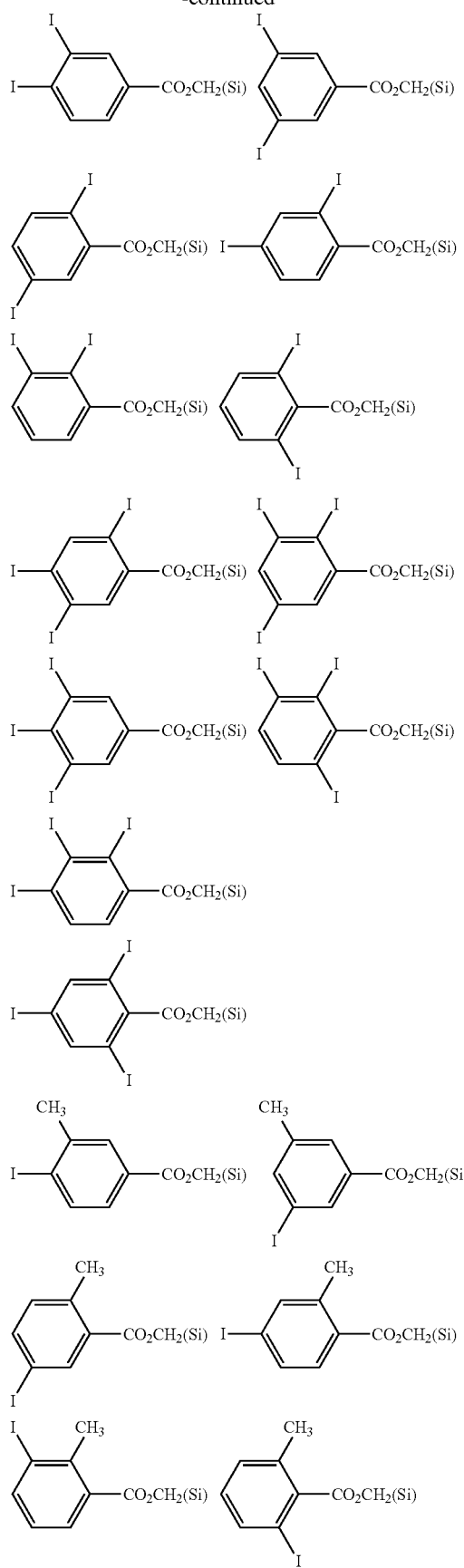
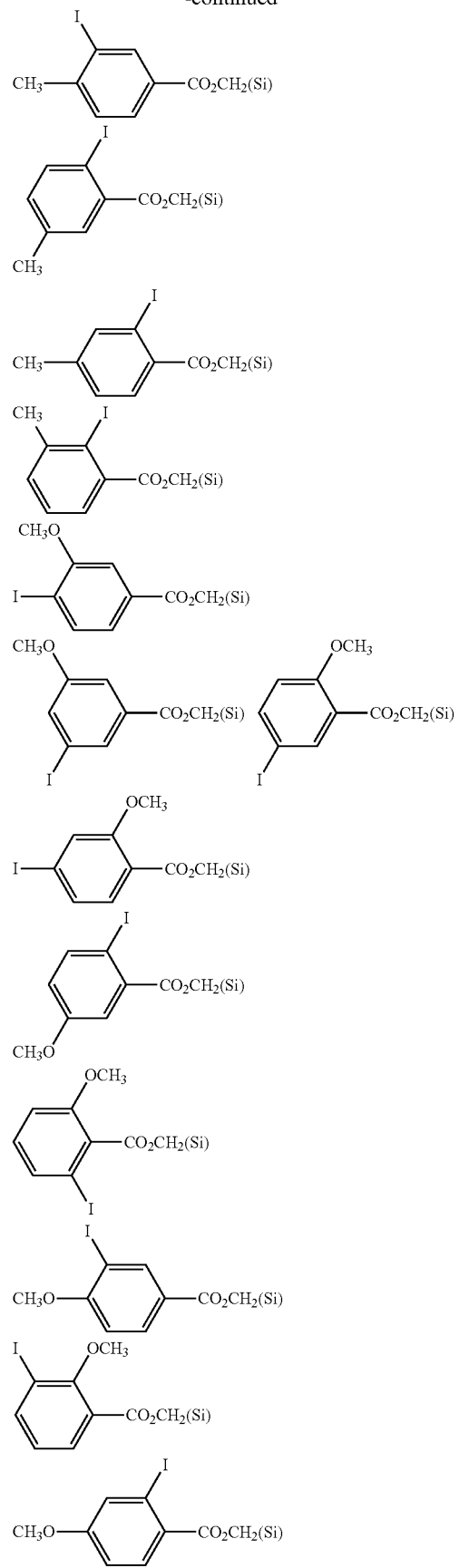

-continued
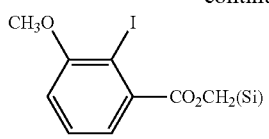
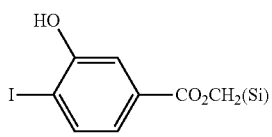
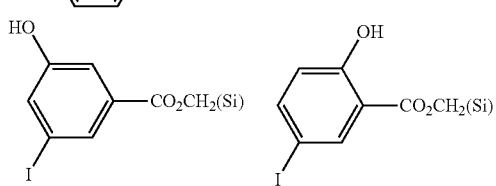
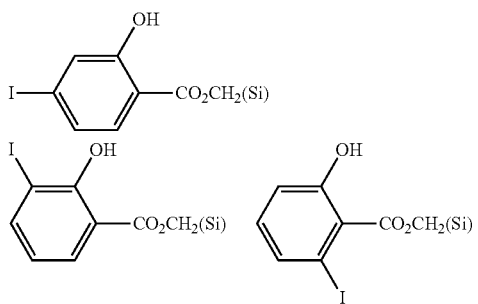
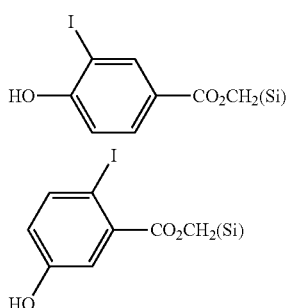
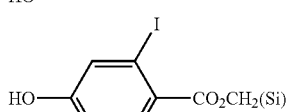
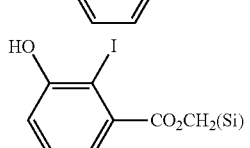
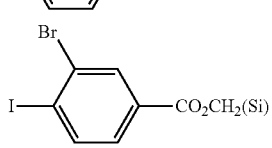
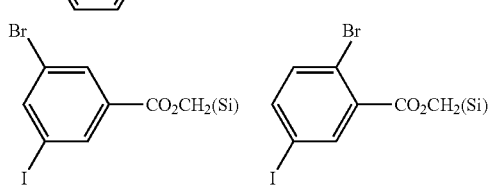
-continued
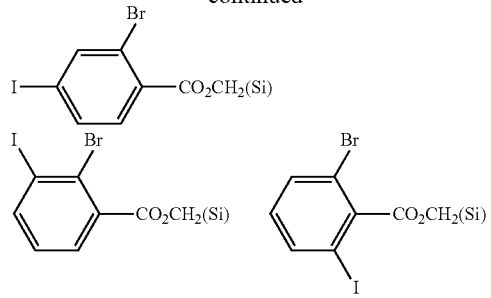
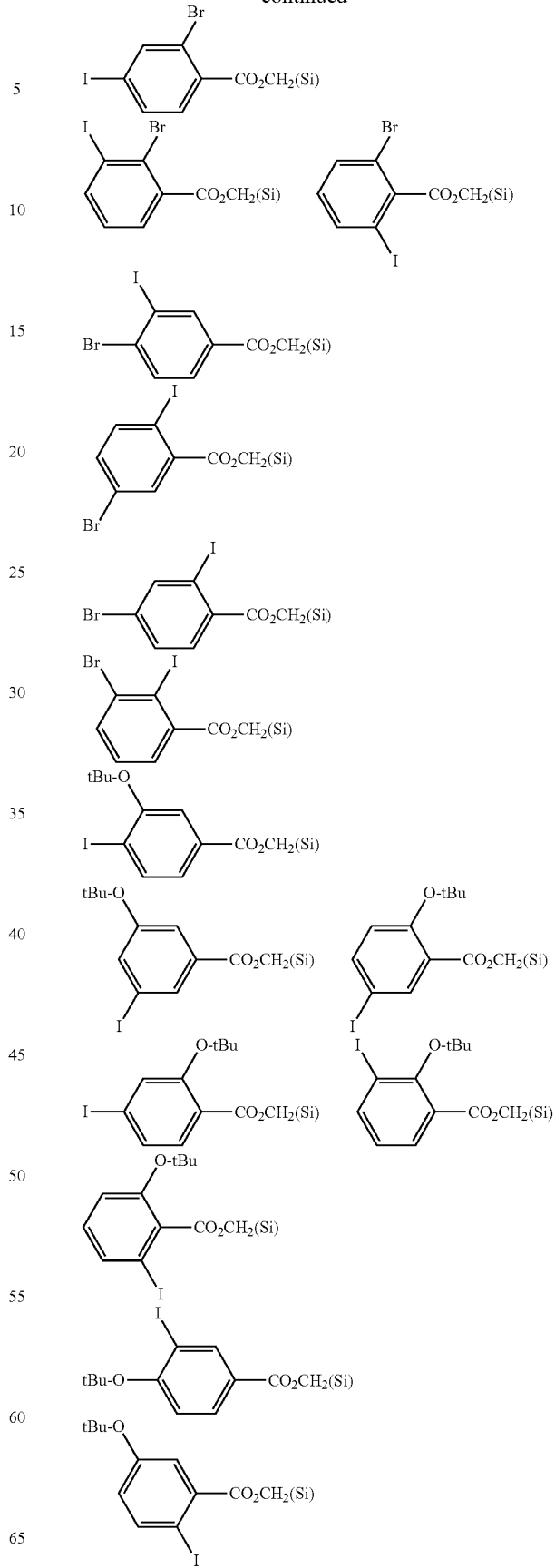

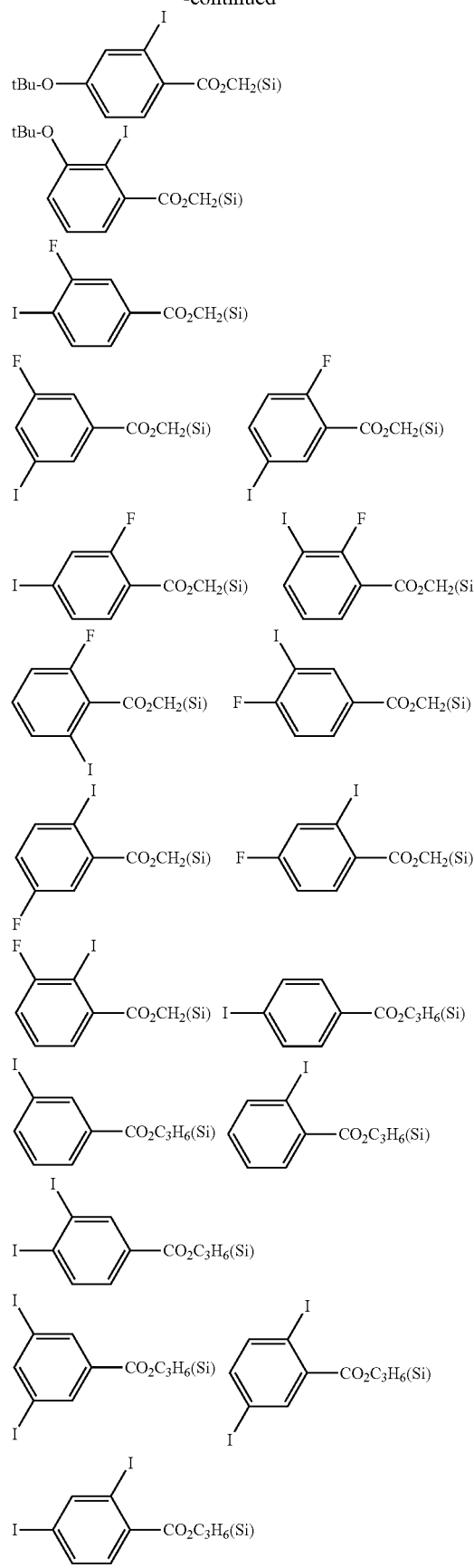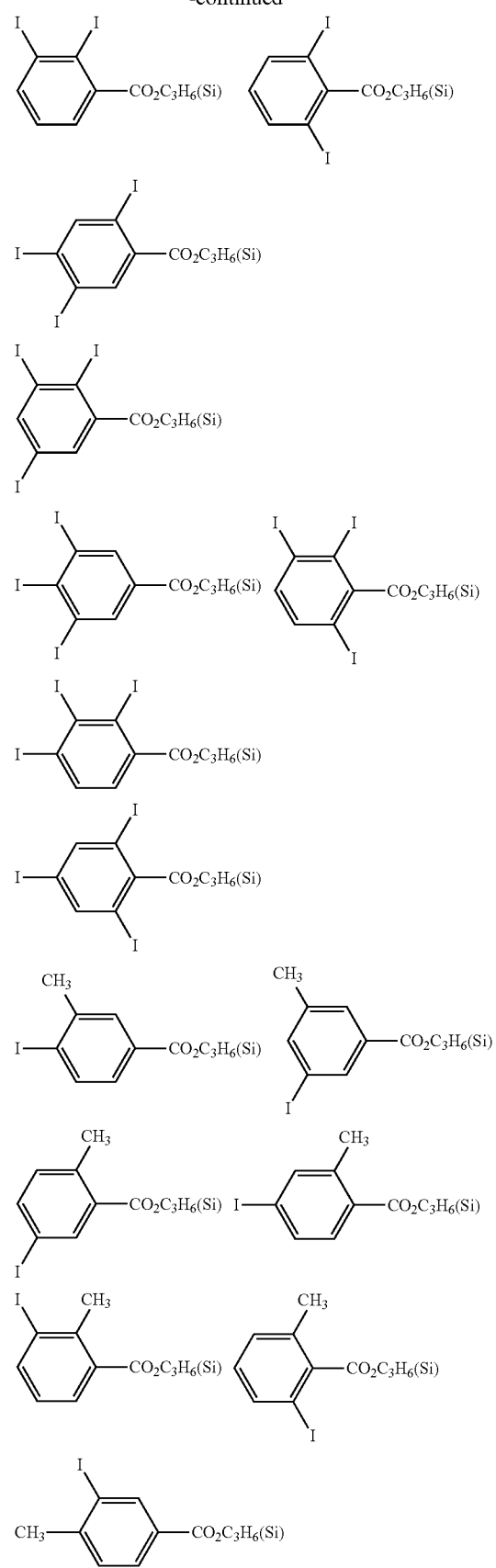

-continued
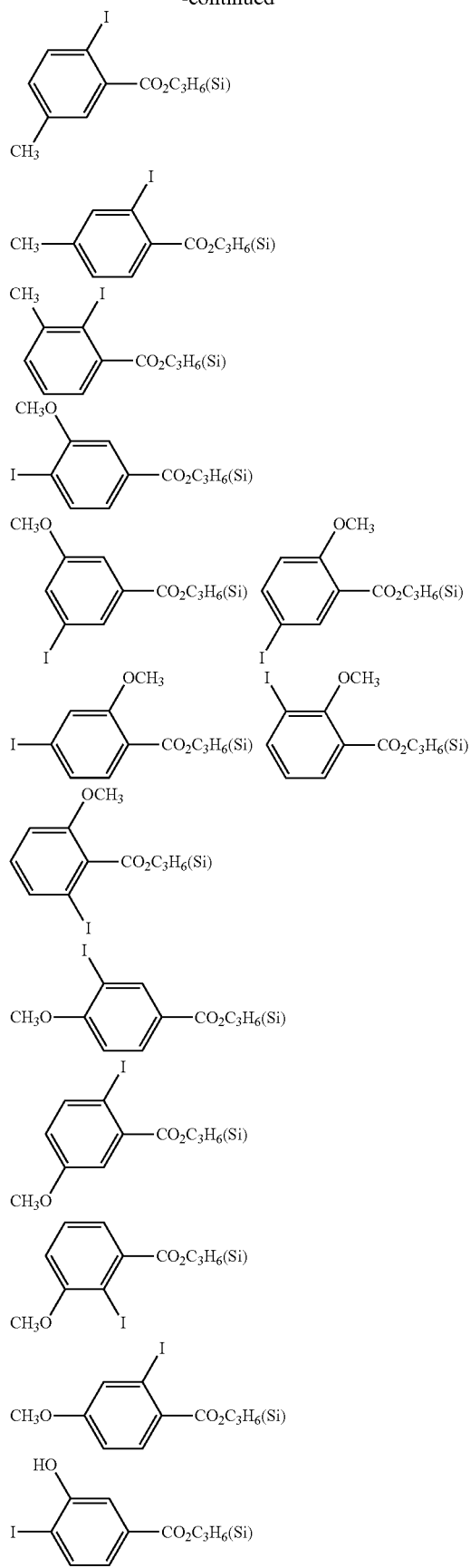
-continued
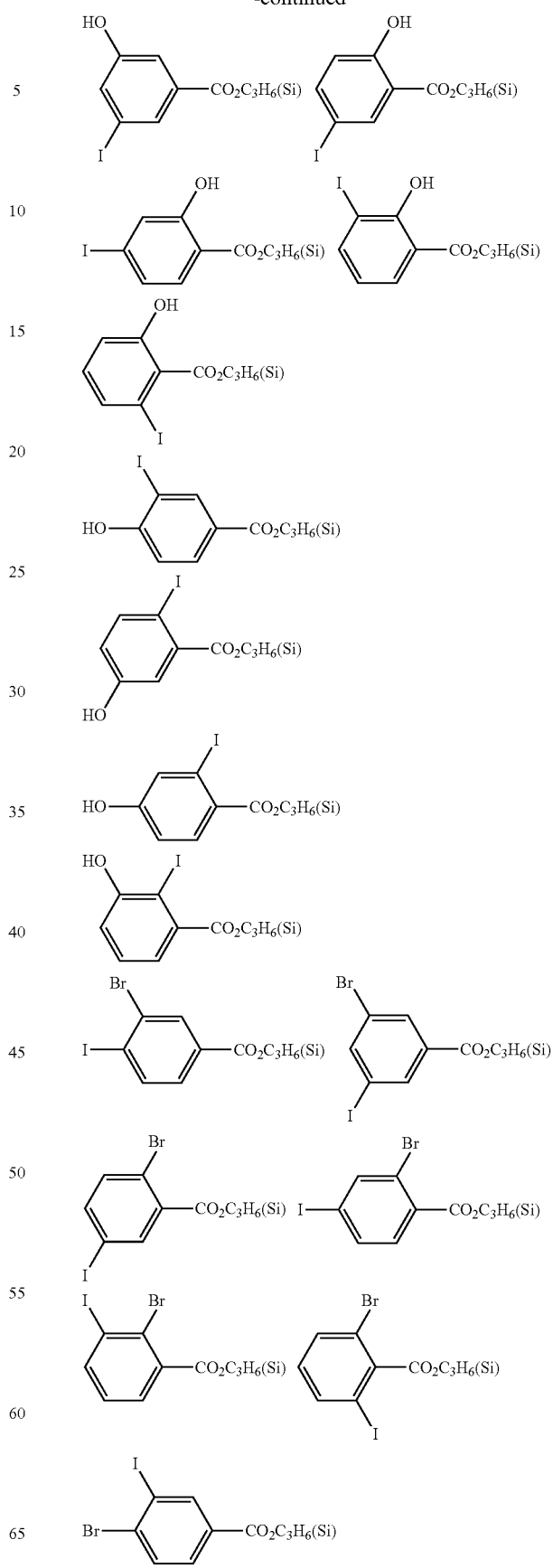

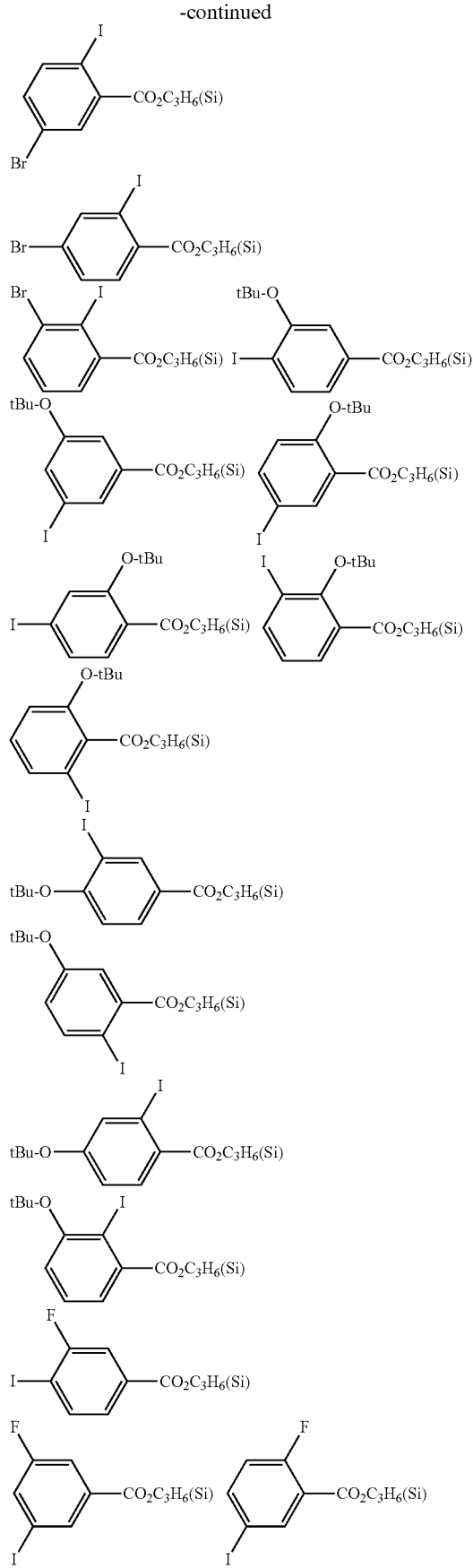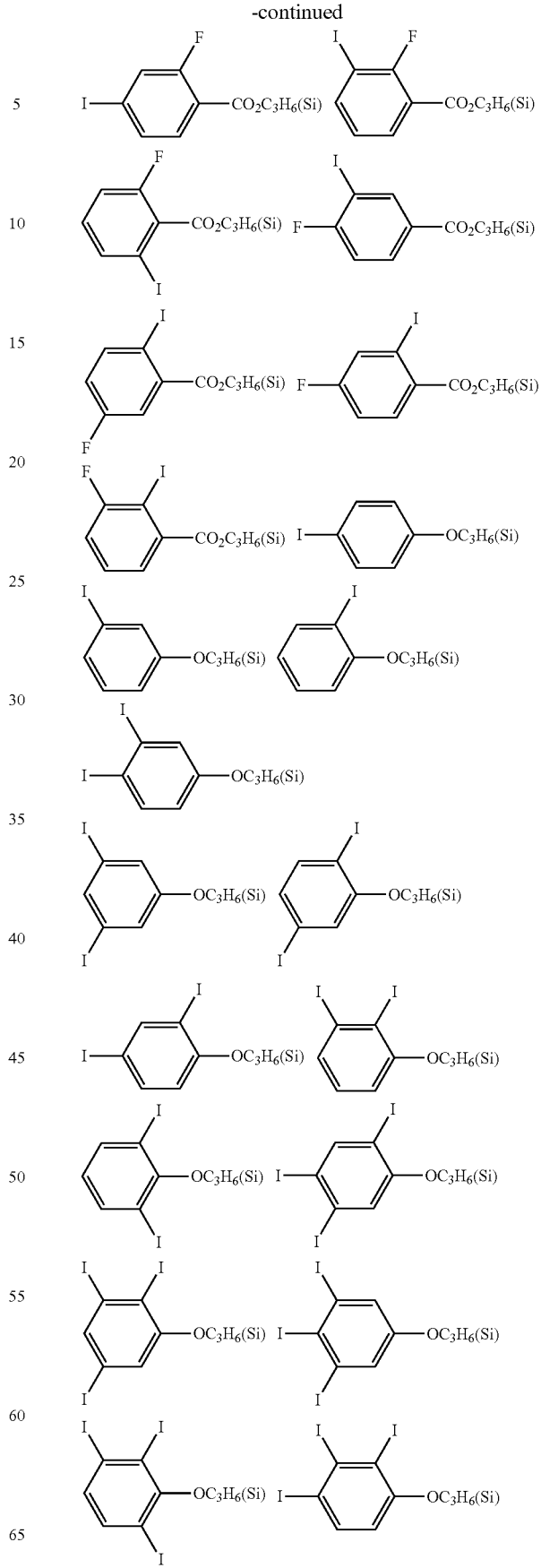

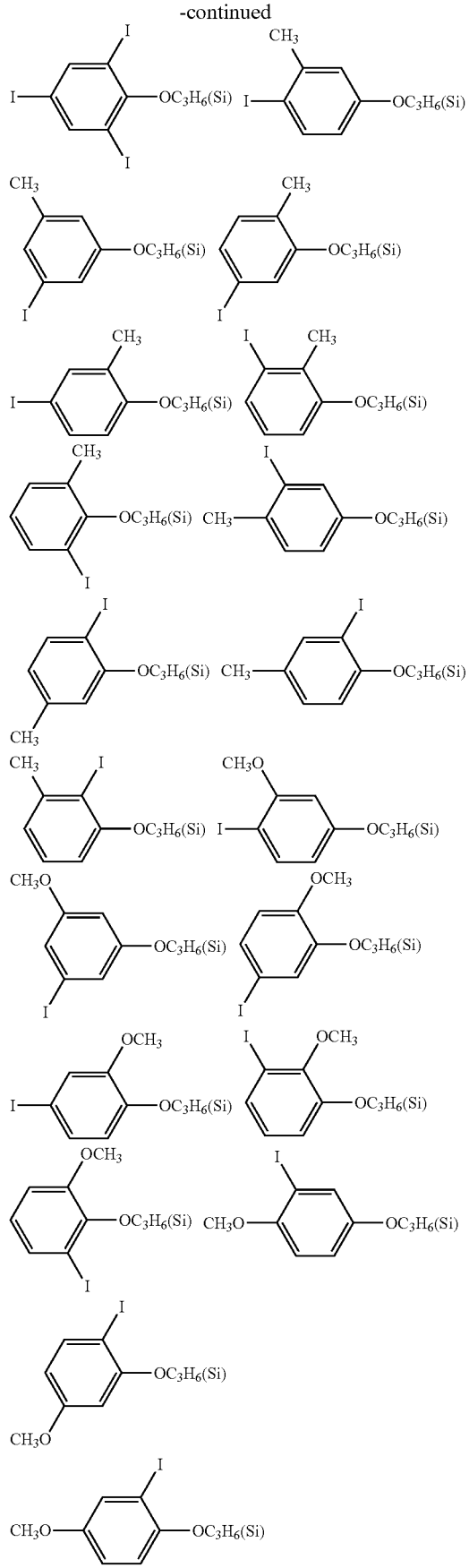
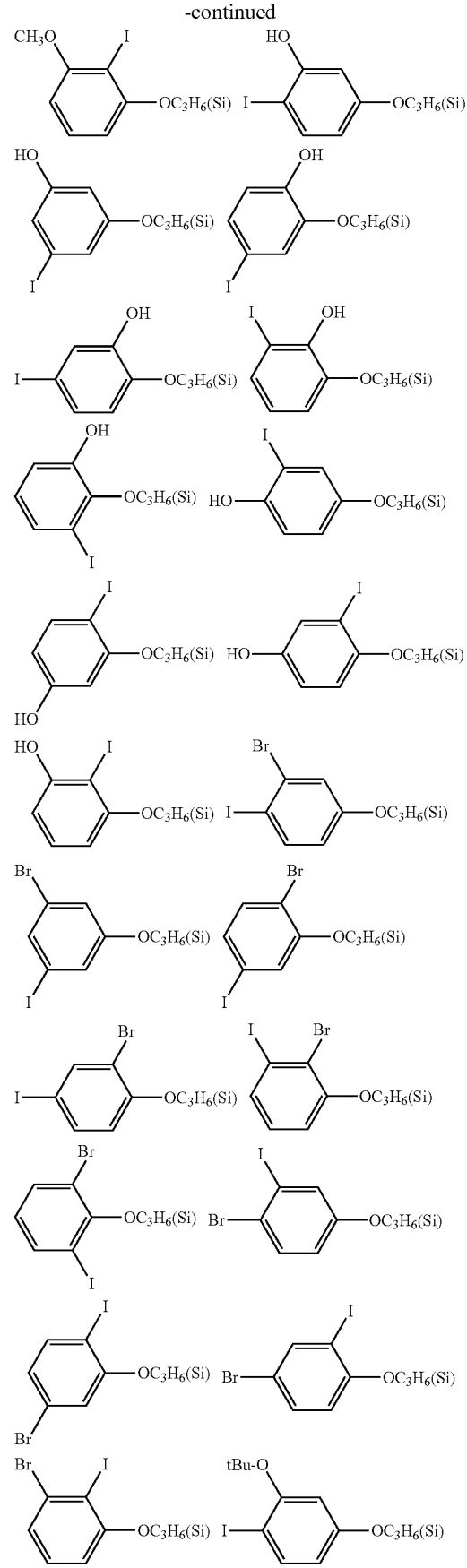

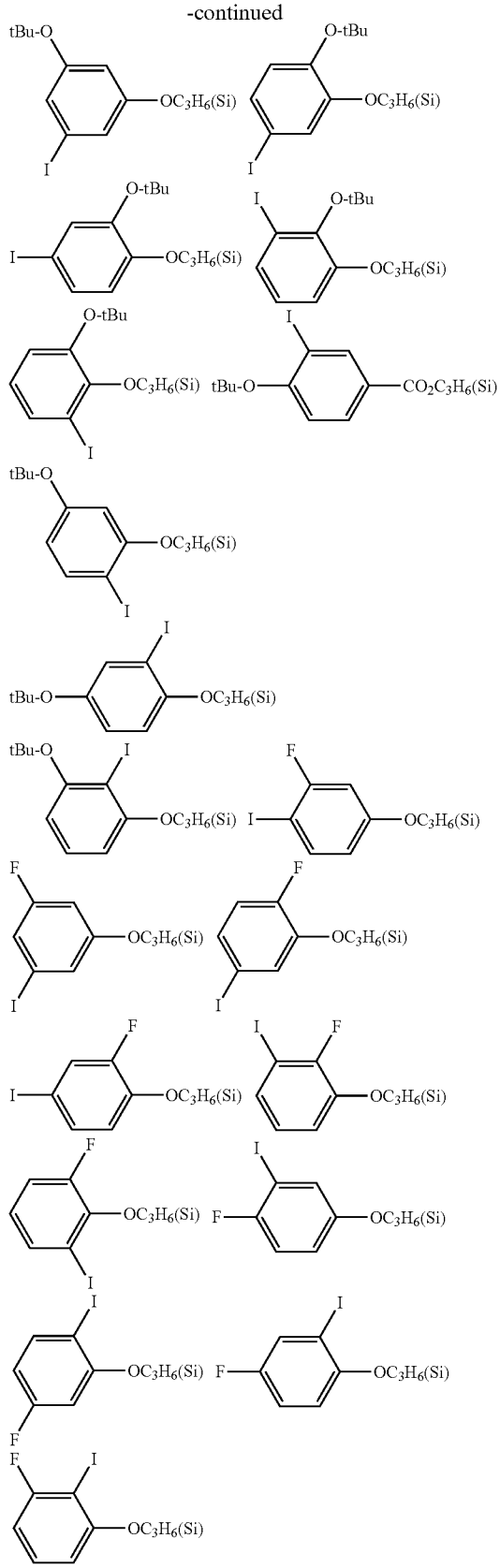

As to an iodine-containing hydrolysable monomer used as a raw material for forming the inventive structures, it is possible to use a monomer having one of the foregoing structures on a silicon atom and also containing, as a hydrolysable group(s): one, two, or three among chlorine, bromine, iodine, an acetoxy group, a methoxy group, an ethoxy group, a propoxy group, a butoxy group, and so forth; and if any, as $R^2$ or $R^3$, one or a combination of two or more among a hydrogen atom and monovalent organic groups having 1 to 30 carbon atoms.

An example of such an iodine-containing hydrolysable monomer includes a compound shown by the following general formula (Sm-I).

(Sm-I)

where $R^1$, $R^2$, and $R^3$ are as defined above; Y represents a hydrolysable group selected from chlorine, bromine, iodine, an acetoxy group, a methoxy group, an ethoxy group, a propoxy group, and a butoxy group; α represents an integer of 1 to 3, and β, and γ each represent 0 or 1, provided that $1 \leq (\alpha+\beta+\gamma) \leq 3$.

The inventive thermosetting silicon-containing material (Sx) can be produced by hydrolysis condensation of the iodine-containing hydrolysable monomer (Sm-I). Alternatively, the inventive silicon-containing material (Sx) can also be produced by hydrolysis condensation of a mixture containing this iodine-containing hydrolysable monomer and the following hydrolysable monomer (Sm).

Examples of the hydrolysable monomer (Sm) include tetramethoxysilane, tetraethoxysilane, tetrapropoxysilane, tetraisopropoxysilane, trimethoxysilane, triethoxysilane, tripropoxysilane, triisopropoxysilane, methyltrimethoxysilane, methyltriethoxysilane, methyltripropoxysilane, methyltriisopropoxysilane, ethyltrimethoxysilane, ethyltriethoxysilane, ethyltripropoxysilane, ethyltriisopropoxysilane, vinyltrimethoxysilane, vinyltriethoxysilane, vinyltripropoxysilane, vinyltriisopropoxysilane, propyltrimethoxysilane, propyltriethoxysilane, propyltripropoxysilane, propyltriisopropoxysilane, isopropyltrimethoxysilane, isopropyltriethoxysilane, isopropyltripropoxysilane, isopropyltriisopropoxysilane, butyltrimethoxysilane, butyltriethoxysilane, butyltripropoxysilane, butyltriisopropoxysilane, sec-butyltrimethoxysilane, sec-butyltriethoxysilane, sec-butyltripropoxysilane, sec-butyltriisopropoxysilane, t-butyltrimethoxysilane, t-butyltriethoxysilane, t-butyltripropoxysilane, t-butyltriisopropoxysilane, cyclopropyltrimethoxysilane, cyclopropyltriethoxysilane, cyclopropyltripropoxysilane, cyclopropyltriisopropoxysilane, cyclobutyltrimethoxysilane, cyclobutyltriethoxysilane, cyclobutyltripropoxysilane, cyclobutyltriisopropoxysilane, cyclopentyltrimethoxysilane, cyclopentyltriethoxysilane, cyclopentyltripropoxysilane, cyclopentyltriisopropoxysilane, cyclohexyltrimethoxysilane, cyclohexyltriethoxysilane, cyclohexyltripropoxysilane, cyclohexyltriisopropoxysilane, cyclohexenyltrimethoxysilane, cyclohexenyltriethoxysilane, cyclohexenyltripropoxysilane, cyclohexenyltriisopropoxysilane, cyclohexenylethyltrimethoxysilane, cyclohexenylethyltriethoxysilane, cyclohexenylethyltripropoxysilane, cyclohexenylethyltriisopropoxysilane, cyclooctyltrimethoxysilane, cyclooctyltriethoxysilane, cyclooctyltripropoxysilane, cyclooctyltriisopropoxysilane, cyclopentadienylpropyltrimethoxysilane, cyclopentadienylpropyltriethoxysilane, cyclopentadienylpropyltripropoxysilane, cyclopentadienylpropyltriisopropoxysilane, bicycloheptenyltrimethoxysilane, bicycloheptenyltriethoxysilane, bicycloheptenyltripropoxysilane, bicycloheptenyltriisopropoxysilane, bicycloheptyltrimethoxysilane, bicycloheptyltriethoxysilane, bicycloheptyltripropoxysilane, bicycloheptyltriisopropoxysilane, adamantyltrimethoxysilane, adamantyltriethoxysilane, adamantyltripropoxysilane, adamantyltriisopropoxysilane, phenyltrimethoxysilane, phenyltriethoxysilane, phenyltripropoxysilane, phenyltriisopropoxysilane, benzyltrimethoxysilane, benzyltriethoxysilane, benzyltripropoxysilane, benzyltriisopropoxysilane, anisyltrimethoxysilane, anisyltriethoxysilane, anisyltripropoxysilane, anisyltriisopropoxysilane, tolyltrimethoxysilane, tolyltriethoxysilane, tolyltripropoxysilane, tolyltriisopropoxysilane, phenethyltrimethoxysilane, phenethyltriethoxysilane, phenethyltripropoxysilane, phenethyltriisopropoxysilane, naphthyltrimethoxysilane, naphthyltriethoxysilane, naphthyltripropoxysilane, naphthyltriisopropoxysilane, dimethyldimethoxysilane, dimethyldiethoxysilane, methylethyldimethoxysilane, methylethyldiethoxysilane, dimethyldipropoxysilane, dimethyldiisopropoxysilane, diethyldimethoxysilane, diethyldiethoxysilane, diethyldipropoxysilane, diethyldiisopropoxysilane, dipropyldimethoxysilane, dipropyldiethoxysilane, dipropyldipropoxysilane, dipropyldiisopropoxysilane, diisopropyldimethoxysilane, diisopropyldiethoxysilane, diisopropyldipropoxysilane, diisopropyldiisopropoxysilane, dibutyldimethoxysilane, dibutyldiethoxysilane, dibutyldipropoxysilane, dibutyldiisopropoxysilane, di-sec-butyldimethoxysilane, di-sec-butyldiethoxysilane, di-sec-butyldipropoxysilane, di-sec-butyldiisopropoxysilane, di-t-butyldimethoxysilane, di-t-butyldiethoxysilane, di-t-butyldipropoxysilane, di-t-butyldiisopropoxysilane, dicyclopropyldimethoxysilane, dicyclopropyldiethoxysilane, dicyclopropyldipropoxysilane, dicyclopropyldiisopropoxysilane, dicyclobutyldimethoxysilane, dicyclobutyldiethoxysilane, dicyclobutyldipropoxysilane, dicyclobutyldiisopropoxysilane, dicyclopentyldimethoxysilane, dicyclopentyldiethoxysilane, dicyclopentyldipropoxysilane, dicyclopentyldiisopropoxysilane, dicyclohexyldimethoxysilane, dicyclohexyldiethoxysilane, dicyclohexyldipropoxysilane, dicyclohexyldiisopropoxysilane, dicyclohexenyldimethoxysilane, dicyclohexenyldiethoxysilane, dicyclohexenyldipropoxysilane, dicyclohexenyldiisopropoxysilane, dicyclohexenylethyldimethoxysilane, dicyclohexenylethyldiethoxysilane, dicyclohexenylethyldipropoxysilane, dicyclohexenylethyldiisopropoxysilane, dicyclooctyldimethoxysilane, dicyclooctyldiethoxysilane, dicyclooctyldipropoxysilane, dicyclooctyldiisopropoxysilane, dicyclopentadienylpropyldimethoxysilane, dicyclopentadienylpropyldiethoxysilane, dicyclopentadienylpropyldipropoxysilane, dicyclopentadienylpropyldiisopropoxysilane, bis(bicycloheptenyl)dimethoxysilane, bis(bicycloheptenyl)diethoxysilane, bis(bicycloheptenyl)dipropoxysilane, bis(bicycloheptenyl)diisopropoxysilane, bis(bicycloheptyl)dimethoxysilane, bis(bicycloheptyl)diethoxysilane, bis(bicycloheptyl)dipropoxysilane, bis(bicycloheptyl)diisopropoxysilane, diadamantyldimethoxysilane, diadamantyldiethoxysilane, diadamantyldipropoxysilane, diadamantyldiisopropoxysilane, diphenyldimethoxysilane, diphenyldiethoxysilane, methylphenyldimethoxysilane, methylphenyldiethoxysilane, diphenyldipropoxysilane, diphenyldiisopropoxysilane, trimethylmethoxysilane, trimethylethoxysilane, dimethylethylmethoxysilane, dimethylethylethoxysilane, dimethylphenylmethoxysilane, dimethylphenylethoxysilane, dimethylbenzylmethoxysilane, dimethylbenzylethoxysilane, dimethylphenethylmethoxysilane, dimethylphenethylethoxysilane, and the like.

Preferable examples of the monomer Sm include tetramethoxysilane, tetraethoxysilane, methyltrimethoxysilane, methyltriethoxysilane, ethyltrimethoxysilane, ethyltriethoxysilane, vinyltrimethoxysilane, vinyltriethoxysilane, propyltrimethoxysilane, propyltriethoxysilane, isopropyltrimethoxysilane, isopropyltriethoxysilane, butyltrimethoxysilane, butyltriethoxysilane, isobutyltrimethoxysilane, isobutyltriethoxysilane, allyltrimethoxysilane, allyltriethoxysilane, cyclopentyltrimethoxysilane, cyclopentyltriethoxysilane, cyclohexyltrimethoxysilane, cyclohexyltriethoxysilane, cyclohexenyltrimethoxysilane, cyclohexenyltriethoxysilane, phenyltrimethoxysilane, phenyltriethoxysilane, benzyltrimethoxysilane, benzyltriethoxysilane, tolyltrimethoxysilane, tolyltriethoxysilane, anisyltrimethoxysilane, anisyltriethoxysilane, phenethyltrimethoxysilane, phenethyltriethoxysilane, dimethyldimethoxysilane, dimethyldiethoxysilane, diethyldimethoxysilane, diethyldiethoxysilane, methylethyldimethoxysilane, methylethyldiethoxysilane, dipropyldimethoxysilane, dibutyldimethoxysilane, methylphenyldimethoxysilane, methylphenyldiethoxysilane, trimethylmethoxysilane, dimethylethylmethoxysilane, dimethylphenylmethoxysilane, dimethylbenzylmethoxysilane, dimethylphenethylmethoxysilane, and the like.

Other examples of the organic group shown by $R^2$ and $R^3$ include organic groups having one or more carbon-oxygen single bonds or carbon-oxygen double bonds, specifically organic groups having one or more groups selected from the group consisting of cyclic ether groups, ester groups, alkoxy groups, and a hydroxy group. Examples of the organic groups include ones shown by the following general formula (Sm-R).

$$(P-Q_1-(S_1)_{v1}-Q_2-)_u-(T)_{v2}-Q_3-(S_2)_{v3}-Q_4 \quad \text{(Sm-R)}$$

In the general formula (Sm-R), P represents a hydrogen atom, a cyclic ether group, a hydroxyl group, an alkoxy group having 1 to 4 carbon atoms, an alkylcarbonyloxy group having 1 to 6 carbon atoms, or an alkylcarbonyl group having 1 to 6 carbon atoms; $Q_1$, $Q_2$, $Q_3$, and $Q_4$ each independently represent $-C_qH_{(2q-p)}P_p-$, where P is as defined above, "p" represents an integer of 0 to 3, and "q" represents an integer of 0 to 10, provided that q=0 means a single bond; "u" represents an integer of 0 to 3; $S_1$ and $S_2$ each independently represent $-O-$, $-CO-$, $-OCO-$, $-COO-$, or $-OCOO-$. v1, v2, and v3 each independently represent 0 or 1. In addition to these, T represents a divalent atom other than carbon, or a divalent group of an alicyclic, aromatic, or heterocyclic ring.

As T, examples of the alicyclic, aromatic, or heterocyclic ring optionally containing a hetero atom such as an oxygen atom are shown below. In T, positions bonded to $Q_2$ and $Q_3$ are not particularly limited, and can be selected appropriately in consideration of reactivity dependent on steric factors, availability of commercial reagents used in the reaction, and so on.

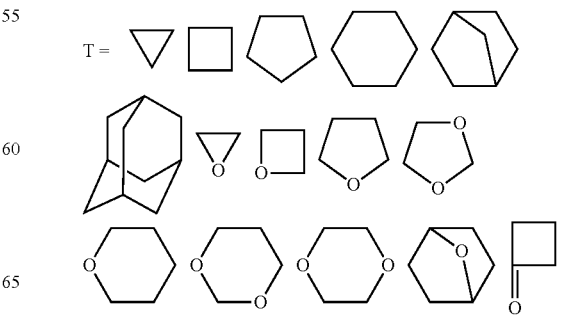

-continued
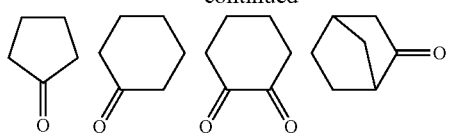
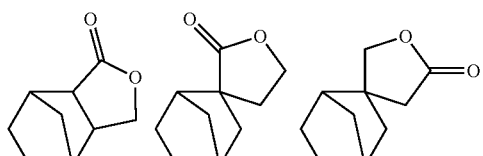
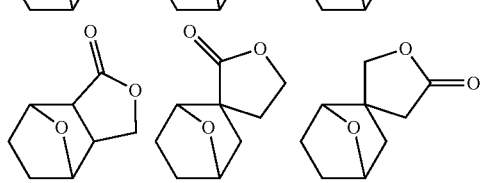
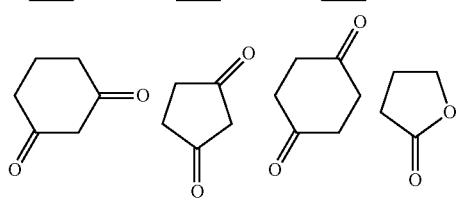
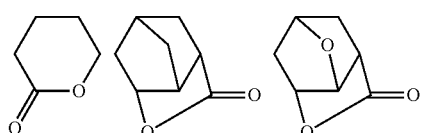
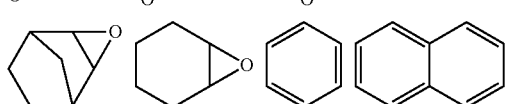
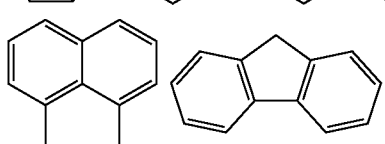
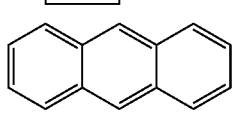
Preferable examples of the organic groups having one or more carbon-oxygen single bonds or carbon-oxygen double bonds in the general formula (Sm-R) include the following. Note that, in the following formulae, (Si) is depicted to show a bonding site to Si.
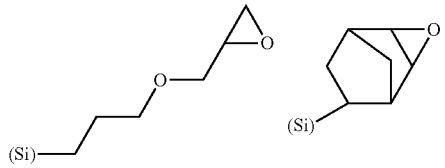
-continued
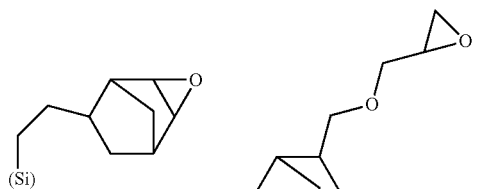
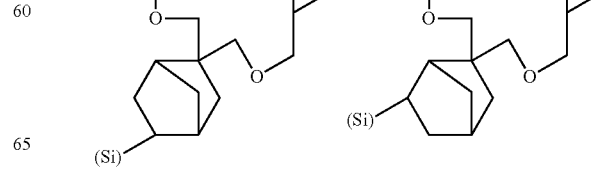

-continued
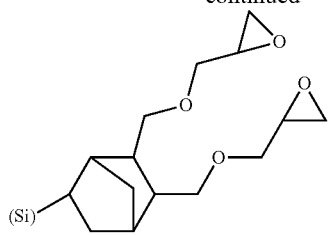
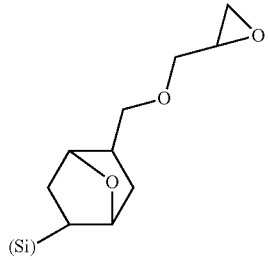
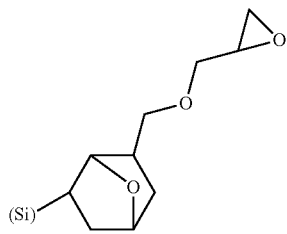
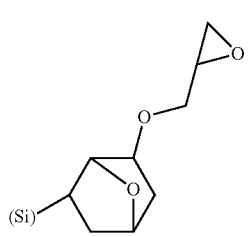
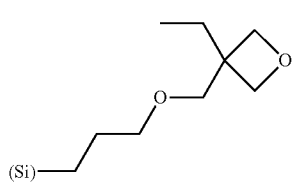
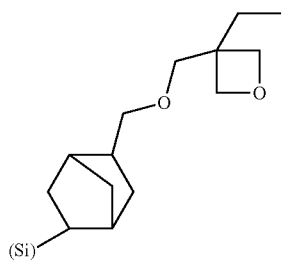
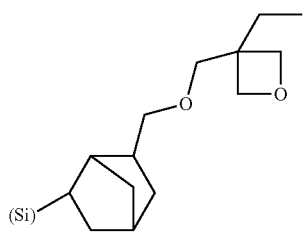
-continued
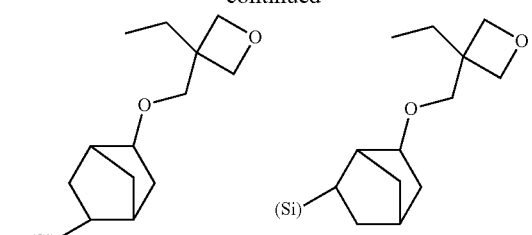
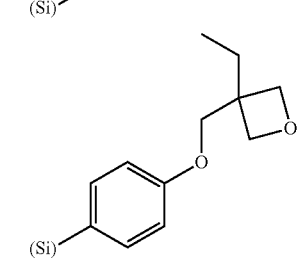
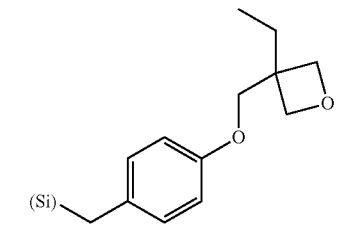
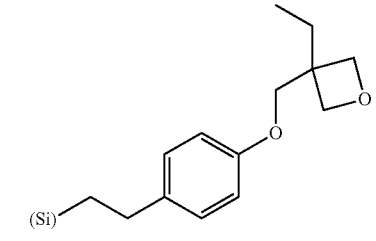
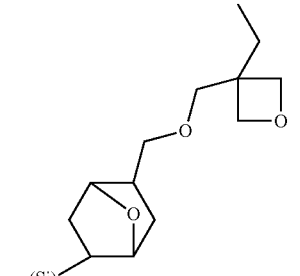
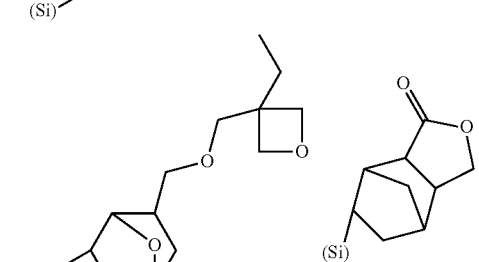
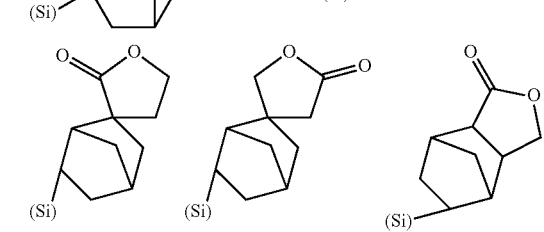

-continued
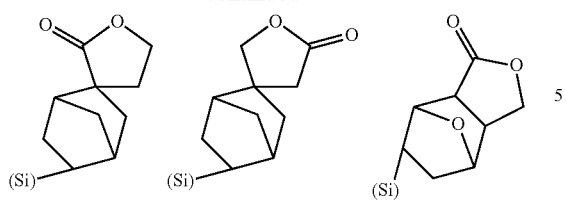
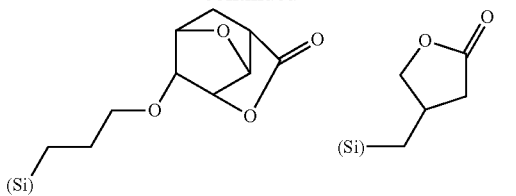
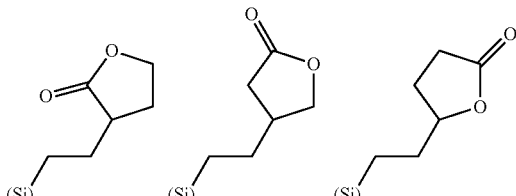
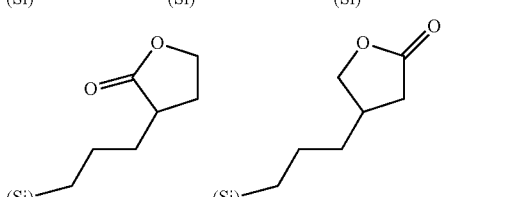
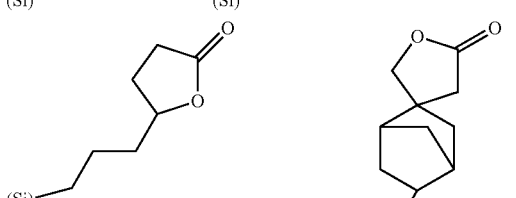
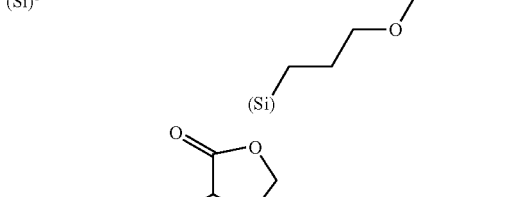
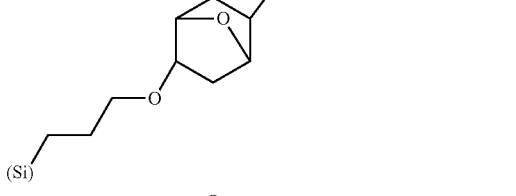
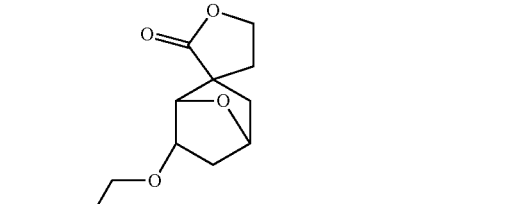
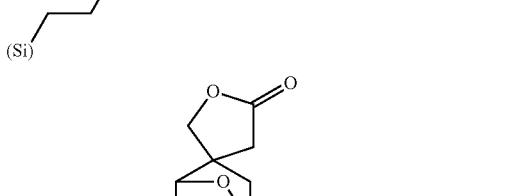
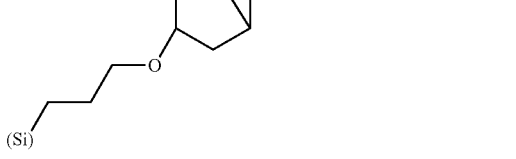

-continued
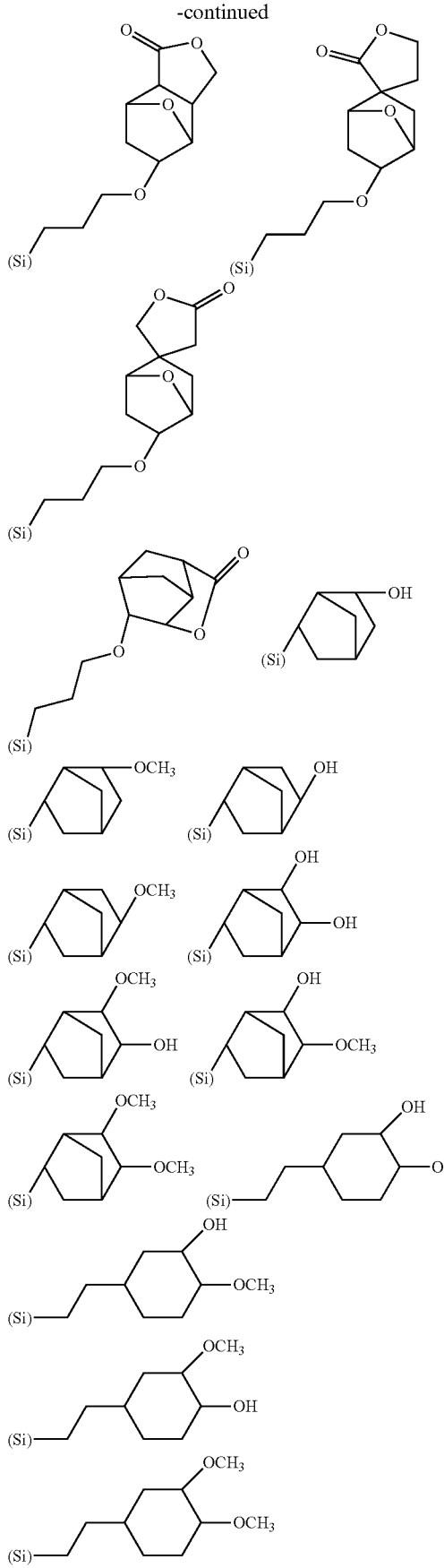
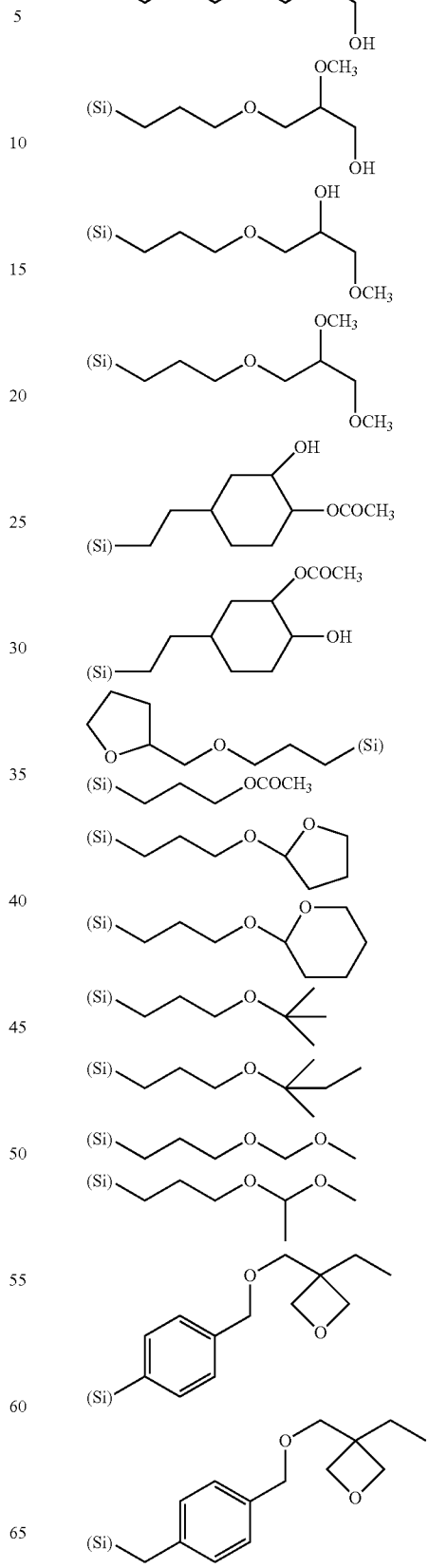

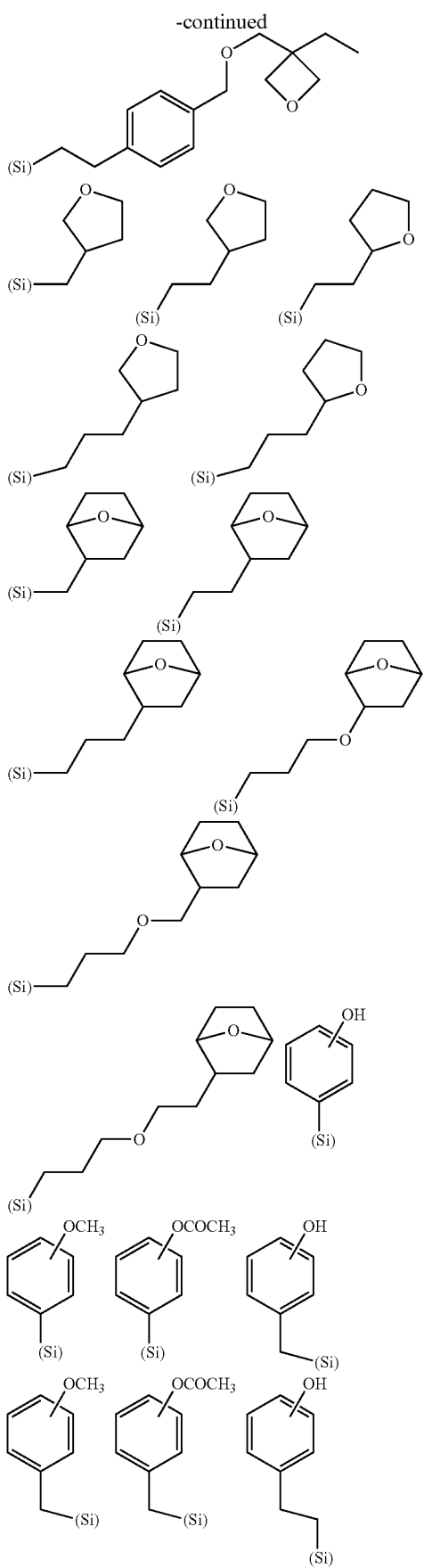
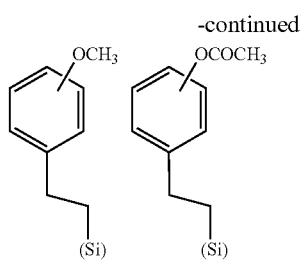
Moreover, as an example of the organic group of $R^2$ and $R^3$, an organic group containing a silicon-silicon bond can also be used. Specific examples thereof include the following.
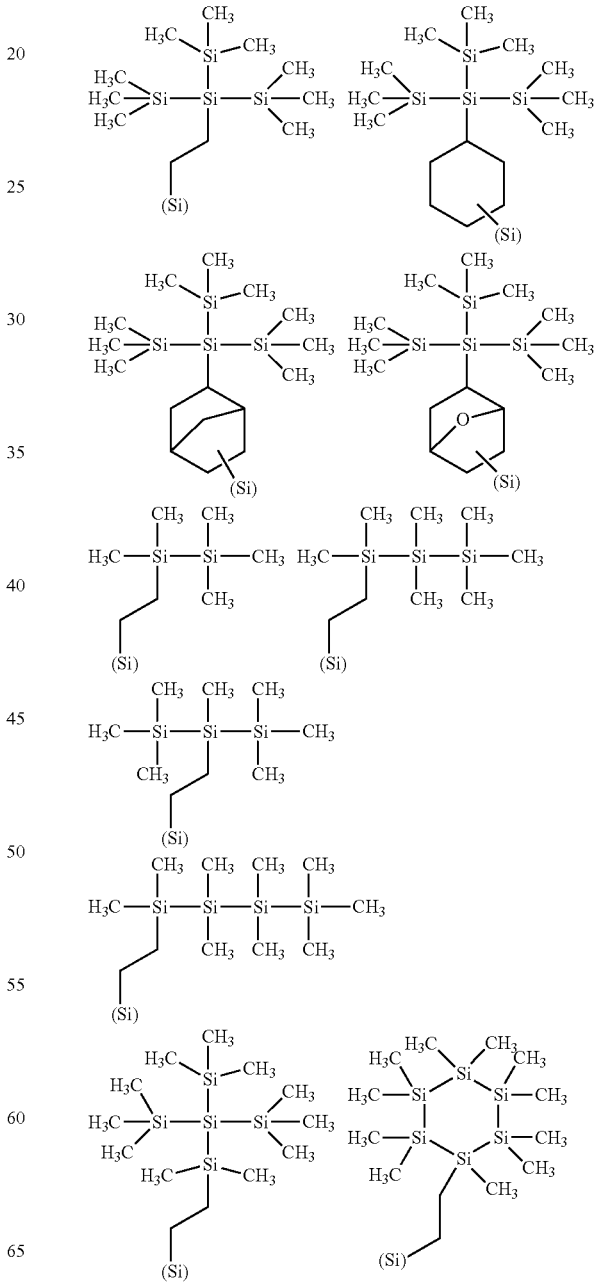

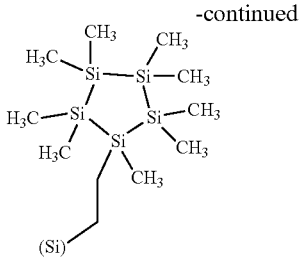

Moreover, as an example of the organic group of $R^2$ and $R^3$, an organic group having a protective group that is decomposed with an acid can also be used. Specific examples thereof include organic groups shown from paragraphs (0043) to (0048) of Japanese Unexamined Patent Application Publication No. 2013-167669, and organic groups obtained from silicon compounds shown in paragraph (0056) of Japanese Unexamined Patent Application Publication No. 2013-224279.

Further, as an example of the organic group of $R^2$ and $R^3$, an organic group having a fluorine atom can also be used. Specific examples thereof include organic groups obtained from silicon compounds shown from paragraphs (0059) to (0065) of Japanese Unexamined Patent Application Publication No. 2012-53253. Furthermore, as an example of the organic group of $R^2$ and $R^3$, an organic group having a nitrogen atom and a sulfur atom can also be used.

[Method for Synthesizing Silicon-Containing Material (Sx)]
(Synthesis Method 1: Acid Catalyst)

The inventive silicon-containing material (Sx) can be produced, for example, by hydrolysis condensation of the above-described iodine-containing monomer (Sm-I) or a mixture of (Sm-I) with one or more of the hydrolysable monomers (Sm) (hereinafter, such a mixture will be collectively referred to as monomer) in the presence of an acid catalyst.

Examples of the acid catalyst used in this event include organic acids such as formic acid, acetic acid, oxalic acid, maleic acid, methanesulfonic acid, benzenesulfonic acid, and toluenesulfonic acid; inorganic acids such as hydrofluoric acid, hydrochloric acid, hydrobromic acid, sulfuric acid, nitric acid, perchloric acid, and phosphoric acid; and the like. The catalyst can be used in an amount of $1\times10^{-6}$ to 10 mol, preferably $1\times10^{-5}$ to 5 mol, more preferably $1\times10^{-4}$ to 1 mol, relative to 1 mol of the monomer.

When the silicon-containing material is obtained from these monomers by the hydrolysis condensation, water is preferably added in an amount of 0.01 to 100 mol, more preferably 0.05 to 50 mol, further preferably 0.1 to 30 mol, per mol of the hydrolysable substituent bonded to the monomer. When the amount is 100 mol or less, a reaction device can be made small and economical.

As the operation method, the monomer is added to a catalyst aqueous solution to start the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

The organic solvent which can be added to the catalyst aqueous solution or with which the monomer can be diluted is preferably methanol, ethanol, 1-propanol, 2-propanol, 1-butanol, 2-butanol, 2-methyl-1-propanol, acetone, acetonitrile, tetrahydrofuran, toluene, hexane, ethyl acetate, methyl ethyl ketone, methyl isobutyl ketone, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, tert-butyl acetate, t-butyl propionate, propylene glycol mono-t-butyl ether acetate, γ-butyrolactone, mixtures thereof, and the like.

Among these solvents, water-soluble solvents are preferable. Examples thereof include alcohols such as methanol, ethanol, 1-propanol, and 2-propanol; polyhydric alcohols such as ethylene glycol and propylene glycol; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, and ethylene glycol monopropyl ether; acetone, acetonitrile, tetrahydrofuran, and the like. Among these, particularly preferable is one having a boiling point of 100° C. or less.

Note that the organic solvent is used in an amount of preferably 0 to 1,000 ml, particularly preferably 0 to 500 ml, relative to 1 mol of the monomer. When the organic solvent is used in a small amount, only a small reaction vessel is required and economical.

Then, if necessary, neutralization reaction of the catalyst is carried out to obtain a reaction mixture aqueous solution. In this event, the amount of an alkaline substance usable for the neutralization is preferably 0.1 to 2 equivalents relative to the acid used as the catalyst. This alkaline substance may be any substance as long as it shows alkalinity in water.

Subsequently, by-products such as alcohol produced by the hydrolysis condensation reaction are desirably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent, the alcohol produced in the reaction, and so forth. Additionally, in this event, the degree of vacuum is preferably atmospheric pressure or less, more preferably 80 kPa or less in absolute pressure, further preferably 50 kPa or less in absolute pressure, although the degree of vacuum varies depending on the kinds of the organic solvent, alcohol, etc. to be removed, as well as exhausting equipment, condensation equipment, and heating temperature. In this case, it is difficult to accurately know the amount of alcohol to be removed, but it is desirable to remove about 80 mass % or more of the produced alcohol, etc.

Next, the acid catalyst used in the hydrolysis condensation may be removed from the reaction mixture. As a method for removing the acid catalyst, the silicon-containing material is mixed with water, and the silicon-containing material is extracted with an organic solvent. Preferably, the organic solvent used in this event is capable of dissolving the silicon-containing material and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, and the like.

Further, it is also possible to use a mixture of a water-soluble organic solvent and a slightly-water-soluble organic solvent. Preferable examples of the mixture include methanol-ethyl acetate mixture, ethanol-ethyl acetate mixture, 1-propanol-ethyl acetate mixture, 2-propanol-ethyl acetate mixture, butanediol monomethyl ether-ethyl acetate mixture, propylene glycol monomethyl ether-ethyl acetate mixture, ethylene glycol monomethyl ether-ethyl acetate mixture, butanediol monoethyl ether-ethyl acetate mixture, propylene glycol monoethyl ether-ethyl acetate mixture, ethylene glycol monoethyl ether-ethyl acetate mixture, butanediol monopropyl ether-ethyl acetate mixture, propylene glycol monopropyl ether-ethyl acetate mixture, ethylene glycol monopropyl ether-ethyl acetate mixture, methanol-methyl isobutyl ketone mixture, ethanol-methyl isobutyl ketone mixture, 1-propanol-methyl isobutyl ketone mixture, 2-propanol-methyl isobutyl ketone mixture, propylene glycol monomethyl ether-methyl isobutyl ketone mixture, ethylene glycol monomethyl ether-methyl isobutyl ketone mixture, propylene glycol monoethyl ether-methyl isobutyl ketone mixture, ethylene glycol monoethyl ether-methyl isobutyl ketone mixture, propylene glycol monopropyl ether-methyl isobutyl ketone mixture, ethylene glycol monopropyl ether-methyl isobutyl ketone mixture, methanol-cyclopentyl methyl ether mixture, ethanol-cyclopentyl methyl ether mixture, 1-propanol-cyclopentyl methyl ether mixture, 2-propanol-cyclopentyl methyl ether mixture, propylene glycol monomethyl ether-cyclopentyl methyl ether mixture, ethylene glycol monomethyl ether-cyclopentyl methyl ether mixture, propylene glycol monoethyl ether-cyclopentyl methyl ether mixture, ethylene glycol monoethyl ether-cyclopentyl methyl ether mixture, propylene glycol monopropyl ether-cyclopentyl methyl ether mixture, ethylene glycol monopropyl ether-cyclopentyl methyl ether mixture, methanol-propylene glycol methyl ether acetate mixture, ethanol-propylene glycol methyl ether acetate mixture, 1-propanol-propylene glycol methyl ether acetate mixture, 2-propanol-propylene glycol methyl ether acetate mixture, propylene glycol monomethyl ether-propylene glycol methyl ether acetate mixture, ethylene glycol monomethyl ether-propylene glycol methyl ether acetate mixture, propylene glycol monoethyl ether-propylene glycol methyl ether acetate mixture, ethylene glycol monoethyl ether-propylene glycol methyl ether acetate mixture, propylene glycol monopropyl ether-propylene glycol methyl ether acetate mixture, ethylene glycol monopropyl ether-propylene glycol methyl ether acetate mixture, and the like. However, the combination is not limited thereto.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the silicon-containing material may be washed with neutral water. As the water, what is commonly called deionized water or ultrapure water may be used. The amount of the water may be 0.01 to 100 L, preferably 0.05 to 50 L, more preferably 0.1 to 5 L, relative to 1 L of the silicon-containing material solution. This washing procedure may be performed by putting both the silicon-containing material and water into the same container, followed by stirring and then leaving to stand to separate the aqueous layer. The washing may be performed once or more, preferably once to approximately five times.

Other methods for removing the acid catalyst include a method using an ion-exchange resin, and a method in which the acid catalyst is removed after neutralization with an epoxy compound such as ethylene oxide and propylene oxide. These methods can be appropriately selected in accordance with the acid catalyst used in the reaction.

In this water-washing operation, a part of the silicon-containing material escapes into the aqueous layer, so that substantially the same effect as fractionation operation is obtained in some cases. Hence, the number of water-washing operations and the amount of washing water may be appropriately determined in view of the catalyst removal effect and the fractionation effect.

To a solution of either the silicon-containing material with the acid catalyst still remaining or the silicon-containing material with the acid catalyst having been removed, a final solvent may be added for solvent exchange under reduced pressure. Thus, a desired silicon-containing material solution is obtained. The temperature during this solvent exchange is preferably 0 to 100° C., more preferably 10 to 90° C., further preferably 15 to 80° C., depending on the kinds of the reaction solvent and the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

In this event, the silicon-containing material may become unstable by the solvent exchange. This occurs due to incompatibility of the silicon-containing material with the final solvent. Thus, in order to prevent this phenomenon, a monohydric, dihydric, or polyhydric alcohol having cyclic ether substituent as shown in paragraphs (0181) to (0182) of Japanese Unexamined Patent Application Publication No. 2009-126940 may be added as a stabilizer. The alcohol may be added in an amount of 0 to 25 parts by mass, preferably 0 to 15 parts by mass, more preferably 0 to 5 parts by mass, based on 100 parts by mass of the silicon-containing material in the solution before the solvent exchange. When the alcohol is added, the amount is preferably 0.5 parts by mass or more. If necessary, the monohydric, dihydric, or polyhydric alcohol having cyclic ether substituent may be added to the solution before the solvent exchange operation.

If the silicon-containing material is concentrated above a certain concentration level, the condensation reaction may further progress, so that the silicon-containing material becomes no longer soluble in an organic solvent. Thus, it is preferable to maintain the solution state with a proper concentration. Meanwhile, if the concentration is too low, the amount of solvent is excessive. Hence, the solution state with a proper concentration is economical and preferable. The concentration in this state is preferably 0.1 to 20 mass %.

The final solvent added to the silicon-containing material solution is preferably an alcohol-based solvent, particularly preferably monoalkyl ether derivatives such as ethylene glycol, diethylene glycol, triethylene glycol, propylene glycol, dipropylene glycol, and butanediol. Specifically, preferable examples thereof include butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, and the like.

When these solvents are used as the main component, a non-alcohol-based solvent can also be added as an adjuvant solvent. Examples of the adjuvant solvent include acetone, tetrahydrofuran, toluene, hexane, ethyl acetate, cyclohexanone, methyl amyl ketone, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, and the like.

As an alternative reaction operation using an acid catalyst, water or a water-containing organic solvent is added to the monomer or an organic solution of the monomer to start the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for the aging.

When the organic solvent is used, a water-soluble solvent is preferable. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as butanediol monomethyl ether, propylene glycol monomethyl ether, ethylene glycol monomethyl ether, butanediol monoethyl ether, propylene glycol monoethyl ether, ethylene glycol monoethyl ether, butanediol monopropyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, and the like.

The organic solvent is used in an amount of preferably 0 to 1,000 ml, particularly preferably 0 to 500 ml, relative to 1 mol of the monomer. When the organic solvent is used in a small amount, only a small reaction vessel is required and economical. The obtained reaction mixture may be subjected to post-treatment by the same procedure as mentioned above to obtain a silicon-containing material.

(Synthesis Method 2: Alkali Catalyst)

Alternatively, the silicon-containing material (Sx) can be produced, for example, by hydrolysis condensation of the above-described iodine-containing monomer (Sm-I) or a mixture of (Sm-I) with one or more of the hydrolysable monomers (Sm) in the presence of an alkali catalyst. Examples of the alkali catalyst used in this event include methylamine, ethylamine, propylamine, butylamine, ethylenediamine, hexamethylenediamine, dimethylamine, diethylamine, ethylmethylamine, trimethylamine, triethylamine, tripropylamine, tributylamine, cyclohexylamine, dicyclohexylamine, monoethanolamine, diethanolamine, dimethyl monoethanolamine, monomethyl diethanolamine, triethanolamine, diazabicyclooctane, diazabicyclocyclononene, diazabicycloundecene, hexamethylenetetramine, aniline, N,N-dimethylaniline, pyridine, N,N-dimethylaminopyridine, pyrrole, piperazine, pyrrolidine, piperidine, picoline, tetramethylammonium hydroxide, choline hydroxide, tetrapropylammonium hydroxide, tetrabutylammonium hydroxide, ammonia, lithium hydroxide, sodium hydroxide, potassium hydroxide, barium hydroxide, calcium hydroxide, and the like. The catalyst can be used in an amount of $1\times10^{-6}$ mol to 10 mol, preferably $1\times10^{-5}$ mol to 5 mol, more preferably $1\times10^{-4}$ mol to 1 mol, relative to 1 mol of the silicon monomer.

When the silicon-containing material is obtained from the monomer by the hydrolysis condensation, water is preferably added in an amount of 0.1 to 50 mol per mol of the hydrolysable substituent bonded to the monomer. When the amount is 50 mol or less, a reaction device can be made small and economical.

As the operation method, the monomer is added to a catalyst aqueous solution to start the hydrolysis condensation reaction. In this event, an organic solvent may be added to the catalyst aqueous solution, or the monomer may be diluted with an organic solvent, or both of these operations may be performed. The reaction temperature may be 0 to 100° C., preferably 5 to 80° C. As a preferable method, when the monomer is added dropwise, the temperature is maintained at 5 to 80° C., and then the mixture is aged at 20 to 80° C.

As the organic solvent which can be added to the alkali catalyst aqueous solution or with which the monomer can be diluted, the same organic solvents exemplified as the organic solvents which can be added to the acid catalyst aqueous solution are preferably used. Note that the organic solvent is used in an amount of preferably 0 to 1,000 ml relative to 1 mol of the monomer because the reaction can be performed economically.

Then, if necessary, neutralization reaction of the catalyst is carried out to obtain a reaction mixture aqueous solution. In this event, the amount of an acidic substance usable for the neutralization is preferably 0.1 to 2 equivalents relative to the alkaline substance used as the catalyst. This acidic substance may be any substance as long as it shows acidity in water.

Subsequently, by-products such as alcohol produced by the hydrolysis condensation reaction are desirably removed from the reaction mixture by a procedure such as removal under reduced pressure. In this event, the reaction mixture is heated at a temperature of preferably 0 to 100° C., more preferably 10 to 90° C., further preferably 15 to 80° C., although the temperature depends on the kinds of the added organic solvent and alcohol produced in the reaction. Moreover, the degree of vacuum in this event preferably atmospheric pressure or less, more preferably 80 kPa or less in absolute pressure, further preferably 50 kPa or less in absolute pressure, although the degree of vacuum varies depending on the kinds of the organic solvent and alcohol to be removed, as well as exhausting equipment, condensation equipment, and heating temperature. In this case, it is difficult to accurately know the amount of alcohol to be removed, but it is desirable to remove about 80 mass % or more of the produced alcohol.

Next, to remove the alkali catalyst used in the hydrolysis condensation, the silicon-containing material may be extracted with an organic solvent. Preferably, the organic solvent used in this event is capable of dissolving the silicon-containing material and achieves two-layer separation when mixed with water. Further, it is also possible to use a mixture of a water-soluble organic solvent and a slightly-water-soluble organic solvent.

As concrete examples of the organic solvent used for removing the alkali catalyst, it is possible to use the aforementioned organic solvents specifically exemplified for the acid catalyst removal or the same mixture of the water-soluble organic solvent and the water-insoluble organic solvent.

The preferable organic solvent used in this event can dissolve the silicon-containing material and achieves two-layer separation when mixed with water. Examples of the organic solvent include methanol, ethanol, 1-propanol, 2-propanol, 1-butanol, 2-butanol, 2-methyl-1-propanol, acetone, tetrahydrofuran, toluene, hexane, ethyl acetate, cyclohexanone, methyl amyl ketone, propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, ethyl pyruvate, butyl acetate, methyl 3-methoxypropionate, ethyl 3-ethoxypropionate, t-butyl acetate, t-butyl propionate, propylene glycol mono-t-butyl ether acetate, γ-butyrolactone, methyl isobutyl ketone, cyclopentyl methyl ether, mixtures thereof, and the like.

Although the mixing ratio of the water-soluble organic solvent and the slightly-water-soluble organic solvent is appropriately selected, the amount of the water-soluble organic solvent may be 0.1 to 1,000 parts by mass, preferably 1 to 500 parts by mass, further preferably 2 to 100 parts by mass, based on 100 parts by mass of the slightly-water-soluble organic solvent.

Subsequently, the silicon-containing material may be washed with neutral water. As the water, what is commonly called deionized water or ultrapure water may be used. The amount of the water may be 0.01 to 100 L, preferably 0.05 to 50 L, more preferably 0.1 to 5 L, relative to 1 L of the silicon-containing material solution. This washing procedure may be performed by putting both the silicon-containing material and water into the same container, followed by stirring and then leaving to stand to separate the aqueous layer. The washing may be performed once or more, preferably once to approximately five times.

To the washed silicon-containing material solution, a final solvent may be added for solvent exchange under reduced pressure. Thus, a desired silicon-containing material solution is obtained. The temperature during this solvent exchange is preferably 0 to 100° C., more preferably 10 to 90° C., further preferably 15 to 80° C., depending on the kind of the extraction solvent to be removed. Moreover, the degree of vacuum in this event is preferably atmospheric pressure or less, more preferably 80 kPa or less in absolute pressure, further preferably 50 kPa or less in absolute pressure, although the degree of vacuum varies depending on the kinds of the extraction solvent to be removed, exhausting equipment, condensation equipment, and heating temperature.

The final solvent added to the silicon-containing material solution is preferably an alcohol-based solvent, particularly preferably a monoalkyl ether of ethylene glycol, diethylene glycol, triethylene glycol, etc. and a monoalkyl ether of propylene glycol, and dipropylene glycol, etc. Specifically, preferable examples thereof include propylene glycol monomethyl ether, ethylene glycol monomethyl ether, propylene glycol monoethyl ether, ethylene glycol monoethyl ether, propylene glycol monopropyl ether, ethylene glycol monopropyl ether, and the like.

As an alternative reaction operation using an alkali catalyst, water or a water-containing organic solvent is added to the monomer or an organic solution of the monomer to start the hydrolysis reaction. In this event, the catalyst may be added to the monomer or the organic solution of the monomer, or may be added to the water or the water-containing organic solvent. The reaction temperature may be 0 to 100° C., preferably 10 to 80° C. As a preferable method, when the water is added dropwise, the mixture is heated to 10 to 50° C., and then further heated to 20 to 80° C. for the aging.

The organic solvent usable for the organic solution of the monomer or the water-containing organic solvent is preferably a water-soluble solvent. Examples thereof include methanol, ethanol, 1-propanol, 2-propanol, 1-butanol, 2-butanol, 2-methyl-1-propanol, acetone, tetrahydrofuran, acetonitrile; polyhydric alcohol condensate derivatives such as propylene glycol monomethyl ether, ethylene glycol monomethyl ether, propylene glycol monoethyl ether, ethylene glycol monoethyl ether, propylene glycol monopropyl ether, ethylene glycol monopropyl ether, propylene glycol dimethyl ether, diethylene glycol dimethyl ether, propylene glycol monomethyl ether acetate, propylene glycol monoethyl ether acetate, and propylene glycol monopropyl ether; mixtures thereof, and the like.

The molecular weight of the silicon-containing material obtained by the above synthesis method 1 or 2 can be adjusted not only through the selection of the monomer but also by controlling the reaction conditions during the polymerization. It is preferable to use the silicon-containing material having a molecular weight of 100,000 or less, more preferably 200 to 50,000, further preferably 300 to 30,000. When the weight average molecular weight is 100,000 or less, generation of foreign matters and coating spots is suppressed.

Regarding data on the weight average molecular weight, the molecular weight is expressed in terms of polystyrene which is obtained by gel-permeation chromatography (GPC) using a refractive index (RI) detector, tetrahydrofuran as an eluent, and polystyrene as a reference substance.

[Composition for Forming Silicon-Containing Resist Underlayer Film]

The inventive composition for forming a silicon-containing resist underlayer film for EUV lithography contains the above-described thermosetting silicon-containing material and a crosslinking catalyst.

The thermosetting silicon-containing material (Sx) can be produced from the hydrolysable monomer under the conditions using the acid or alkali catalyst. Furthermore, a polysiloxane derivative produced from a mixture of the monomer with a hydrolysable metal compound shown by the following general formula (Mm) under the conditions using the acid or alkali catalyst can also be used as a component of a resist underlayer film composition.

$$U(OR^7)_{m7}(OR^8)_{m8} \tag{Mm}$$

In the formula, $R^7$ and $R^8$ each represent an organic group having 1 to 30 carbon atoms; m7+m8 represents the same number of a valence determined by the kind of U; m7 and m8 each represent an integer of 0 or more; and U represents an element belonging to the group III, IV, or V in the periodic table, except for carbon and silicon.

Examples of the hydrolysable metal compound (Mm) used in this event include the following.

When U is boron, examples of the compound shown by the general formula (Mm) include, as monomers, boron methoxide, boron ethoxide, boron propoxide, boron butoxide, boron amyloxide, boron hexyloxide, boron cyclopentoxide, boron cyclohexyloxide, boron allyloxide, boron phenoxide, boron methoxyethoxide, boric acid, boron oxide, and the like.

When U is aluminum, examples of the compound shown by the general formula (Mm) include, as monomers, aluminum methoxide, aluminum ethoxide, aluminum propoxide, aluminum butoxide, aluminum amyloxide, aluminum hexyloxide, aluminum cyclopentoxide, aluminum cyclohexyloxide, aluminum allyloxide, aluminum phenoxide, aluminum methoxyethoxide, aluminum ethoxyethoxide, aluminum dipropoxy (ethyl acetoacetate), aluminum dibutoxy (ethyl acetoacetate), aluminum propoxy bis(ethyl acetoacetate), aluminum butoxy bis(ethyl acetoacetate), aluminum 2,4-pentanedionate, aluminum 2,2,6,6-tetramethyl-3,5-heptanedionate, and the like.

When U is gallium, examples of the compound shown by the general formula (Mm) include, as monomers, gallium methoxide, gallium ethoxide, gallium propoxide, gallium butoxide, gallium amyloxide, gallium hexyloxide, gallium cyclopentoxide, gallium cyclohexyloxide, gallium allyloxide, gallium phenoxide, gallium methoxyethoxide, gallium ethoxyethoxide, gallium dipropoxy (ethyl acetoacetate), gallium dibutoxy (ethyl acetoacetate), gallium propoxy bis (ethyl acetoacetate), gallium butoxy bis(ethyl acetoacetate), gallium 2,4-pentanedionate, gallium 2,2,6,6-tetramethyl-3,5-heptanedionate, and the like.

When U is yttrium, examples of the compound shown by the general formula (Mm) include, as monomers, yttrium methoxide, yttrium ethoxide, yttrium propoxide, yttrium butoxide, yttrium amyloxide, yttrium hexyloxide, yttrium cyclopentoxide, yttrium cyclohexyloxide, yttrium allyloxide, yttrium phenoxide, yttrium methoxyethoxide, yttrium ethoxyethoxide, yttrium dipropoxy (ethyl acetoacetate), yttrium dibutoxy (ethyl acetoacetate), yttrium propoxy bis (ethyl acetoacetate), yttrium butoxy bis(ethyl acetoacetate), yttrium 2,4-pentanedionate, yttrium 2,2,6,6-tetramethyl-3,5-heptanedionate, and the like.

When U is germanium, examples of the compound shown by the general formula (Mm) include, as monomers, germanium methoxide, germanium ethoxide, germanium propoxide, germanium butoxide, germanium amyloxide, germanium hexyloxide, germanium cyclopentoxide, germanium cyclohexyloxide, germanium allyloxide, germanium phenoxide, germanium methoxyethoxide, germanium ethoxyethoxide, and the like.

When U is titanium, examples of the compound shown by the general formula (Mm) include, as monomers, titanium methoxide, titanium ethoxide, titanium propoxide, titanium butoxide, titanium amyloxide, titanium hexyloxide, titanium cyclopentoxide, titanium cyclohexyloxide, titanium allyloxide, titanium phenoxide, titanium methoxyethoxide, titanium ethoxyethoxide, titanium dipropoxy bis(ethyl acetoacetate), titanium dibutoxy bis(ethyl acetoacetate), titanium dipropoxy bis (2,4-pentanedionate), titanium dibutoxy bis (2,4-pentanedionate), and the like.

When U is hafnium, examples of the compound shown by the general formula (Mm) include, as monomers, hafnium methoxide, hafnium ethoxide, hafnium propoxide, hafnium butoxide, hafnium amyloxide, hafnium hexyloxide, hafnium cyclopentoxide, hafnium cyclohexyloxide, hafnium allyloxide, hafnium phenoxide, hafnium methoxyethoxide, hafnium ethoxyethoxide, hafnium dipropoxy bis(ethyl acetoacetate), hafnium dibutoxy bis(ethyl acetoacetate), hafnium dipropoxy bis (2,4-pentanedionate), hafnium dibutoxy bis (2,4-pentanedionate), and the like.

When U is tin, examples of the compound shown by the general formula (Mm) include, as monomers, methoxy tin, ethoxy tin, propoxy tin, butoxy tin, phenoxy tin, methoxyethoxy tin, ethoxyethoxy tin, tin 2,4-pentanedionate, tin 2,2,6,6-tetramethyl-3,5-heptanedionate, and the like.

When U is arsenic, examples of the compound shown by the general formula (Mm) include, as monomers, methoxy arsenic, ethoxy arsenic, propoxy arsenic, butoxy arsenic, phenoxy arsenic, and the like.

When U is antimony, examples of the compound shown by the general formula (Mm) include, as monomers, methoxy antimony, ethoxy antimony, propoxy antimony, butoxy antimony, phenoxy antimony, antimony acetate, antimony propionate, and the like.

When U is niobium, examples of the compound shown by the general formula (Mm) include, as monomers, methoxy niobium, ethoxy niobium, propoxy niobium, butoxy niobium, phenoxy niobium, and the like.

When U is tantalum, examples of the compound shown by the general formula (Mm) include, as monomers, methoxy tantalum, ethoxy tantalum, propoxy tantalum, butoxy tantalum, phenoxy tantalum, and the like.

When U is bismuth, examples of the compound shown by the general formula (Mm) include, as monomers, methoxy bismuth, ethoxy bismuth, propoxy bismuth, butoxy bismuth, phenoxy bismuth, and the like.

When U is phosphorus, examples of the compound shown by the general formula (Mm) include, as monomers, trimethyl phosphate, triethyl phosphate, tripropyl phosphate, trimethyl phosphite, triethyl phosphite, tripropyl phosphite, diphosphorous pentaoxide, and the like.

When U is vanadium, examples of the compound shown by the general formula (Mm) include, as monomers, vanadium oxide bis(2,4-pentanedionate), vanadium 2,4-pentanedionate, vanadium tributoxide oxide, vanadium tripropoxide oxide, and the like.

When U is zirconium, examples of the compound shown by the general formula (Mm) include, as monomers, methoxy zirconium, ethoxy zirconium, propoxy zirconium, butoxy zirconium, phenoxy zirconium, zirconium dibutoxide bis(2,4-pentanedionate), zirconium dipropoxide bis(2,2,6,6-tetramethyl-3,5-heptanedionate), and the like.

(Crosslinking Catalyst)

In the present invention, a crosslinking catalyst (Xc) is blended into the composition for forming a resist underlayer film. An example of the blendable crosslinking catalyst includes a compound shown by the following general formula (Xc0):

$$L_a H_b A \qquad \text{(Xc0)}$$

where L represents lithium, sodium, potassium, rubidium, cesium, sulfonium, iodonium, phosphonium, or ammonium; A represents a non-nucleophilic counter ion; "a" represents an integer of 1 or more; "b" represents an integer of 0 or 1 or more; and a+b represents a valence of the non-nucleophilic counter ion.

Examples of the crosslinking catalyst used in the present invention as specific (Xc0) include a sulfonium salt of the following general formula (Xc-1), an iodonium salt of the following general formula (Xc-2), a phosphonium salt of the following general formula (Xc-3), an ammonium salt of the following general formula (Xc-4), an alkaline metal salt, and the like.

Examples of the sulfonium salt (Xc-1), the iodonium salt (Xc-2), and the phosphonium salt (Xc-3) are shown below.

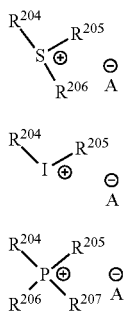

(Xc-1)

(Xc-2)

(Xc-3)

Moreover, an example of the ammonium salt (Xc-4) is shown below.

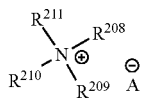

(Xc-4)

In the formulae, $R^{204}$, $R^{205}$, $R^{206}$, and $R^{207}$ each represent a linear, branched, or cyclic alkyl group, alkenyl group, oxoalkyl group, or oxoalkenyl group having 1 to 12 carbon atoms, a substituted or unsubstituted aryl group having 6 to 20 carbon atoms, or an aralkyl group or aryloxoalkyl group having 7 to 12 carbon atoms; some or all of hydrogen atoms of these groups are optionally substituted with an alkoxy group or the like. Additionally, $R^{205}$ and $R^{206}$ may form a ring; when a ring is formed, $R^{205}$ and $R^{206}$ each represent an alkylene group having 1 to 6 carbon atoms. $A^-$ represents a non-nucleophilic counter ion. $R^{208}$, $R^{209}$, $R^{210}$, and $R^{211}$ are the same as $R^{204}$, $R^{205}$, $R^{206}$, and $R^{207}$ and may be each a hydrogen atom. $R^{208}$ and $R^{209}$, or $R^{208}$, $R^{209}$, and $R^{210}$, may form a ring; when a ring is formed, $R^{208}$ and $R^{209}$, or $R^{208}$, $R^{209}$, and $R^{210}$, represent an alkylene group having 3 to 10 carbon atoms.

$R^{204}$, $R^{205}$, $R^{206}$, $R^{207}$, $R^{208}$, $R^{209}$, $R^{210}$, and $R^{211}$ may be identical to or different from one another. Specifically, examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, and the like, and also include a 2-oxopropyl group, a 2-cyclopentyl-2-oxoethyl group, a 2-cyclohexyl-2-oxoethyl group, a 2-(4-methylcyclohexyl)-2-oxoethyl group, and the like. Examples of the aryl group include a phenyl group, a naphthyl group, and the like; alkoxyphenyl groups such as a p-methoxyphenyl group, a m-methoxyphenyl group, an o-methoxyphenyl group, an ethoxyphenyl group, a p-tert-butoxyphenyl group, and a m-tert-butoxyphenyl group; alkylphenyl groups such as a 2-methylphenyl group, a 3-methylphenyl group, a 4-methylphenyl group, an ethylphenyl group, a 4-tert-butylphenyl group, a 4-butylphenyl group, and a dimethylphenyl group; alkylnaphthyl groups such as a methylnaphthyl group and an ethylnaphthyl group; alkoxynaphthyl groups such as a methoxynaphthyl group and an ethoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a phenylethyl group, a phenethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like.

Examples of the non-nucleophilic counter ion A include monovalent ions such as hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, phthalate ion, isophthalate ion, terephthalate ion, salicylate ion, trifluoroacetate ion, monochloroacetate ion, dichloroacetate ion, trichloroacetate ion, fluoride ion, chloride ion, bromide ion, iodide ion, nitrate ion, nitrite ion, chlorate ion, bromate ion, methanesulfonate ion, paratoluenesulfonate ion, and monomethylsulfate ion; monovalent or divalent ions such as oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, sulfate ion, and the like.

Examples of the alkaline metal salt include salts of lithium, sodium, potassium, cesium, magnesium, and calcium; monovalent salts such as hydroxide, formate, acetate, propionate, butanoate, pentanoate, hexanoate, heptanoate, octanoate, nonanoate, decanoate, oleate, stearate, linoleate, linolenate, benzoate, phthalate, isophthalate, terephthalate, salicylate, trifluoroacetate, monochloroacetate, dichloroacetate, and trichloroacetate; monovalent or divalent salts such as oxalate, malonate, methylmalonate, ethylmalonate, propylmalonate, butylmalonate, dimethylmalonate, diethylmalonate, succinate, methylsuccinate, glutarate, adipate, itaconate, maleate, fumarate, citraconate, citrate, carbonate, and the like.

Specific examples of the sulfonium salt (Xc-1) include triphenylsulfonium formate, triphenylsulfonium acetate, triphenylsulfonium propionate, triphenylsulfonium butanoate, triphenylsulfonium benzoate, triphenylsulfonium phthalate, triphenylsulfonium isophthalate, triphenylsulfonium terephthalate, triphenylsulfonium salicylate, triphenylsulfonium trifluoromethanesulfonate, triphenylsulfonium trifluoroacetate, triphenylsulfonium monochloroacetate, triphenylsulfonium dichloroacetate, triphenylsulfonium trichloroacetate, triphenylsulfonium hydroxide, triphenylsulfonium nitrate, triphenylsulfonium chloride, triphenylsulfonium bromide, triphenylsulfonium oxalate, triphenylsulfonium malonate, triphenylsulfonium methylmalonate, triphenylsulfonium ethylmalonate, triphenylsulfonium propylmalonate, triphenylsulfonium butylmalonate, triphenylsulfonium dimethylmalonate, triphenylsulfonium diethylmalonate, triphenylsulfonium succinate, triphenylsulfonium methylsuccinate, triphenylsulfonium glutarate, triphenylsulfonium adipate, triphenylsulfonium itaconate, bistriphenylsulfonium oxalate, triphenylsulfonium maleate, triphenylsulfonium fumarate, triphenylsulfonium citraconate, triphenylsulfonium citrate, triphenylsulfonium carbonate, bistriphenylsulfonium oxalate, bistriphenylsulfonium maleate, bistriphenylsulfonium fumarate, bistriphenylsulfonium citraconate, bistriphenylsulfonium citrate, bistriphenylsulfonium carbonate, and the like.

Specific examples of the iodonium salt (Xc-2) include diphenyliodonium formate, diphenyliodonium acetate, diphenyliodonium propionate, diphenyliodonium butanoate, diphenyliodonium benzoate, diphenyliodonium phthalate, diphenyliodonium isophthalate, diphenyliodonium terephthalate, diphenyliodonium salicylate, diphenyliodonium trifluoromethanesulfonate, diphenyliodonium trifluoroacetate, diphenyliodonium monochloroacetate, diphenyliodonium dichloroacetate, diphenyliodonium trichloroacetate, diphenyliodonium hydroxide, diphenyliodonium nitrate, diphenyliodonium chloride, diphenyliodonium bromide, diphenyliodonium iodide, diphenyliodonium oxalate, diphenyliodonium maleate, diphenyliodonium fumarate, diphenyliodonium citraconate, diphenyliodonium citrate, diphenyliodonium carbonate, bisdiphenyliodonium oxalate, bisdiphenyliodonium maleate, bisdiphenyliodonium fumarate, bisdiphenyliodonium citraconate, bisdiphenyliodonium citrate, bisdiphenyliodonium carbonate, and the like.

Specific examples of the phosphonium salt (Xc-3) include tetraethylphosphonium formate, tetraethylphosphonium acetate, tetraethylphosphonium propionate, tetraethylphosphonium butanoate, tetraethylphosphonium benzoate, tetraethylphosphonium phthalate, tetraethylphosphonium isophthalate, tetraethylphosphonium terephthalate, tetraethylphosphonium salicylate, tetraethylphosphonium trifluoromethanesulfonate, tetraethylphosphonium trifluoroacetate, tetraethylphosphonium monochloroacetate, tetraethylphosphonium dichloroacetate, tetraethylphosphonium trichloroacetate, tetraethylphosphonium hydroxide, tetraethylphosphonium nitrate, tetraethylphosphonium chloride, tetraethylphosphonium bromide, tetraethylphosphonium iodide, tetraethylphosphonium oxalate, tetraethylphosphonium maleate, tetraethylphosphonium fumarate, tetraethylphosphonium citraconate, tetraethylphosphonium citrate, tetraethylphosphonium carbonate, bistetraethylphosphonium oxalate, bistetraethylphosphonium maleate, bistetraethylphosphonium fumarate, bistetraethylphosphonium citraconate, bistetraethylphosphonium citrate, bistetraethylphosphonium carbonate, tetraphenylphosphonium formate, tetraphenylphosphonium acetate, tetraphenylphosphonium propionate, tetraphenylphosphonium butanoate, tetraphenylphosphonium benzoate, tetraphenylphosphonium phthalate, tetraphenylphosphonium isophthalate, tetraphenylphosphonium terephthalate, tetraphenylphosphonium salicylate, tetraphenylphosphonium trifluoromethanesulfonate, tetraphenylphosphonium trifluoroacetate, tetraphenylphosphonium monochloroacetate, tetraphenylphosphonium dichloroacetate, tetraphenylphosphonium trichloroacetate, tetraphenylphosphonium hydroxide, tetraphenylphosphonium nitrate, tetraphenylphosphonium chloride, tetraphenylphosphonium bromide, tetraphenylphosphonium iodide, tetraphenylphosphonium oxalate, tetraphenylphosphonium maleate, tetraphenylphosphonium fumarate, tetraphenylphosphonium citraconate, tetraphenylphosphonium citrate, tetraphenylphosphonium carbonate, bistetraphenylphosphonium oxalate, bistetraphenylphosphonium maleate, bistetraphenylphosphonium fumarate, bistetraphenylphosphonium citraconate, bistetraphenylphosphonium citrate, bistetraphenylphosphonium carbonate, and the like.

Specific examples of the ammonium salt (Xc-4) include tetramethylammonium formate, tetramethylammonium acetate, tetramethylammonium propionate, tetramethylammonium butanoate, tetramethylammonium benzoate, tetramethylammonium phthalate, tetramethylammonium isophthalate, tetramethylammonium terephthalate, tetramethylammonium salicylate, tetramethylammonium tri fluoromethanesulfonate, tetramethylammonium trifluoroacetate, tetramethylammonium monochloroacetate, tetramethylammonium dichloroacetate, tetramethylammonium trichloroacetate, tetramethylammonium hydroxide, tetramethylammonium nitrate, tetramethylammonium chloride, tetramethylammonium bromide, tetramethylammonium iodide, tetramethylammonium monomethylsulfate, tetramethylammonium oxalate, tetramethylammonium malonate, tetramethylammonium maleate, tetramethylammonium fumarate, tetramethylammonium citraconate, tetramethylammonium citrate, tetramethylammonium carbonate, bistetramethylammonium oxalate, bistetramethylammonium malonate, bistetramethylammonium maleate, bistetramethylammonium fumarate, bistetramethylammonium citraconate, bistetramethylammonium citrate, bistetramethylammonium carbonate, tetraethylammonium formate, tetraethylammonium acetate, tetraethylammonium propionate, tetraethylammonium butanoate, tetraethylammonium benzoate, tetraethylammonium phthalate, tetraethylammonium isophthalate, tetraethylammonium terephthalate, tetraethylammonium salicylate, tetraethylammonium tri fluoromethanesulfonate, tetraethylammonium trifluoroacetate, tetraethylammonium monochloroacetate, tetraethylammonium dichloroacetate, tetraethylammonium trichloroacetate, tetraethylammonium hydroxide, tetraethylammonium nitrate, tetraethylammonium chloride, tetraethylammonium bromide, tetraethylammonium iodide, tetraethylammonium monomethylsulfate, tetraethylammonium oxalate, tetraethylammonium malonate, tetraethylammonium maleate, tetraethylammonium fumarate, tetraethylammonium citraconate, tetraethylammonium citrate, tetraethylammonium carbonate, bistetraethylammonium oxalate, bistetraethylammonium malonate, bistetraethylammonium maleate, bistetraethylammonium fumarate, bistetraethylammonium citraconate, bistetraethylammonium citrate, bistetraethylammonium carbonate, tetrapropylammonium formate, tetrapropylammonium acetate, tetrapropylammonium propionate, tetrapropylammonium butanoate, tetrapropylammonium benzoate, tetrapropylammonium phthalate, tetrapropylammonium isophthalate, tetrapropylammonium terephthalate, tetrapropylammonium salicylate, tetrapropylammonium tri fluoromethanesulfonate, tetrapropylammonium trifluoroacetate, tetrapropylammonium monochloroacetate, tetrapropylammonium dichloroacetate, tetrapropylammonium trichloroacetate, tetrapropylammonium hydroxide, tetrapropylammonium nitrate, tetrapropylammonium chloride, tetrapropylammonium bromide, tetrapropylammonium iodide, tetrapropylammonium monomethylsulfate, tetrapropylammonium oxalate, tetrapropylammonium malonate, tetrapropylammonium maleate, tetrapropylammonium fumarate, tetrapropylammonium citraconate, tetrapropylammonium citrate, tetrapropylammonium carbonate, bistetrapropylammonium oxalate, bistetrapropylammonium malonate, bistetrapropylammonium maleate, bistetrapropylammonium fumarate, bistetrapropylammonium citraconate, bistetrapropylammonium citrate, bistetrapropylammonium carbonate, tetrabutylammonium formate, tetrabutylammonium acetate, tetrabutylammonium propionate, tetrabutylammonium butanoate, tetrabutylammonium benzoate, tetrabutylammonium phthalate, tetrabutylammonium isophthalate, tetrabutylammonium terephthalate, tetrabutylammonium salicylate, tetrabutylammonium tri fluoromethanesulfonate, tetrabutylammonium trifluoroacetate, tetrabutylammonium monochloroacetate, tetrabutylammonium dichloroacetate, tetrabutylammonium trichloroacetate, tetrabutylammonium hydroxide, tetrabutylammonium nitrate, tetrabutylammonium chloride, tetrabutylammonium bromide, tetrabutylammonium iodide, tetrabutylammonium methanesulfonate, tetrabutylammonium monomethylsulfate, tetrabutylammonium oxalate, tetrabutylammonium malonate, tetrabutylammonium maleate, tetrabutylammonium fumarate, tetrabutylammonium citraconate, tetrabutylammonium citrate, tetrabutylammonium carbonate, bistetrabutylammonium oxalate, bistetrabutylammonium malonate, bistetrabutylammonium maleate, bistetrabutylammonium fumarate, bistetrabutylammonium citraconate, bistetrabutylammonium citrate, bistetrabutylammonium carbonate, trimethylphenylammonium formate, trimethylphenylammonium acetate, trimethylphenylammonium propionate, trimethylphenylammonium butanoate, trimethylphenylammonium benzoate, trimethylphenylammonium phthalate, trimethylphenylammonium isophthalate, trimethylphenylammonium terephthalate, trimethylphenylammonium salicylate, trimethylphenylammonium tri fluoromethanesulfonate, trimethylphenylammonium trifluoroacetate, trimethylphenylammonium monochloroacetate, trimethylphenylammonium dichloroacetate, trimethylphenylammonium trichloroacetate, trimethylphenylammonium hydroxide, trimethylphenylammonium nitrate, trimethylphenylammonium chloride, trimethylphenylammonium bromide, trimethylphenylammonium iodide, trimethylphenylammonium methanesulfonate, trimethylphenylammonium monomethylsulfate, trimethylphenylammonium oxalate, trimethylphenylammonium malonate, trimethylphenylammonium maleate, trimethylphenylammonium fumarate, trimethylphenylammonium citraconate, trimethylphenylammonium citrate, trimethylphenylammonium carbonate, bistrimethylphenylammonium oxalate, bistrimethylphenylammonium malonate, bistrimethylphenylammonium maleate, bistrimethylphenylammonium fumarate, bistrimethylphenylammonium citraconate, bistrimethylphenylammonium citrate, bistrimethylphenylammonium carbonate, triethylphenylammonium formate, triethylphenylammonium acetate, triethylphenylammonium propionate, triethylphenylammonium butanoate, triethylphenylammonium benzoate, triethylphenylammonium phthalate, triethylphenylammonium isophthalate, triethylphenylammonium terephthalate, triethylphenylammonium salicylate, triethylphenylammonium tri fluoromethanesulfonate, triethylphenylammonium trifluoroacetate, triethylphenylammonium monochloroacetate, triethylphenylammonium dichloroacetate, triethylphenylammonium trichloroacetate, triethylphenylammonium hydroxide, triethylphenylammonium nitrate, triethylphenylammonium chloride, triethylphenylammonium bromide, triethylphenylammonium iodide, triethylphenylammonium methanesulfonate, triethylphenylammonium monomethylsulfate, triethylphenylammonium oxalate, triethylphenylammonium malonate, triethylphenylammonium maleate, triethylphenylammonium fumarate, triethylphenylammonium citraconate, triethylphenylammonium citrate, triethylphenylammonium carbonate, bistriethylphenylammonium oxalate, bistriethylphenylammonium malonate, bistriethylphenylammonium maleate, bistriethylphenylammonium fumarate, bistriethylphenylammonium citraconate, bistriethylphenylammonium citrate, bistriethylphenylammonium carbonate, benzyldimethylphenylammonium formate, benzyldimethylphenylammonium acetate, benzyldimethylphenylammonium propionate, benzyldimethylphenylammonium butanoate, benzyldimethylphenylammonium benzoate, benzyldimethylphenylammonium phthalate, benzyldimethylphenylammonium isophthalate, benzyldimethylphenylammonium terephthalate, benzyldimethylphenylammonium salicylate, benzyldimethylphenylammonium trifluoromethanesulfonate, benzyldimethylphenylammonium trifluoroacetate, benzyldimethylphenylammonium monochloroacetate, benzyldimethylphenylammonium dichloroacetate, benzyldimethylphenylammonium trichloroacetate, benzyldimethylphenylammonium hydroxide, benzyldimethylphenylammonium nitrate, benzyldimethylphenylammonium chloride, benzyldimethylphenylammonium bromide, benzyldimethylphenylammonium iodide, benzyldimethylphenylammonium methanesulfonate, benzyldimethylphenylammonium monomethylsulfate, benzyldimethylphenylammonium oxalate, benzyldimethylphenylammonium malonate, benzyldimethylphenylammonium maleate, benzyldimethylphenylammonium fumarate, benzyldimethylphenylammonium citraconate, benzyldimethylphenylammonium citrate, benzyldimethylphenylammonium carbonate, bisbenzyldimethylphenylammonium oxalate, bisbenzyldimethylphenylammonium malonate, bisbenzyldimethylphenylammonium maleate, bisbenzyldimethylphenylammonium fumarate, bisbenzyldimethylphenylammonium citraconate, bisbenzyldimethylphenylammonium citrate, bisbenzyldimethylphenylammonium carbonate, and the like.

Examples of the alkaline metal salt include lithium formate, lithium acetate, lithium propionate, lithium butanoate, lithium benzoate, lithium phthalate, lithium isophthalate, lithium terephthalate, lithium salicylate, lithium trifluoromethanesulfonate, lithium trifluoroacetate, lithium monochloroacetate, lithium dichloroacetate, lithium trichloroacetate, lithium hydroxide, lithium nitrate, lithium chloride, lithium bromide, lithium iodide, lithium methanesulfonate, lithium hydrogen oxalate, lithium hydrogen malonate, lithium hydrogen maleate, lithium hydrogen fumarate, lithium hydrogen citraconate, lithium hydrogen citrate, lithium hydrogen carbonate, lithium oxalate, lithium malonate, lithium maleate, lithium fumarate, lithium citraconate, lithium citrate, lithium carbonate, sodium formate, sodium acetate, sodium propionate, sodium butanoate, sodium benzoate, sodium phthalate, sodium isophthalate, sodium terephthalate, sodium salicylate, sodium trifluoromethanesulfonate, sodium trifluoroacetate, sodium monochloroacetate, sodium dichloroacetate, sodium trichloroacetate, sodium hydroxide, sodium nitrate, sodium chloride, sodium bromide, sodium iodide, sodium methanesulfonate, sodium hydrogen oxalate, sodium hydrogen malonate, sodium hydrogen maleate, sodium hydrogen fumarate, sodium hydrogen citraconate, sodium hydrogen citrate, sodium hydrogen carbonate, sodium oxalate, sodium malonate, sodium maleate, sodium fumarate, sodium citraconate, sodium citrate, sodium carbonate, potassium formate, potassium acetate, potassium propionate, potassium butanoate, potassium benzoate, potassium phthalate, potassium isophthalate, potassium terephthalate, potassium salicylate, potassium trifluoromethanesulfonate, potassium trifluoroacetate, potassium monochloroacetate, potassium dichloroacetate, potassium trichloroacetate, potassium hydroxide, potassium nitrate, potassium chloride, potassium bromide, potassium iodide, potassium methanesulfonate, potassium hydrogen oxalate, potassium hydrogen malonate, potassium hydrogen maleate, potassium hydrogen fumarate, potassium hydrogen citraconate, potassium hydrogen citrate, potassium hydrogen carbonate, potassium oxalate, potassium malonate, potassium maleate, potassium fumarate, potassium citraconate, potassium citrate, potassium carbonate, and the like.

In the present invention, a polysiloxane (Xc-10) having a structure containing one of the sulfonium salt, the iodonium salt, the phosphonium salt, and the ammonium salt as a part of the structure may be blended as the crosslinking catalyst (Xc) into the composition for forming a resist underlayer film.

As a raw material for producing (Xc-10) used here, it is possible to employ a compound shown by the following general formula (Xm):

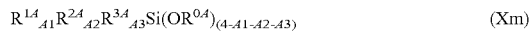

where $R^{OA}$ represents a hydrocarbon group having 1 to 6 carbon atoms; at least one of $R^{1A}$, $R^{2A}$, and $R^{3A}$ represents an organic group having the ammonium salt, the sulfonium salt, the phosphonium salt, or the iodonium salt; the other(s) of $R^{1A}$, $R^{2A}$, and $R^{3A}$ represent a hydrogen atom or a monovalent organic group having 1 to 30 carbon atoms; and A1, A2, and A3 each represent 0 or 1, given that 1≤A1+A2+A33.

Here, examples of $OR^{OA}$ include a methyl group, an ethyl group, an n-propyl group, an iso-propyl group, an n-butyl group, an iso-butyl group, a sec-butyl group, a tert-butyl group, an n-pentyl group, a cyclopentyl group, an n-hexyl group, a cyclohexyl group, and a phenyl group.

An example of Xm includes the following general formula (Xm-1), which shows a hydrolysable silicon compound having a structure containing the sulfonium salt as a part:

where $R^{SA1}$ and $R^{SA2}$ each represent a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of hydrogen atoms of these groups are optionally substituted with an alkoxy group, an amino group, an alkylamino group, a halogen atom, or the like. Moreover, $R^{SA1}$ and $R^{SA2}$ may form a ring together with a sulfur atom bonded to $R^{SA1}$ and $R^{SA2}$; when a ring is formed, $R^{SA1}$ and $R^{SA2}$ each represent an alkylene group having 1 to 6 carbon atoms. $R^{SA3}$ represents a linear, branched, or cyclic alkylene group or alkenylene group having 1 to 20 carbon atoms, or a substituted or unsubstituted arylene group or aralkylene group having 6 to 20 carbon atoms; some or all of hydrogen atoms of these groups are optionally substituted with an alkoxy group, an amino group, an alkylamino group, or the like. $R^{SA1}$, $R^{SA2}$, and $R^{SA3}$ each may have an oxygen atom or a nitrogen atom within the chain or the ring.

Examples of $X^-$ include hydroxide ion, formate ion, acetate ion, propionate ion, butanoate ion, pentanoate ion, hexanoate ion, heptanoate ion, octanoate ion, nonanoate ion, decanoate ion, oleate ion, stearate ion, linoleate ion, linolenate ion, benzoate ion, p-methylbenzoate ion, p-t-butylbenzoate ion, phthalate ion, isophthalate ion, terephthalate ion, salicylate ion, trifluoroacetate ion, monochloroacetate ion, dichloroacetate ion, trichloroacetate ion, nitrate ion, chlorate ion, perchlorate ion, bromate ion, iodate ion, oxalate ion, malonate ion, methylmalonate ion, ethylmalonate ion, propylmalonate ion, butylmalonate ion, dimethylmalonate ion, diethylmalonate ion, succinate ion, methylsuccinate ion, glutarate ion, adipate ion, itaconate ion, maleate ion, fumarate ion, citraconate ion, citrate ion, carbonate ion, and the like.

Specific examples of (Xm-1) include the following ($X^-$ is as defined above).

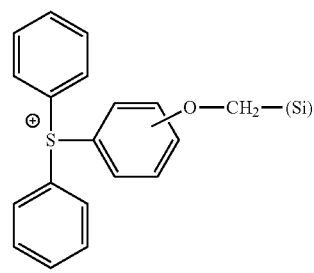

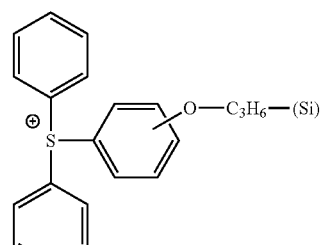

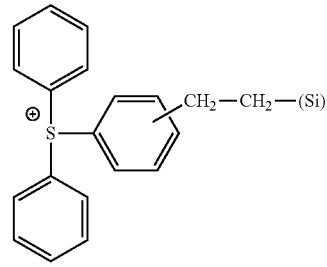

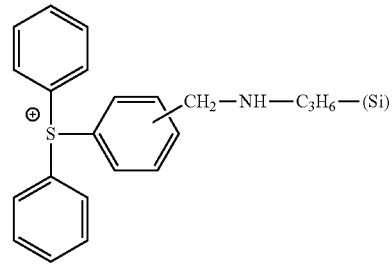

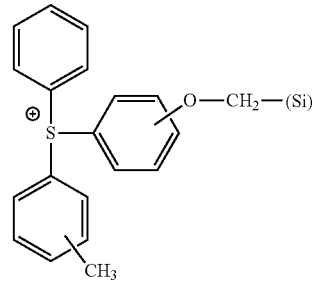

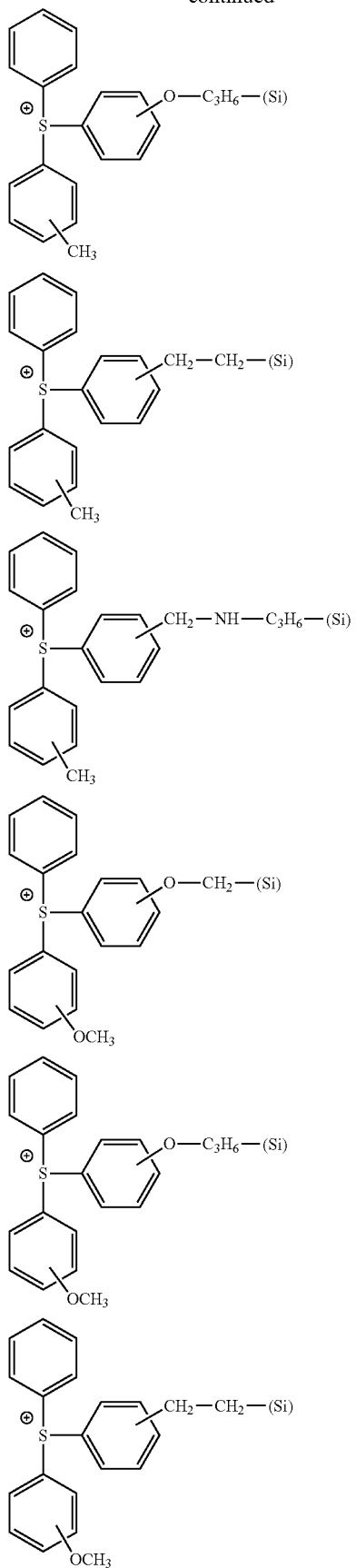
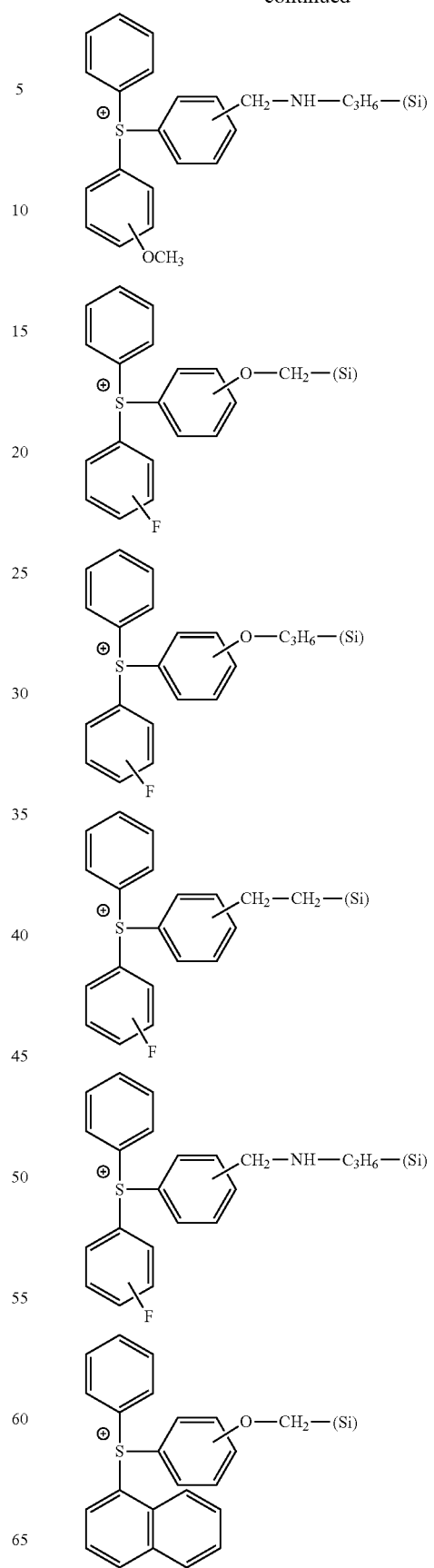

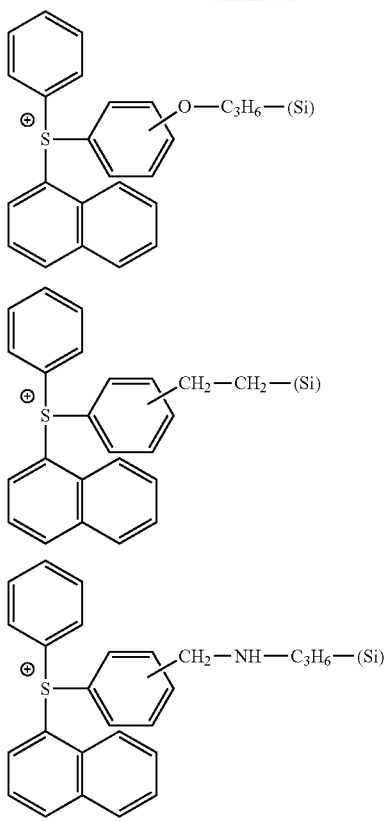

For example, a hydrolysable silicon compound having a structure containing the iodonium salt as a part can be shown by the following general formula (Xm-2):

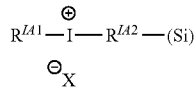

where $R^{IA1}$ represents a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of hydrogen atoms of this group are optionally substituted with an alkoxy group, an amino group, an alkylamino group, a halogen atom, or the like. Moreover, $R^{IA1}$ and $R^{IA2}$ may form a ring together with a nitrogen atom bonded to $R^{IA1}$ and $R^{IA2}$; when a ring is formed, $R^{IA1}$ and $R^{IA2}$ each represent an alkylene group having 1 to 6 carbon atoms. $R^{IA2}$ represents a linear, branched, or cyclic alkylene group or alkenylene group having 1 to 20 carbon atoms, or a substituted or unsubstituted arylene group or aralkylene group having 6 to 20 carbon atoms; some or all of hydrogen atoms of these groups are optionally substituted with an alkoxy group, an amino group, an alkylamino group, or the like. $R^{IA1}$ to $R^{IA2}$ each may have an oxygen atom or a nitrogen atom within the chain or the ring.

Specific examples of (Xm-2) include the following ($X^-$ is as defined above).

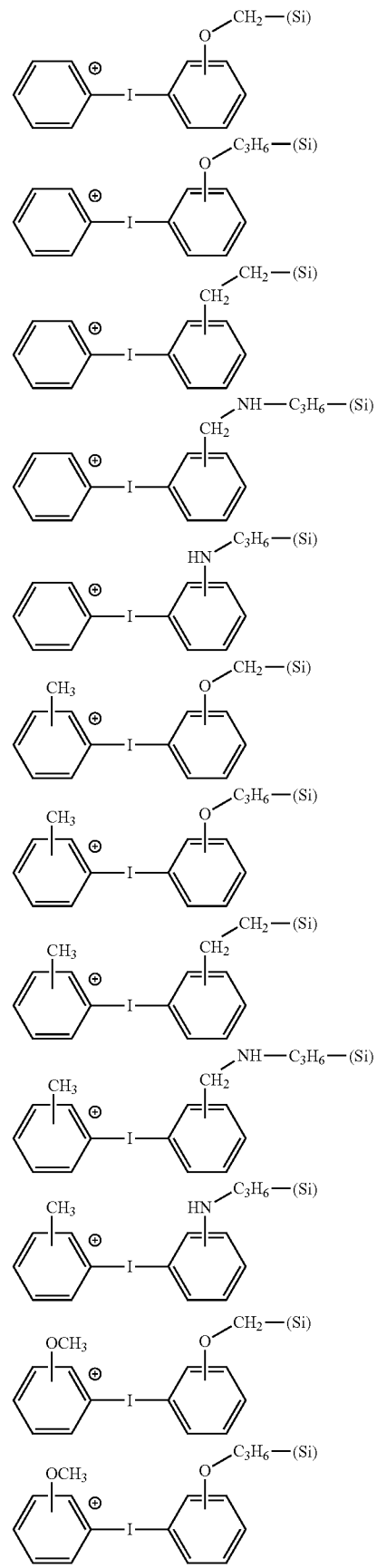

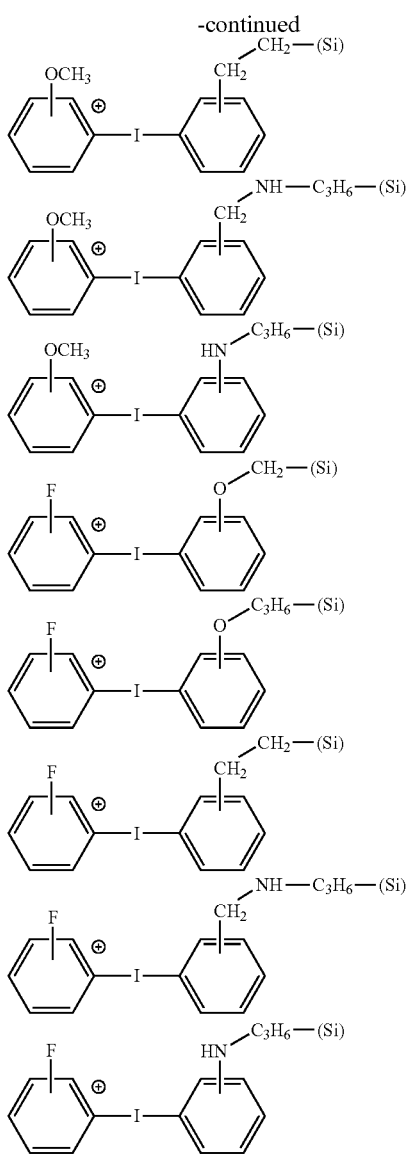

For example, a hydrolysable silicon compound having a structure containing the phosphonium salt as a part can be shown by the following general formula (Xm-3):

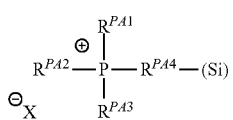

(Xm-3)

where $R^{PA1}$, $R^{PA2}$, and $R^{PA3}$ each represent a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxoalkyl group having 7 to 20 carbon atoms; some or all of hydrogen atoms of these groups are optionally substituted with an alkoxy group, an amino group, an alkylamino group, a halogen atom, or the like. Moreover, $R^{PA1}$ and $R^{PA2}$ may form a ring together with a phosphorus atom bonded to $R^{PA1}$ and $R^{PA2}$; when a ring is formed, $R^{PA1}$ and $R^{PA2}$ each represent an alkylene group having 1 to 6 carbon atoms. $R^{PA4}$ represents a linear, branched, or cyclic alkylene group or alkenylene group having 1 to 20 carbon atoms, or a substituted or unsubstituted arylene group or aralkylene group having 6 to 20 carbon atoms; some or all of hydrogen atoms of these groups are optionally substituted with an alkoxy group, an amino group, an alkylamino group, or the like. $R^{PA1}$ to $R^{PA4}$ each may have an oxygen atom or a nitrogen atom within the chain or the ring.

Specific examples of (Xm-3) include the following ($X^-$ is as defined above).

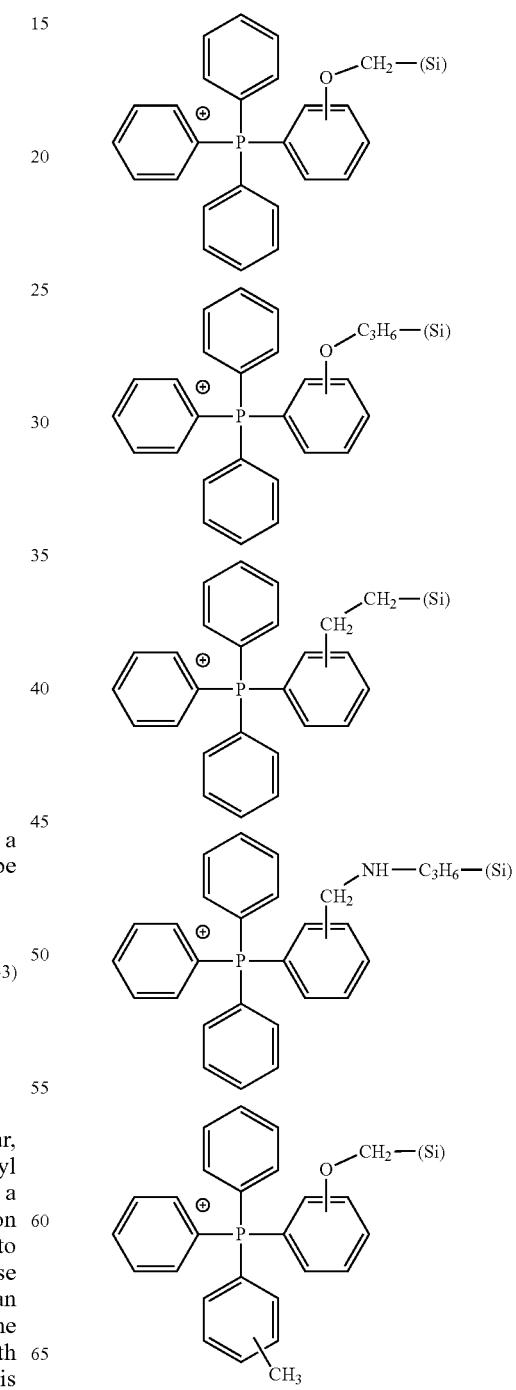

69
-continued
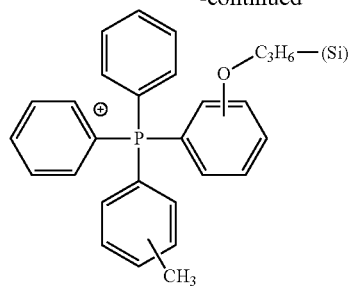
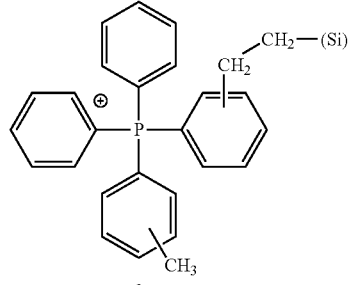
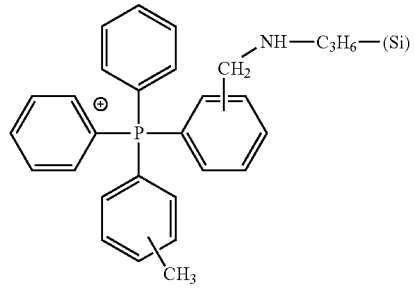
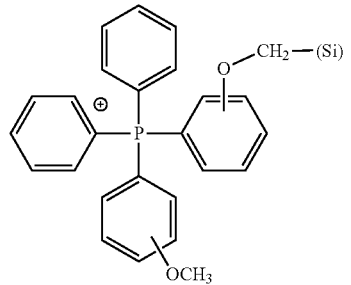
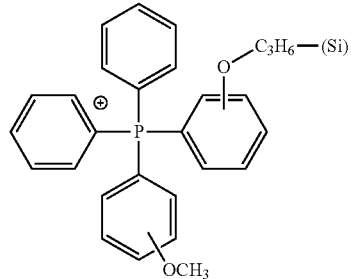
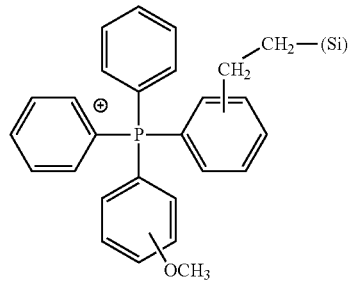
70
-continued
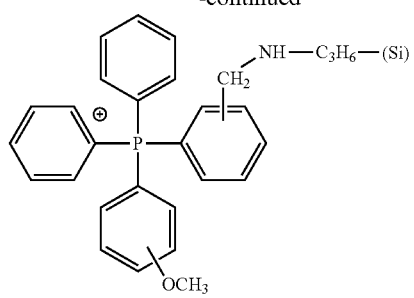
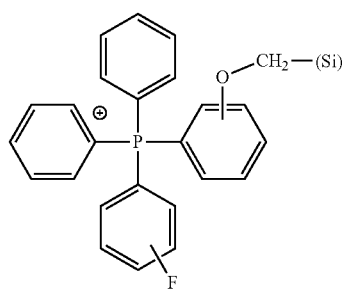
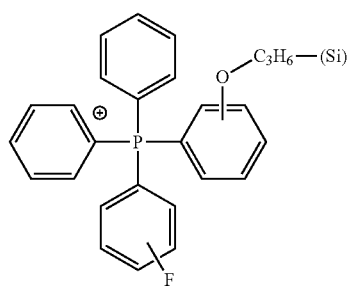
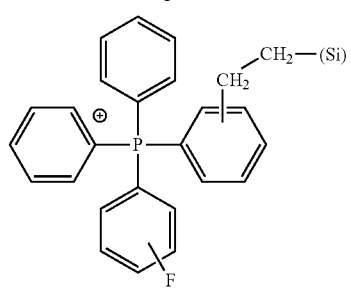
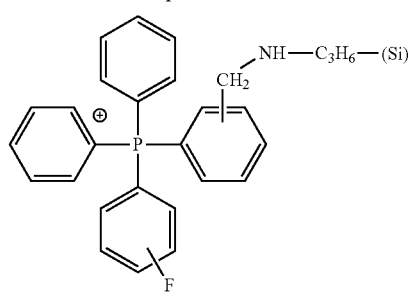
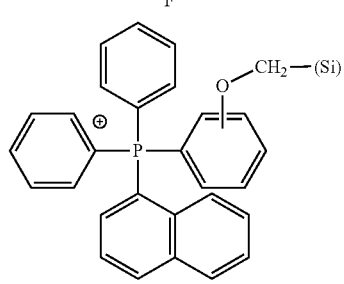

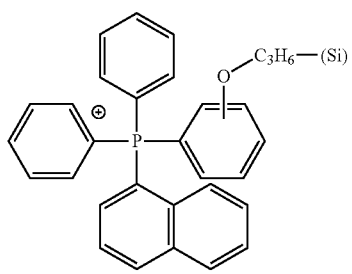
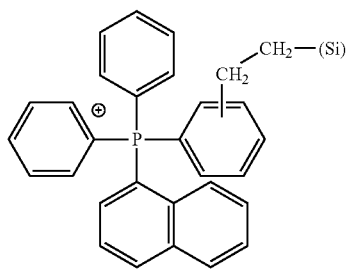
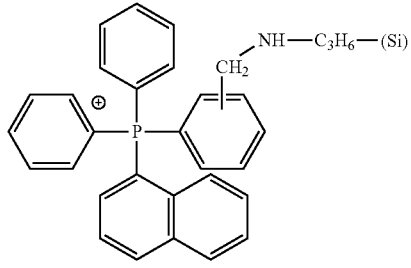
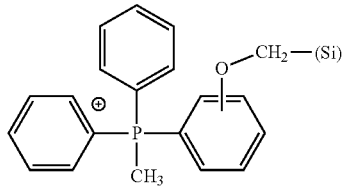
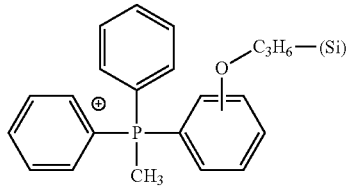
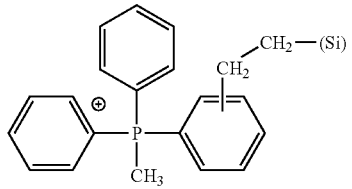
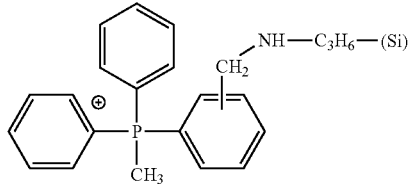
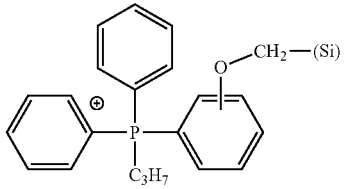
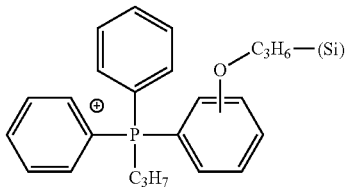
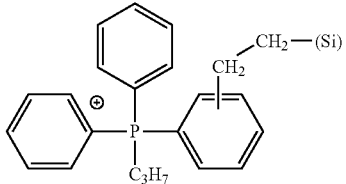
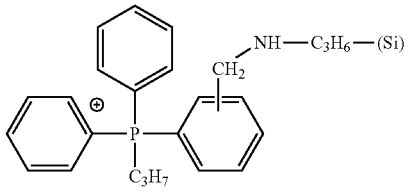
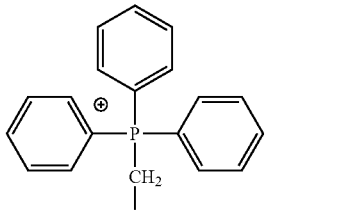
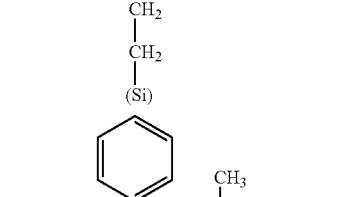
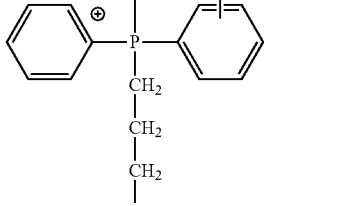
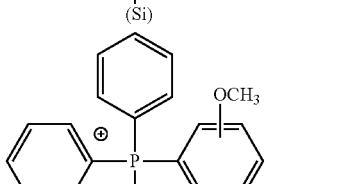
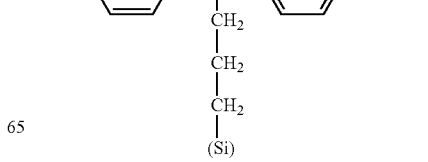

-continued

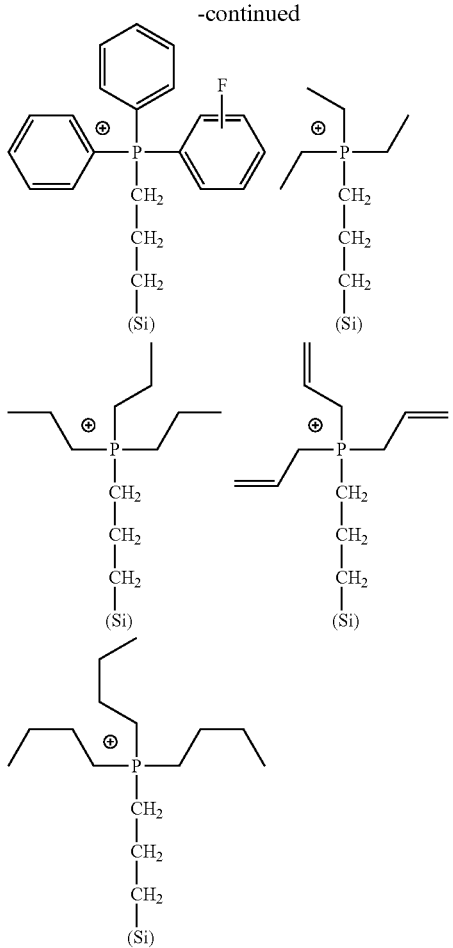

For example, a hydrolysable silicon compound having a structure containing the ammonium salt as a part can be shown by the following general formula (Xm-4):

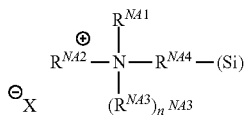

(Xm-4)

where $R^{NA1}$, $R^{NA2}$, and $R^{NA3}$ each represent hydrogen or a monovalent organic group such as a linear, branched, or cyclic alkyl group, alkenyl group, oxoalkyl group, or oxoalkenyl group having 1 to 20 carbon atoms, a substituted or unsubstituted aryl group having 6 to 20 carbon atoms, or an aralkyl group or aryloxyalkyl group having 7 to 20 carbon atoms; some or all of hydrogen atoms of these groups are optionally substituted with an alkoxy group, an amino group, an alkylamino group, or the like. Moreover, $R^{NA1}$ and $R^{NA2}$ may form a ring together with a nitrogen atom bonded to $R^{NA1}$ and $R^{NA2}$; when a ring is formed, $R^{NA1}$ and $R^{NA2}$ each represent an alkylene group having 1 to 6 carbon atoms or a heterocyclic ring or heteroaromatic ring containing nitrogen. $R^{NA4}$ represents a divalent organic group such as a linear, branched, or cyclic alkylene group or alkenylene group having 1 to 23 carbon atoms, or a substituted or unsubstituted arylene group having 6 to 29 carbon atoms; some or all of hydrogen atoms of these groups are optionally substituted with an alkoxy group, an amino group, an alkylamino group, or the like. In the case where $R^{NA1}$ and $R^{NA2}$, or $R^{NA1}$ and $R^{NA4}$, form a cyclic structure which further contains unsaturated nitrogen, $n^{NA3}=0$; in the other cases, $n^{NA3}=1$.

Specific examples of (Xm-4) include the following ($X^-$ is as defined above).

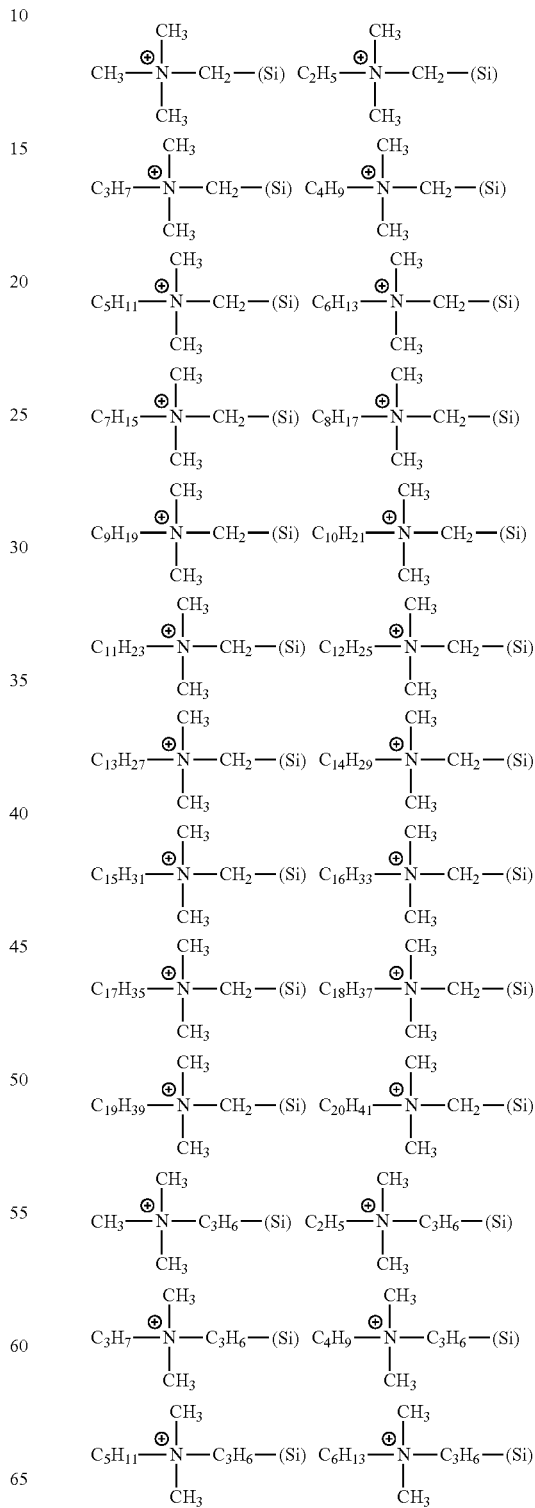

-continued $C_7H_{15}-\overset{CH_3}{\underset{CH_3}{\overset{|}{\underset{|}{N^\oplus}}}}-C_3H_6-(Si)$  $C_8H_{17}-\overset{CH_3}{\underset{CH_3}{\overset{|}{\underset{|}{N^\oplus}}}}-C_3H_6-(Si)$ $C_9H_{19}-\overset{CH_3}{\underset{CH_3}{\overset{|}{\underset{|}{N^\oplus}}}}-C_3H_6-(Si)$  $C_{10}H_{21}-\overset{CH_3}{\underset{CH_3}{\overset{|}{\underset{|}{N^\oplus}}}}-C_3H_6-(Si)$ $C_{11}H_{23}-\overset{CH_3}{\underset{CH_3}{\overset{|}{\underset{|}{N^\oplus}}}}-C_3H_6-(Si)$  $C_{12}H_{25}-\overset{CH_3}{\underset{CH_3}{\overset{|}{\underset{|}{N^\oplus}}}}-C_3H_6-(Si)$ $C_{13}H_{27}-\overset{CH_3}{\underset{CH_3}{\overset{|}{\underset{|}{N^\oplus}}}}-C_3H_6-(Si)$  $C_{14}H_{29}-\overset{CH_3}{\underset{CH_3}{\overset{|}{\underset{|}{N^\oplus}}}}-C_3H_6-(Si)$ $C_{15}H_{31}-\overset{CH_3}{\underset{CH_3}{\overset{|}{\underset{|}{N^\oplus}}}}-C_3H_6-(Si)$  $C_{16}H_{33}-\overset{CH_3}{\underset{CH_3}{\overset{|}{\underset{|}{N^\oplus}}}}-C_3H_6-(Si)$ $C_{17}H_{35}-\overset{CH_3}{\underset{CH_3}{\overset{|}{\underset{|}{N^\oplus}}}}-C_3H_6-(Si)$  $C_{18}H_{37}-\overset{CH_3}{\underset{CH_3}{\overset{|}{\underset{|}{N^\oplus}}}}-C_3H_6-(Si)$ $C_{19}H_{39}-\overset{CH_3}{\underset{CH_3}{\overset{|}{\underset{|}{N^\oplus}}}}-C_3H_6-(Si)$  $C_{20}H_{41}-\overset{CH_3}{\underset{CH_3}{\overset{|}{\underset{|}{N^\oplus}}}}-C_3H_6-(Si)$ $C_2H_5-\overset{CH_3}{\underset{C_2H_5}{\overset{|}{\underset{|}{N^\oplus}}}}-CH_2-(Si)$  $C_3H_7-\overset{CH_3}{\underset{C_3H_7}{\overset{|}{\underset{|}{N^\oplus}}}}-CH_2-(Si)$ $C_4H_9-\overset{CH_3}{\underset{C_4H_9}{\overset{|}{\underset{|}{N^\oplus}}}}-CH_2-(Si)$  $C_5H_{11}-\overset{CH_3}{\underset{C_5H_{11}}{\overset{|}{\underset{|}{N^\oplus}}}}-CH_2-(Si)$ $C_6H_{13}-\overset{CH_3}{\underset{C_6H_{13}}{\overset{|}{\underset{|}{N^\oplus}}}}-CH_2-(Si)$  $C_7H_{15}-\overset{CH_3}{\underset{C_7H_{15}}{\overset{|}{\underset{|}{N^\oplus}}}}-CH_2-(Si)$ $C_8H_{17}-\overset{CH_3}{\underset{C_8H_{17}}{\overset{|}{\underset{|}{N^\oplus}}}}-CH_2-(Si)$  $C_9H_{19}-\overset{CH_3}{\underset{C_9H_{19}}{\overset{|}{\underset{|}{N^\oplus}}}}-CH_2-(Si)$ $C_{10}H_{21}-\overset{CH_3}{\underset{C_{10}H_{21}}{\overset{|}{\underset{|}{N^\oplus}}}}-CH_2-(Si)$  $C_{11}H_{23}-\overset{CH_3}{\underset{C_{11}H_{23}}{\overset{|}{\underset{|}{N^\oplus}}}}-CH_2-(Si)$ $C_{12}H_{25}-\overset{CH_3}{\underset{C_{12}H_{25}}{\overset{|}{\underset{|}{N^\oplus}}}}-CH_2-(Si)$  $C_{13}H_{27}-\overset{CH_3}{\underset{C_{13}H_{27}}{\overset{|}{\underset{|}{N^\oplus}}}}-CH_2-(Si)$ $C_{14}H_{29}-\overset{CH_3}{\underset{C_{14}H_{29}}{\overset{|}{\underset{|}{N^\oplus}}}}-CH_2-(Si)$  $C_{15}H_{31}-\overset{CH_3}{\underset{C_{15}H_{31}}{\overset{|}{\underset{|}{N^\oplus}}}}-CH_2-(Si)$ $C_{16}H_{33}-\overset{CH_3}{\underset{C_{16}H_{33}}{\overset{|}{\underset{|}{N^\oplus}}}}-CH_2-(Si)$  $C_{17}H_{35}-\overset{CH_3}{\underset{C_{17}H_{35}}{\overset{|}{\underset{|}{N^\oplus}}}}-CH_2-(Si)$ -continued $C_{18}H_{37}-\overset{CH_3}{\underset{C_{18}H_{37}}{\overset{|}{\underset{|}{N^\oplus}}}}-CH_2-(Si)$  $C_{19}H_{39}-\overset{CH_3}{\underset{C_{19}H_{39}}{\overset{|}{\underset{|}{N^\oplus}}}}-CH_2-(Si)$ $C_{20}H_{41}-\overset{CH_3}{\underset{C_{20}H_{41}}{\overset{|}{\underset{|}{N^\oplus}}}}-CH_2-(Si)$  $H_3C-\overset{CH_3}{\underset{CH_3}{\overset{|}{\underset{|}{N^\oplus}}}}-C_4H_8-(Si)$ $H_3C-\overset{CH_3}{\underset{CH_3}{\overset{|}{\underset{|}{N^\oplus}}}}-C_5H_{10}-(Si)$  $H_3C-\overset{CH_3}{\underset{CH_3}{\overset{|}{\underset{|}{N^\oplus}}}}-C_6H_{12}-(Si)$ $H_3C-\overset{CH_3}{\underset{CH_3}{\overset{|}{\underset{|}{N^\oplus}}}}-C_7H_{14}-(Si)$  $H_3C-\overset{CH_3}{\underset{CH_3}{\overset{|}{\underset{|}{N^\oplus}}}}-C_8H_{16}-(Si)$ $H_3C-\overset{CH_3}{\underset{CH_3}{\overset{|}{\underset{|}{N^\oplus}}}}-C_9H_{18}-(Si)$  $H_3C-\overset{CH_3}{\underset{CH_3}{\overset{|}{\underset{|}{N^\oplus}}}}-C_{10}H_{20}-(Si)$ $H_3C-\overset{CH_3}{\underset{CH_3}{\overset{|}{\underset{|}{N^\oplus}}}}-C_{11}H_{22}-(Si)$  $H_3C-\overset{CH_3}{\underset{CH_3}{\overset{|}{\underset{|}{N^\oplus}}}}-C_{12}H_{24}-(Si)$ $H_3C-\overset{CH_3}{\underset{CH_3}{\overset{|}{\underset{|}{N^\oplus}}}}-C_{13}H_{26}-(Si)$  $H_3C-\overset{CH_3}{\underset{CH_3}{\overset{|}{\underset{|}{N^\oplus}}}}-C_{14}H_{28}-(Si)$ $H_3C-\overset{CH_3}{\underset{CH_3}{\overset{|}{\underset{|}{N^\oplus}}}}-C_{15}H_{30}-(Si)$  $H_3C-\overset{CH_3}{\underset{CH_3}{\overset{|}{\underset{|}{N^\oplus}}}}-C_{16}H_{32}-(Si)$ $H_3C-\overset{CH_3}{\underset{CH_3}{\overset{|}{\underset{|}{N^\oplus}}}}-C_{17}H_{34}-(Si)$  $H_3C-\overset{CH_3}{\underset{CH_3}{\overset{|}{\underset{|}{N^\oplus}}}}-C_{18}H_{36}-(Si)$ $H_3C-\overset{CH_3}{\underset{CH_3}{\overset{|}{\underset{|}{N^\oplus}}}}-C_{19}H_{38}-(Si)$  $H_3C-\overset{CH_3}{\underset{CH_3}{\overset{|}{\underset{|}{N^\oplus}}}}-C_{20}H_{40}-(Si)$ $C_2H_5-\overset{CH_3}{\underset{C_2H_5}{\overset{|}{\underset{|}{N^\oplus}}}}-C_3H_6-(Si)$  $C_3H_7-\overset{CH_3}{\underset{C_3H_7}{\overset{|}{\underset{|}{N^\oplus}}}}-C_3H_6-(Si)$ $C_4H_9-\overset{CH_3}{\underset{C_4H_9}{\overset{|}{\underset{|}{N^\oplus}}}}-C_3H_6-(Si)$  $C_5H_{11}-\overset{CH_3}{\underset{C_5H_{11}}{\overset{|}{\underset{|}{N^\oplus}}}}-C_3H_6-(Si)$ $C_6H_{13}-\overset{CH_3}{\underset{C_6H_{13}}{\overset{|}{\underset{|}{N^\oplus}}}}-C_3H_6-(Si)$  $C_7H_{15}-\overset{CH_3}{\underset{C_7H_{15}}{\overset{|}{\underset{|}{N^\oplus}}}}-C_3H_6-(Si)$ $C_8H_{17}-\overset{CH_3}{\underset{C_8H_{17}}{\overset{|}{\underset{|}{N^\oplus}}}}-C_3H_6-(Si)$  $C_9H_{19}-\overset{CH_3}{\underset{C_9H_{19}}{\overset{|}{\underset{|}{N^\oplus}}}}-C_3H_6-(Si)$ $C_{10}H_{21}-\overset{CH_3}{\underset{C_{10}H_{21}}{\overset{|}{\underset{|}{N^\oplus}}}}-C_3H_6-(Si)$  $C_{11}H_{23}-\overset{CH_3}{\underset{C_{11}H_{23}}{\overset{|}{\underset{|}{N^\oplus}}}}-C_3H_6-(Si)$

77

$C_{12}H_{25}$—N⁺(CH₃)(C₁₂H₂₅)—C₃H₆—(Si)    $C_{13}H_{27}$—N⁺(CH₃)(C₁₃H₂₇)—C₃H₆—(Si)

$C_{14}H_{29}$—N⁺(CH₃)(C₁₄H₂₉)—C₃H₆—(Si)    $C_{15}H_{31}$—N⁺(CH₃)(C₁₅H₃₁)—C₃H₆—(Si)

$C_{16}H_{33}$—N⁺(CH₃)(C₁₆H₃₃)—C₃H₆—(Si)    $C_{17}H_{35}$—N⁺(CH₃)(C₁₇H₃₅)—C₃H₆—(Si)

$C_{18}H_{37}$—N⁺(CH₃)(C₁₈H₃₇)—C₃H₆—(Si)    $C_{19}H_{39}$—N⁺(CH₃)(C₁₉H₃₉)—C₃H₆—(Si)

$C_{20}H_{41}$—N⁺(CH₃)(C₂₀H₄₁)—C₃H₆—(Si)

H₃C—N⁺(CH₃)(CH₃)—C₂H₄—NH—CH₂—(Si)

H₃C—N⁺(CH₃)(CH₃)—C₃H₆—NH—CH₂—(Si)

H₃C—N⁺(CH₃)(CH₃)—C₄H₈—NH—CH₂—(Si)

H₃C—N⁺(CH₃)(CH₃)—C₅H₁₀—NH—CH₂—(Si)

H₃C—N⁺(CH₃)(CH₃)—C₆H₁₂—NH—CH₂—(Si)

H₃C—N⁺(CH₃)(CH₃)—C₇H₁₄—NH—CH₂—(Si)

H₃C—N⁺(CH₃)(CH₃)—C₈H₁₆—NH—CH₂—(Si)

H₃C—N⁺(CH₃)(CH₃)—C₉H₁₈—NH—CH₂—(Si)

H₃C—N⁺(CH₃)(CH₃)—C₁₀H₂₀—NH—CH₂—(Si)

H₃C—N⁺(CH₃)(CH₃)—C₁₁H₂₂—NH—CH₂—(Si)

78

H₃C—N⁺(CH₃)(CH₃)—C₁₂H₂₄—NH—CH₂—(Si)

H₃C—N⁺(CH₃)(CH₃)—C₁₃H₂₆—NH—CH₂—(Si)

H₃C—N⁺(CH₃)(CH₃)—C₁₄H₂₈—NH—CH₂—(Si)

H₃C—N⁺(CH₃)(CH₃)—C₁₅H₃₀—NH—CH₂—(Si)

H₃C—N⁺(CH₃)(CH₃)—C₁₆H₃₂—NH—CH₂—(Si)

H₃C—N⁺(CH₃)(CH₃)—C₁₇H₃₄—NH—CH₂—(Si)

H₃C—N⁺(CH₃)(CH₃)—C₁₈H₃₆—NH—CH₂—(Si)

H₃C—N⁺(CH₃)(CH₃)—C₁₉H₃₈—NH—CH₂—(Si)

H₃C—N⁺(CH₃)(CH₃)—C₂₀H₄₀—NH—CH₂—(Si)

H₃C—N⁺(CH₃)(CH₃)—C₂H₄—NH—C₃H₆—(Si)

H₃C—N⁺(CH₃)(CH₃)—C₃H₆—NH—C₃H₆—(Si)

H₃C—N⁺(CH₃)(CH₃)—C₄H₈—NH—C₃H₆—(Si)

H₃C—N⁺(CH₃)(CH₃)—C₅H₁₀—NH—C₃H₆—(Si)

H₃C—N⁺(CH₃)(CH₃)—C₆H₁₂—NH—C₃H₆—(Si)

H₃C—N⁺(CH₃)(CH₃)—C₇H₁₄—NH—C₃H₆—(Si)

79
-continued

H₃C—N⁺(CH₃)(CH₃)—C₈H₁₆—NH—C₃H₆—(Si)

H₃C—N⁺(CH₃)(CH₃)—C₉H₁₈—NH—C₃H₆—(Si)

H₃C—N⁺(CH₃)(CH₃)—C₁₀H₂₀—NH—C₃H₆—(Si)

H₃C—N⁺(CH₃)(CH₃)—C₁₁H₂₂—NH—C₃H₆—(Si)

H₃C—N⁺(CH₃)(CH₃)—C₁₂H₂₄—NH—C₃H₆—(Si)

H₃C—N⁺(CH₃)(CH₃)—C₁₃H₂₆—NH—C₃H₆—(Si)

H₃C—N⁺(CH₃)(CH₃)—C₁₄H₂₈—NH—C₃H₆—(Si)

H₃C—N⁺(CH₃)(CH₃)—C₁₅H₃₀—NH—C₃H₆—(Si)

H₃C—N⁺(CH₃)(CH₃)—C₁₆H₃₂—NH—C₃H₆—(Si)

H₃C—N⁺(CH₃)(CH₃)—C₁₇H₃₄—NH—C₃H₆—(Si)

H₃C—N⁺(CH₃)(CH₃)—C₁₈H₃₆—NH—C₃H₆—(Si)

H₃C—N⁺(CH₃)(CH₃)—C₁₉H₃₈—NH—C₃H₆—(Si)

H₃C—N⁺(CH₃)(CH₃)—C₂₀H₄₀—NH—C₃H₆—(Si)

H₃C—N⁺(CH₃)(CH₃)—C₂H₄—NH—C₄H₈—(Si)

H₃C—N⁺(CH₃)(CH₃)—C₂H₄—NH—C₅H₁₀—(Si)

80
-continued

H₃C—N⁺(CH₃)(CH₃)—C₂H₄—NH—C₆H₁₂—(Si)

H₃C—N⁺(CH₃)(CH₃)—C₂H₄—NH—C₇H₁₄—(Si)

H₃C—N⁺(CH₃)(CH₃)—C₂H₄—NH—C₈H₁₆—(Si)

H₃C—N⁺(CH₃)(CH₃)—C₂H₄—NH—C₉H₁₈—(Si)

H₃C—N⁺(CH₃)(CH₃)—C₂H₄—NH—C₁₀H₂₀—(Si)

H₃C—N⁺(CH₃)(CH₃)—C₂H₄—NH—C₁₁H₂₂—(Si)

H₃C—N⁺(CH₃)(CH₃)—C₂H₄—NH—C₁₂H₂₄—(Si)

H₃C—N⁺(CH₃)(CH₃)—C₂H₄—NH—C₁₃H₂₆—(Si)

H₃C—N⁺(CH₃)(CH₃)—C₂H₄—NH—C₁₄H₂₈—(Si)

H₃C—N⁺(CH₃)(CH₃)—C₂H₄—NH—C₁₅H₃₀—(Si)

H₃C—N⁺(CH₃)(CH₃)—C₂H₄—NH—C₁₆H₃₂—(Si)

H₃C—N⁺(CH₃)(CH₃)—C₂H₄—NH—C₁₇H₃₄—(Si)

H₃C—N⁺(CH₃)(CH₃)—C₂H₄—NH—C₁₈H₃₆—(Si)

H₃C—N⁺(CH₃)(CH₃)—C₂H₄—NH—C₁₉H₃₈—(Si)

H₃C—N⁺(CH₃)(CH₃)—C₂H₄—NH—C₂₀H₄₀—(Si)

-continued
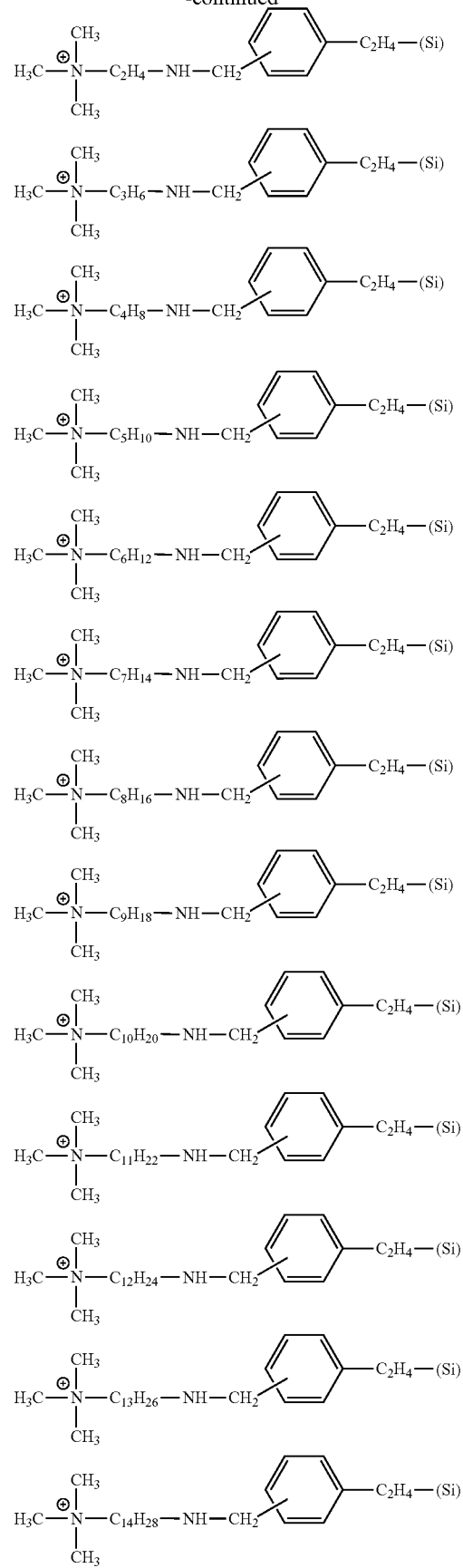
-continued
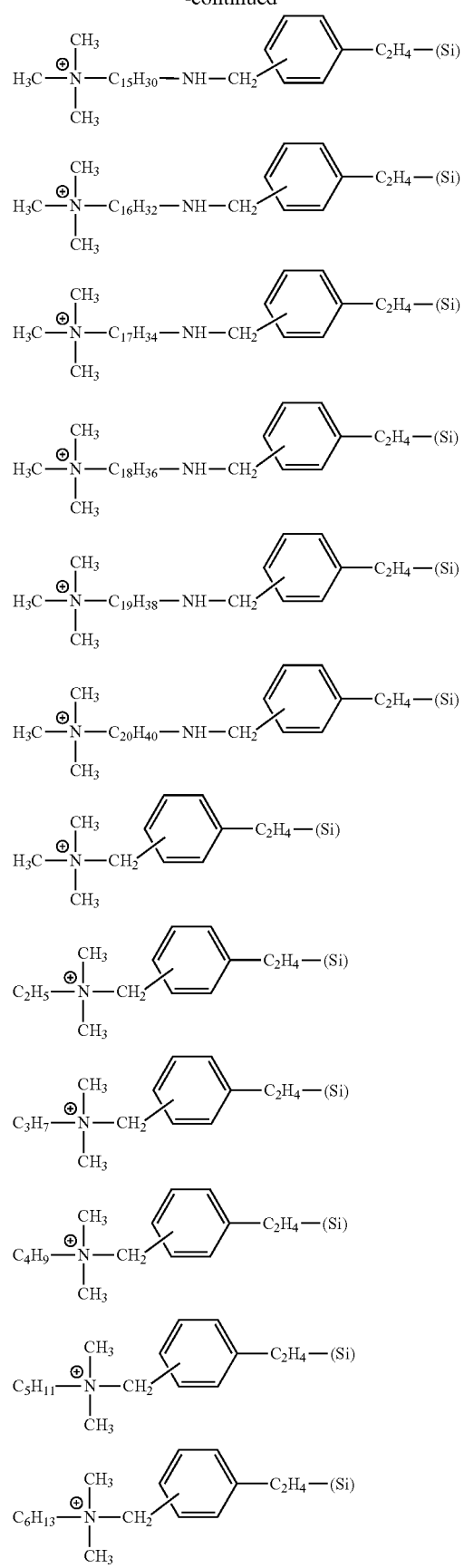

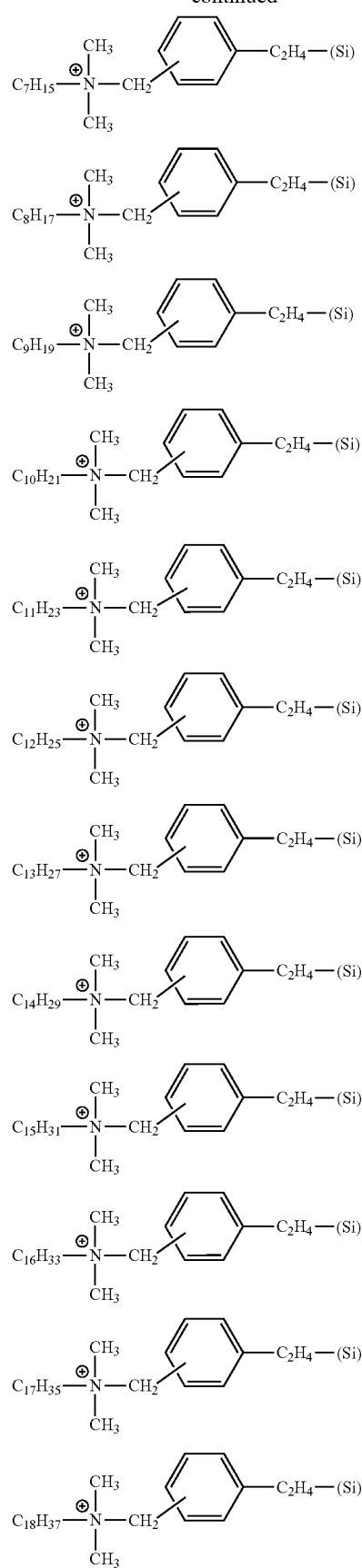
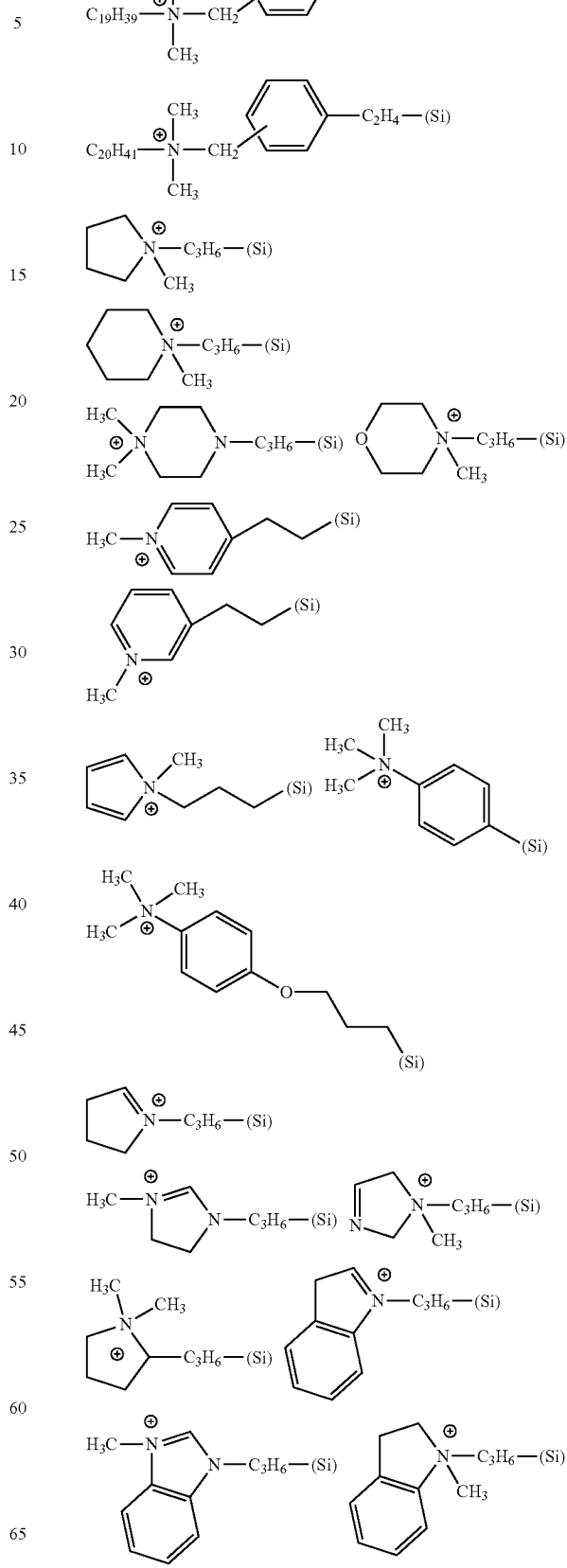

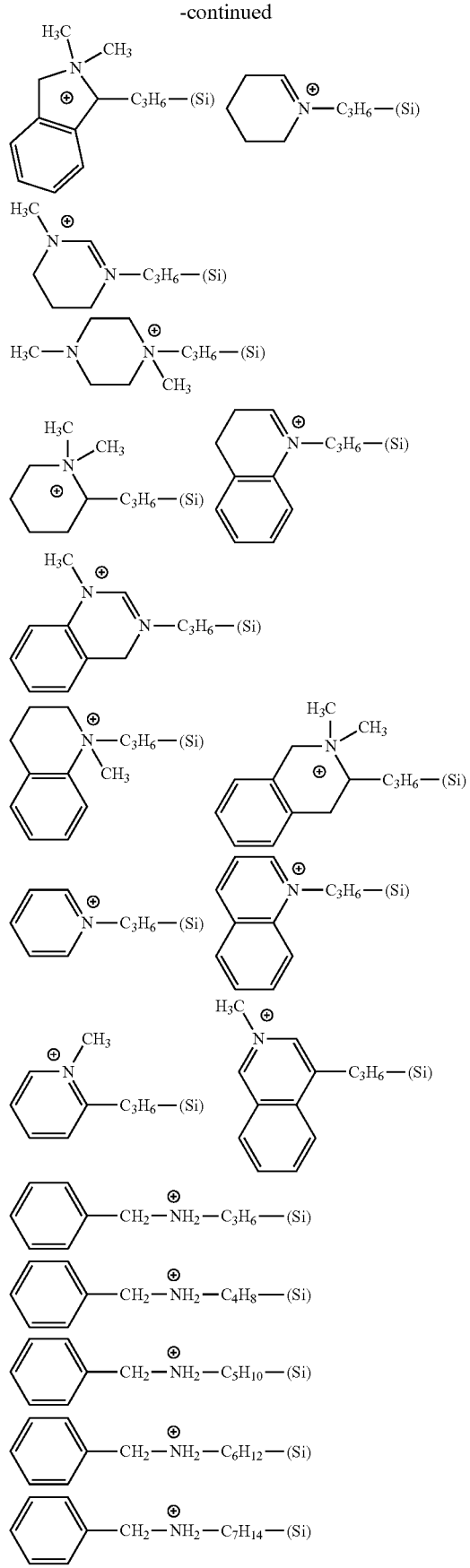
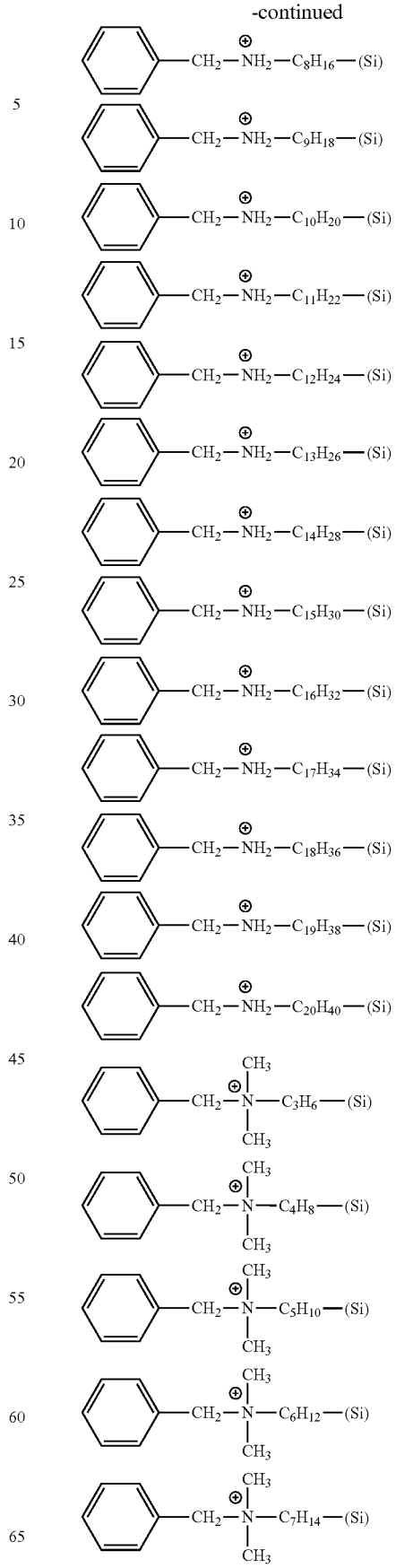

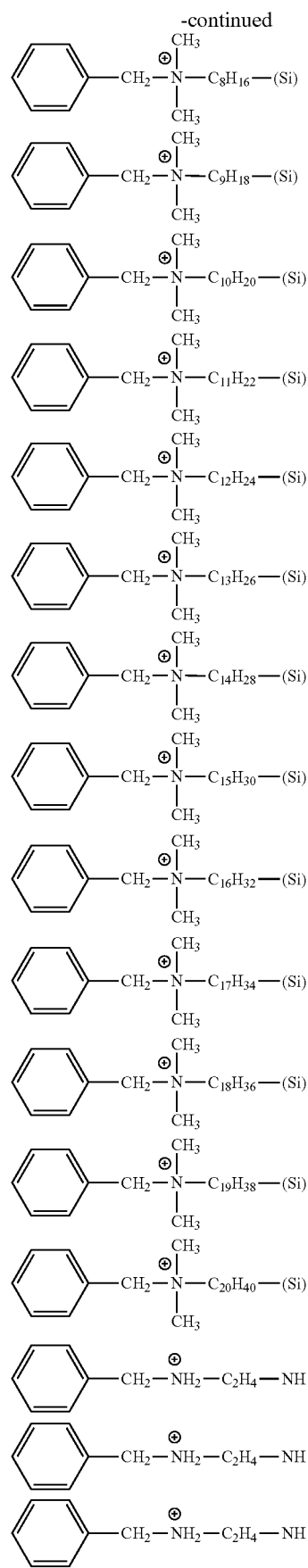
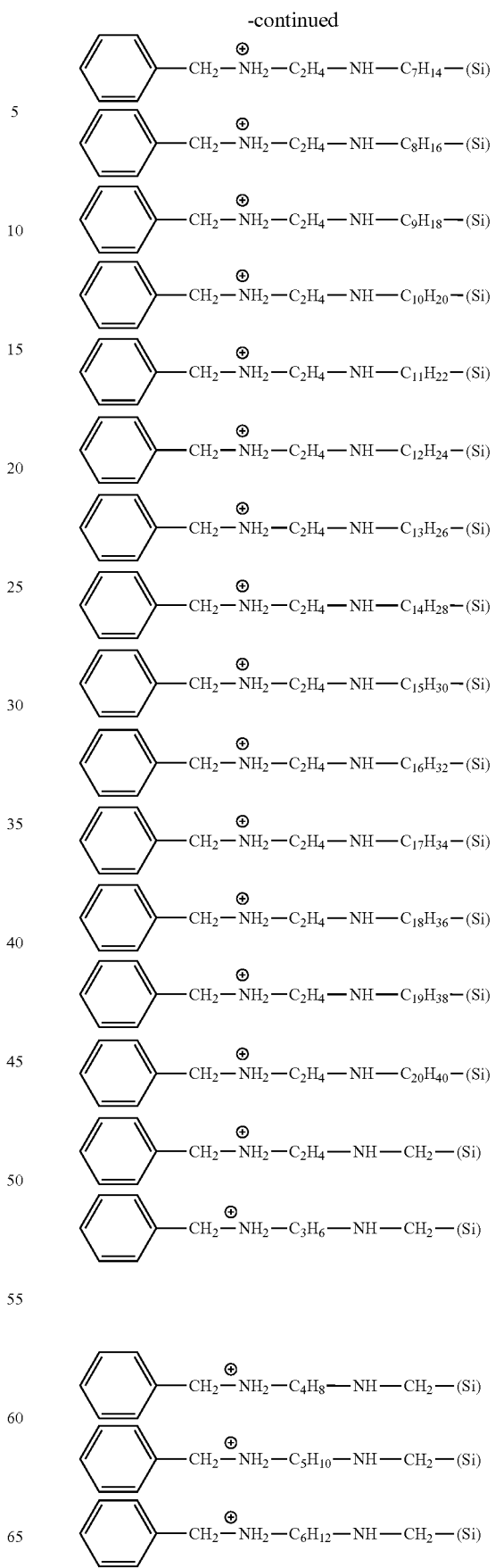

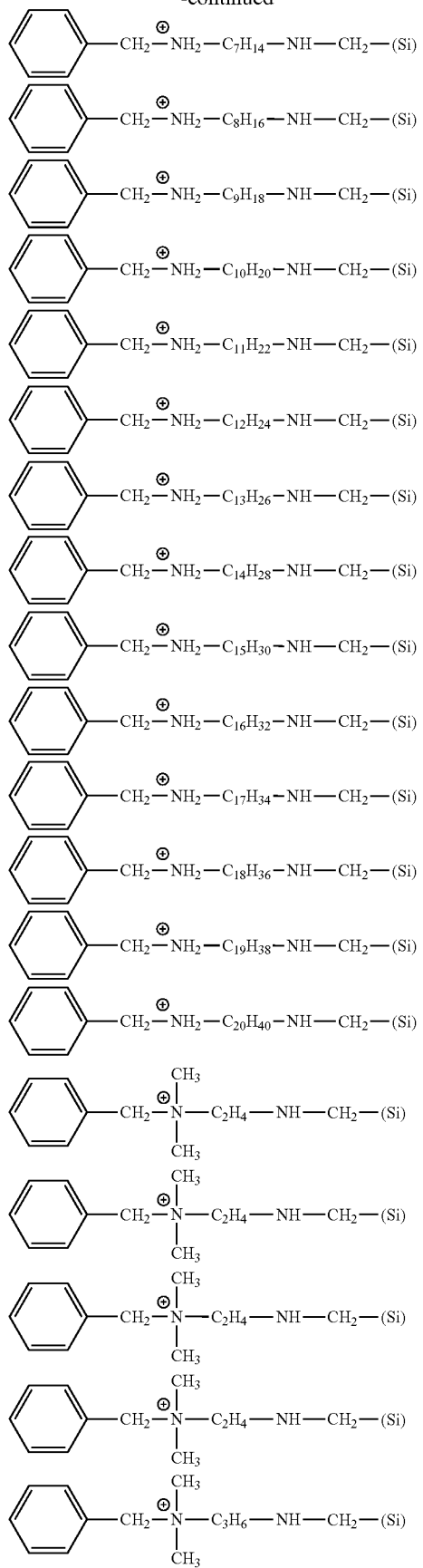
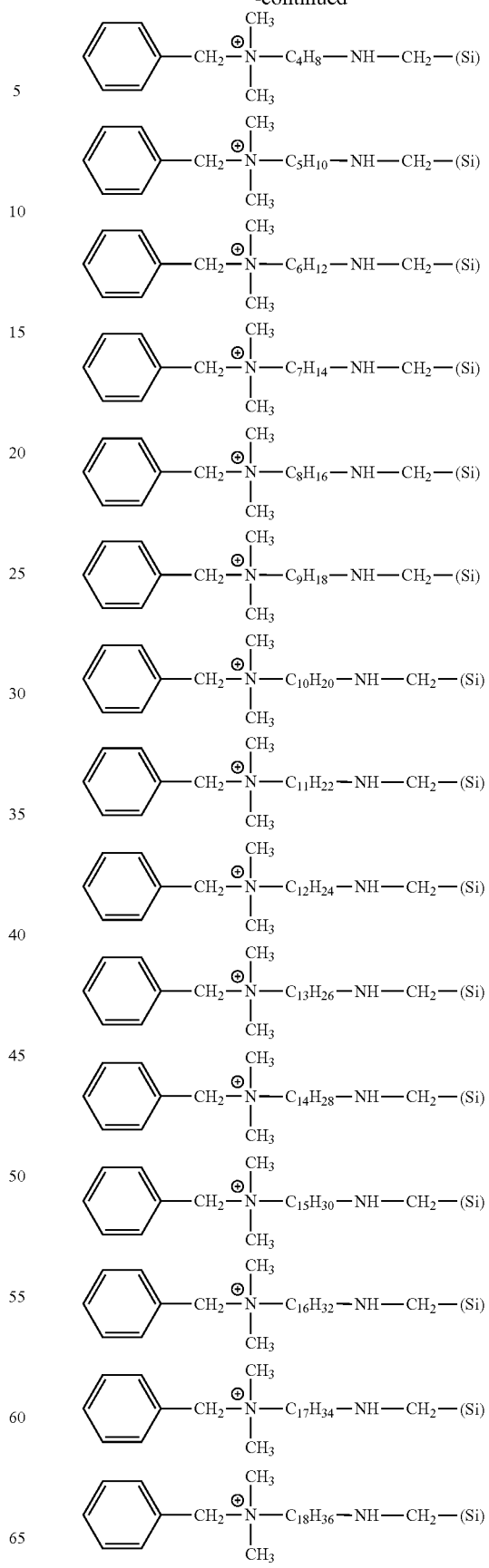

91
-continued
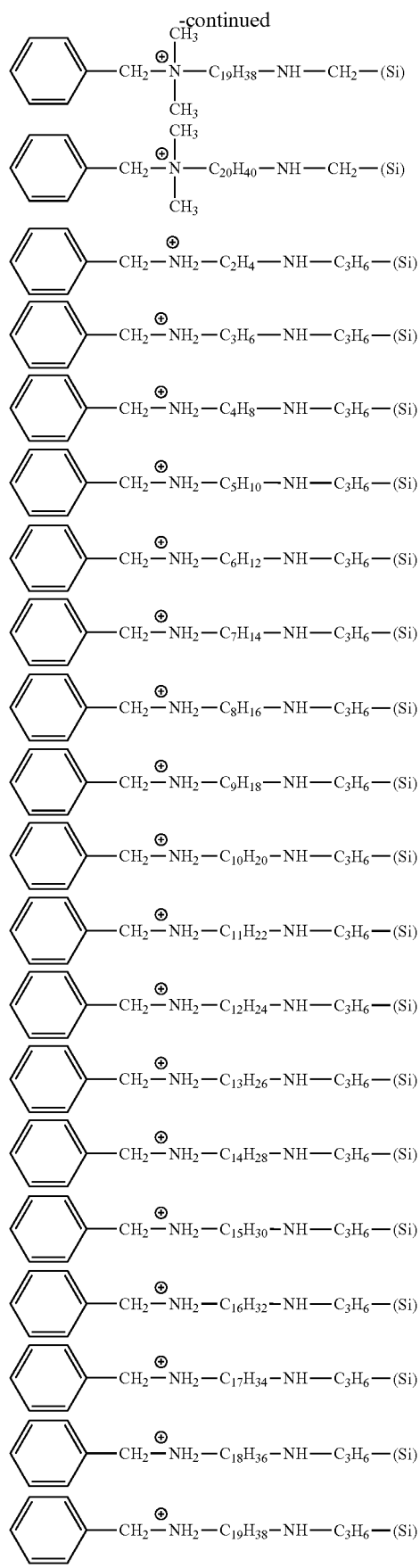
92
-continued
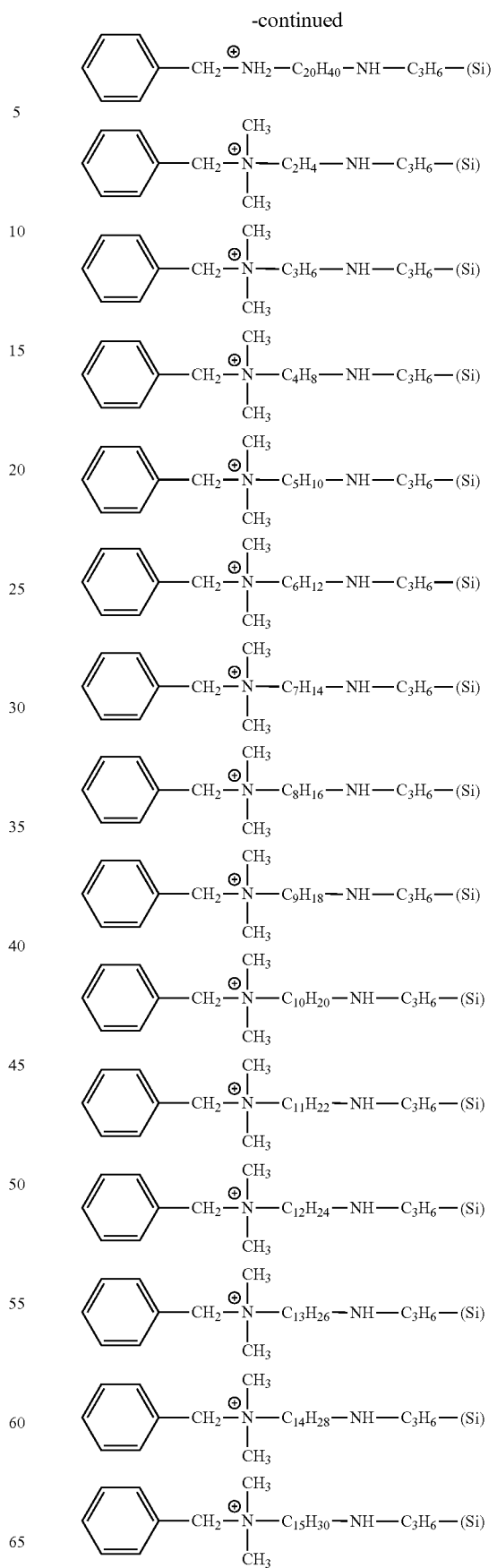

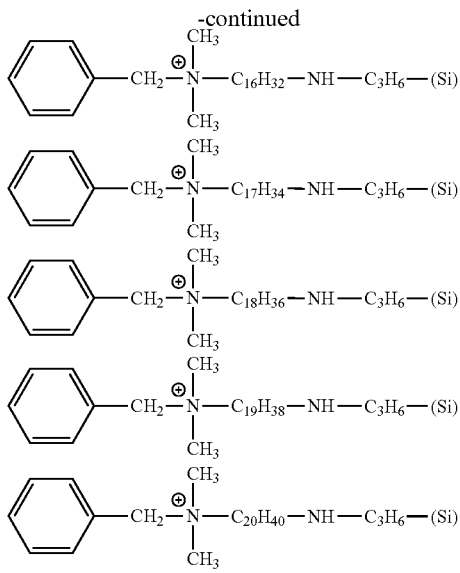

A hydrolysable silicon compound can be used simultaneously with (Xm-1), (Xm-2), (Xm-3), and (Xm-4) to produce (Xc-10). An example of such a hydrolysable silicon compound includes the hydrolysable monomer (Sm).

A reaction raw material for forming (Xc-10) can be prepared by: selecting at least one of the monomers (Xm-1), (Xm-2), (Xm-3), and (Xm-4) described above, in addition to one or both of the hydrolysable monomers (Sm) and (Sm-I); and then mixing the selected monomers before or during the reaction. The reaction conditions may follow the same method as the method for synthesizing the silicon-containing material (Sx).

The molecular weight of the silicon-containing compound (Xc-10) to be obtained can be adjusted not only through the selection of the monomer but also by controlling the reaction conditions during the polymerization. If a silicon-containing compound (Xc-10) having a weight average molecular weight of more than 100,000 is used, foreign matters or coating spots are generated in some cases. Thus, it is preferable to use the silicon-containing compound (Xc-10) having a weight average molecular weight of 100,000 or less, more preferably 200 to 50,000, further preferably 300 to 30,000. Regarding data on the weight average molecular weight, the molecular weight is expressed in terms of polystyrene which is obtained by gel-permeation chromatography (GPC) using a refractive index (RI) detector, tetrahydrofuran as an eluent, and polystyrene as a reference substance.

Note that one of the crosslinking catalysts (Xc-1), (Xc-2), (Xc-3), (Xc-4), and (Xc-10) can be used alone, or two or more thereof can be used in combination. The amount of the crosslinking catalyst to be added is preferably 0.01 to 50 parts by mass, more preferably 0.1 to 40 parts by mass, based on 100 parts by mass of the base polymer (i.e., the silicon-containing compound (Sx) obtained by the above method).

[Other Components]
(Organic Acid)

To improve the stability of the inventive composition for forming a silicon-containing resist underlayer film, it is preferable to add a monovalent, divalent, or more polyvalent organic acid having 1 to 30 carbon atoms. Examples of the acid added in this event include formic acid, acetic acid, propionic acid, butanoic acid, pentanoic acid, hexanoic acid, heptanoic acid, octanoic acid, nonanoic acid, decanoic acid, oleic acid, stearic acid, linoleic acid, linolenic acid, benzoic acid, phthalic acid, isophthalic acid, terephthalic acid, salicylic acid, trifluoroacetic acid, monochloroacetic acid, dichloroacetic acid, trichloroacetic acid, oxalic acid, malonic acid, methylmalonic acid, ethylmalonic acid, propylmalonic acid, butylmalonic acid, dimethylmalonic acid, diethylmalonic acid, succinic acid, methylsuccinic acid, glutaric acid, adipic acid, itaconic acid, maleic acid, fumaric acid, citraconic acid, citric acid, and the like. Particularly, oxalic acid, maleic acid, formic acid, acetic acid, propionic acid, citric acid, and the like are preferable. Moreover, a mixture of two or more acids may be used to keep the stability. The amount of the acid to be added may be 0.001 to 25 parts by mass, preferably 0.01 to 15 parts by mass, more preferably 0.1 to 5 parts by mass, based on 100 parts by mass of silicon contained in the composition.

Otherwise, the organic acid may be blended based on the pH of the composition so as to satisfy preferably 0≤pH≤7, more preferably 0.3≤pH≤6.5, further preferably 0.5≤pH≤6.

(Water)

In the present invention, water may be added to the composition. When water is added, the polysiloxane compound in the composition is hydrated, so that the lithography performance is improved. The water content in the solvent component of the composition may be more than 0 mass % and less than 50 mass %, particularly preferably 0.3 to 30 mass %, furthermore preferably 0.5 to 20 mass %. Within these ranges, the uniformity and the lithography performance of the silicon-containing resist underlayer film are favorable, and repelling can be suppressed.

The solvent including water is used in a total amount of preferably 100 to 100,000 parts by mass, particularly preferably 200 to 50,000 parts by mass, based on 100 parts by mass of the polysiloxane compound, which is the base polymer.

(Photo-Acid Generator)

In the present invention, a photo-acid generator may be added to the composition. As the photo-acid generator used in the present invention, it is possible to add, specifically, the materials described in paragraphs (0160) to (0179) of Japanese Unexamined Patent Application Publication No. 2009-126940.

Besides, the present invention may contain one or more compounds (photo-acid generators) each having an anion moiety and a cation moiety in one molecule as shown by the following general formula (P-0):

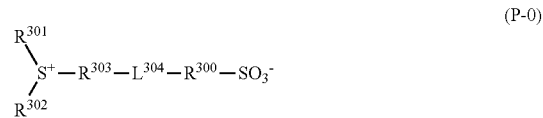

(P-0)

where $R^{300}$ represents a divalent organic group substituted with one or more fluorine atoms; $R^{301}$ and $R^{302}$ each independently represent a linear, branched, or cyclic monovalent hydrocarbon group having 1 to 20 carbon atoms optionally substituted with a hetero atom or optionally containing a hetero atom. $R^{303}$ represents a linear, branched, or cyclic divalent hydrocarbon group having 1 to 20 carbon atoms optionally substituted with a hetero atom or optionally containing a hetero atom. Moreover, $R^{301}$ and $R^{302}$, or $R^{301}$ and $R^{303}$, are optionally bonded to each other to form a ring with a sulfur atom in the formula. $L^{304}$ represents a single bond or a linear, branched, or cyclic divalent hydrocarbon group having 1 to 20 carbon atoms optionally substituted with a hetero atom or optionally containing a hetero atom.

Such a compound (photo-acid generator) in combination with the inventive thermosetting silicon-containing material makes it possible to obtain a resist underlayer film which enables the formation of an upper layer resist having a rectangular cross section while keeping the LWR of the upper layer resist from degrading.

In the general formula (P-0), $R^{300}$ is a divalent organic group having one or more fluorine atoms as a result of substitution. The divalent organic group represents, for example, a linear, branched, or cyclic divalent hydrocarbon group, such as an alkylene group, an alkenylene group, and an arylene group, having 1 to 20 carbon atoms. Specific examples of $R^{300}$ include ones with the following structures.

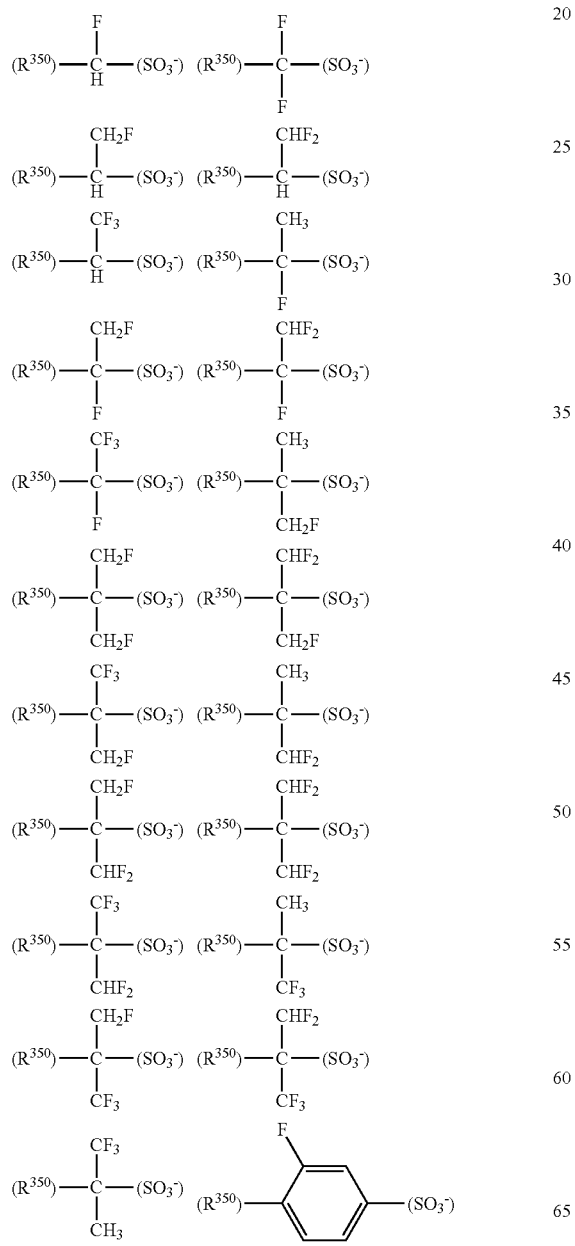

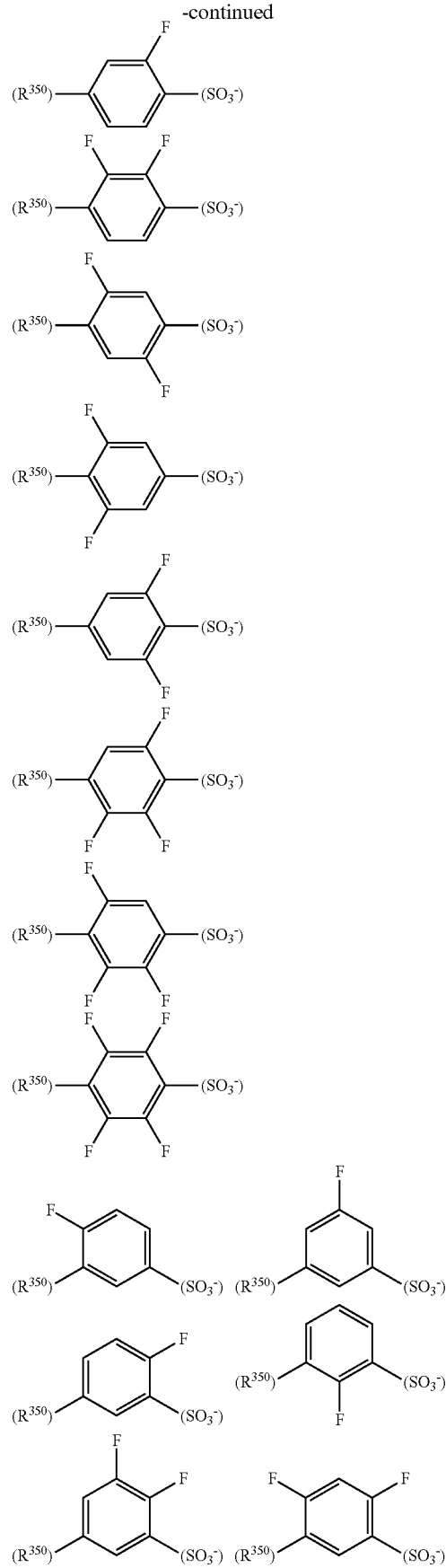

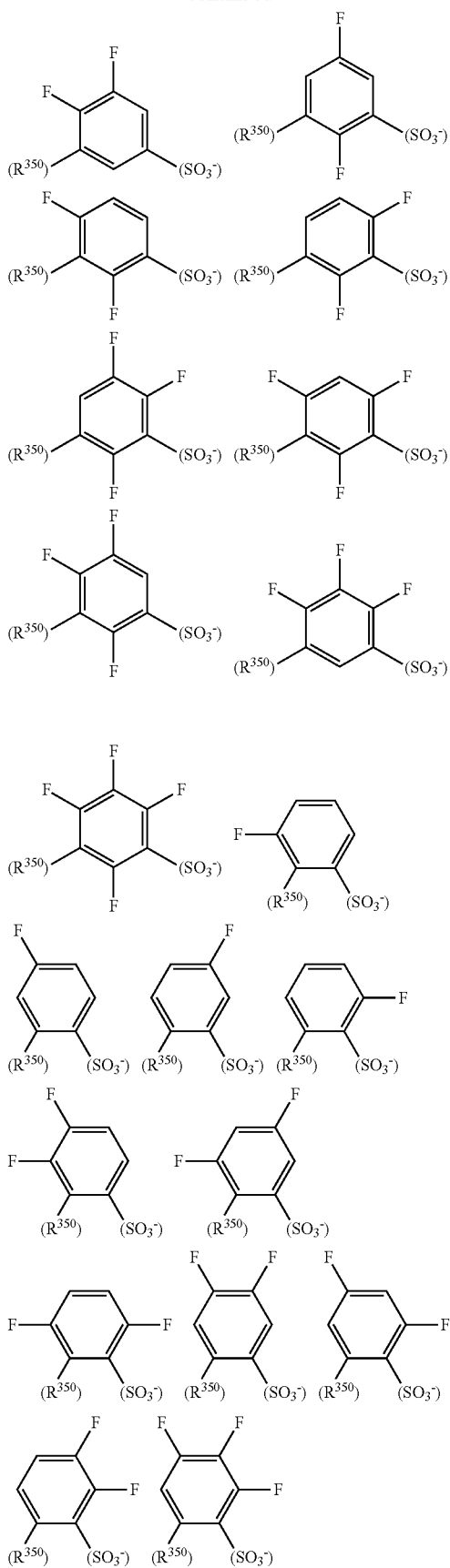

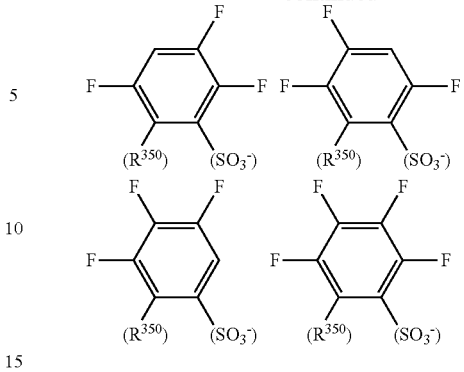

Note that, in the above formulae, $(SO_3^-)$ is depicted to show a bonding site to the $SO_3^-$ group in the general formula (P-0). Moreover, $(R^{350})$ is depicted to show a bonding site to a portion where the cation moiety in the general formula (P-0) bonds to $R^{300}$ via $L^{304}$.

$R^{301}$ and $R^{302}$ each independently represent a linear, branched, or cyclic monovalent hydrocarbon group, such as an alkyl group, an alkenyl group, an aryl group, an aralkyl group, having 1 to 20 carbon atoms and optionally substituted with a hetero atom or optionally containing a hetero atom. Examples of the alkyl group include a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropylmethyl group, a 4-methylcyclohexyl group, a cyclohexylmethyl group, a norbornyl group, an adamantyl group, and the like. Examples of the alkenyl group include a vinyl group, an allyl group, a propenyl group, a butenyl group, a hexenyl group, a cyclohexenyl group, and the like. Examples of the oxoalkyl group include a 2-oxocyclopentyl group, a 2-oxocyclohexyl group, a 2-oxopropyl group, a 2-oxoethyl group, a 2-cyclopentyl-2-oxoethyl group, a 2-cyclohexyl-2-oxoethyl group, a 2-(4-methylcyclohexyl)-2-oxoethyl group, and the like. Examples of the aryl group include a phenyl group, a naphthyl group, a thienyl group, and the like; a 4-hydroxyphenyl group; alkoxyphenyl groups such as a 4-methoxyphenyl group, a 3-methoxyphenyl group, a 2-methoxyphenyl group, a 4-ethoxyphenyl group, a 4-tert-butoxyphenyl group, and a 3-tert-butoxyphenyl group; alkylphenyl groups such as a 2-methylphenyl group, a 3-methylphenyl group, a 4-methylphenyl group, a 4-ethylphenyl group, a 4-tert-butylphenyl group, a 4-n-butylphenyl group, and a 2,4-dimethylphenyl group; alkylnaphthyl groups such as a methylnaphthyl group and an ethylnaphthyl group; alkoxynaphthyl groups such as a methoxynaphthyl group, an ethoxynaphthyl group, an n-propoxynaphthyl group, and an n-butoxynaphthyl group; dialkylnaphthyl groups such as a dimethylnaphthyl group and a diethylnaphthyl group; dialkoxynaphthyl groups such as a dimethoxynaphthyl group and a diethoxynaphthyl group; and the like. Examples of the aralkyl group include a benzyl group, a 1-phenylethyl group, a 2-phenylethyl group, and the like. Examples of the aryloxoalkyl group include 2-aryl-2-oxoethyl groups such as a 2-phenyl-2-oxoethyl group, a 2-(1-naphthyl)-2-oxoethyl group, and a 2-(2-naphthyl)-2-oxoethyl group; and the like. Additionally, $R^{301}$ and $R^{302}$ may be bonded to each other to form a ring together with the sulfur atom in the formula; in this case, examples of the ring include groups shown by the following formulae.

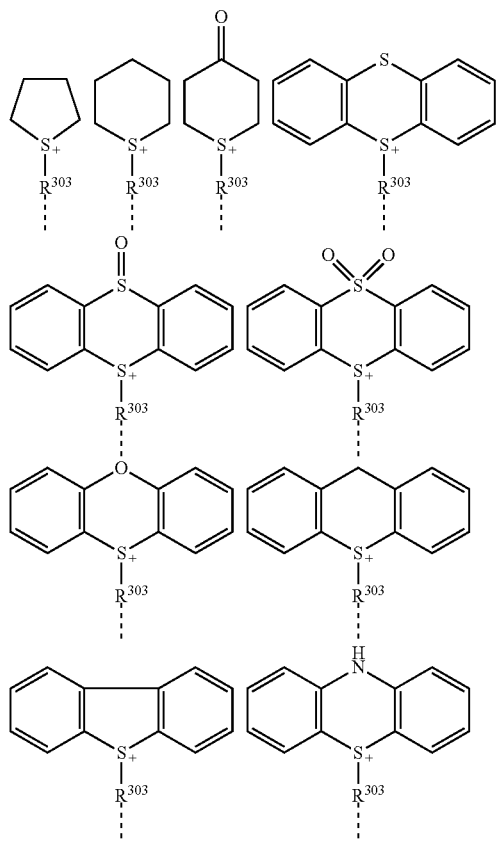

(a dotted line represents a bond)

In the general formula (P-0), $R^{303}$ represents a linear, branched, or cyclic divalent hydrocarbon group having 1 to 20 carbon atoms optionally substituted with a hetero atom or optionally containing a hetero atom. Specific examples of $R^{303}$ include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and unsaturated cyclic hydrocarbon groups such as a phenylene group and a naphthylene group. Additionally, some of hydrogen atoms of these groups may be substituted with an alkyl group such as a methyl group, an ethyl group, a propyl group, an n-butyl group, and a tert-butyl group. Alternatively, such hydrogen atoms may be substituted with a hetero atom such as an oxygen atom, a sulfur atom, a nitrogen atom, and a halogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed. Further, $R^{301}$ and $R^{303}$ may be bonded to each other to form a ring together with the sulfur atom in the formula; in this case, examples of the ring include groups shown by the following formulae.

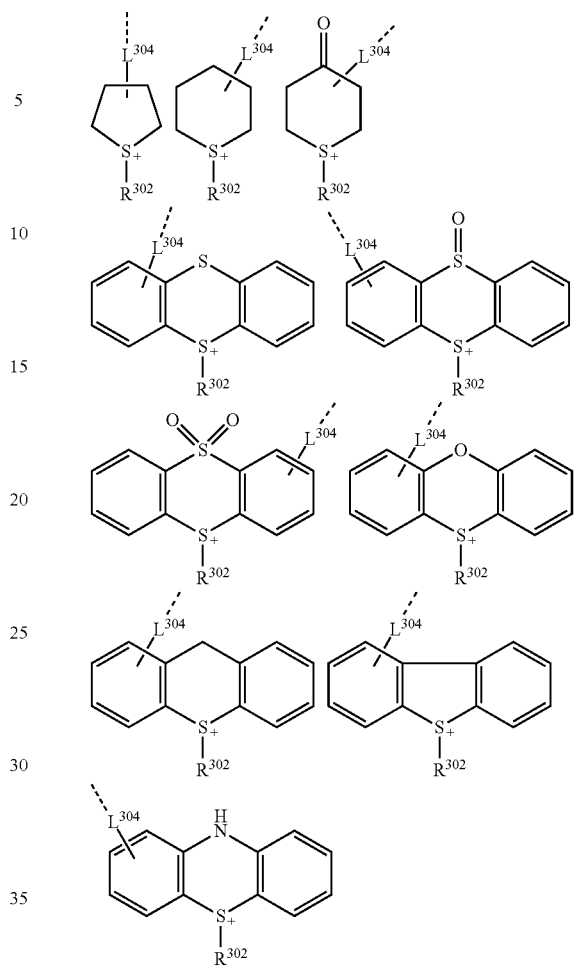

(a dotted line represents a bond)

In the general formula (P-0), $L^{304}$ represents a single bond or a linear, branched, or cyclic divalent hydrocarbon group having 1 to 20 carbon atoms optionally substituted with a hetero atom or optionally containing a hetero atom. Specific examples of $L^{304}$ include linear alkanediyl groups such as a methylene group, an ethylene group, a propane-1,3-diyl group, a butane-1,4-diyl group, a pentane-1,5-diyl group, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group, and a heptadecane-1,17-diyl group; saturated cyclic hydrocarbon groups such as a cyclopentanediyl group, a cyclohexanediyl group, a norbornanediyl group, and an adamantanediyl group; and unsaturated cyclic hydrocarbon groups such as a phenylene group and a naphthylene group. Additionally, some of hydrogen atoms of these groups may be substituted with an alkyl group such as a methyl group, an ethyl group, a propyl group, an n-butyl group, and a tert-butyl group. Alternatively, such hydrogen atoms may be substituted with a hetero atom such as an oxygen atom, a sulfur atom, a nitrogen atom, and a halogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed.

The compound (photo-acid generator) shown by the general formula (P-0) is preferably shown by the following general formula (P-1).

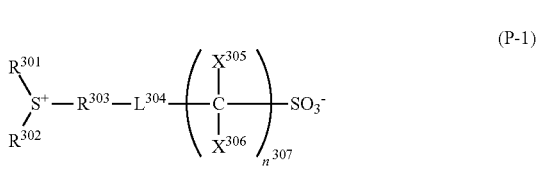

(P-1)

In the general formula (P-1), $X^{305}$ and $X^{306}$ each independently represent a hydrogen atom, a fluorine atom, or a trifluoromethyl group, but both are not hydrogen atoms simultaneously. n307 represents an integer of 1 to 4. $R^{301}$, $R^{302}$, $R^{303}$, and $L^{304}$ are as defined above.

The photo-acid generator shown by the general formula (P-0) is more preferably shown by the following general formula (P-1-1).

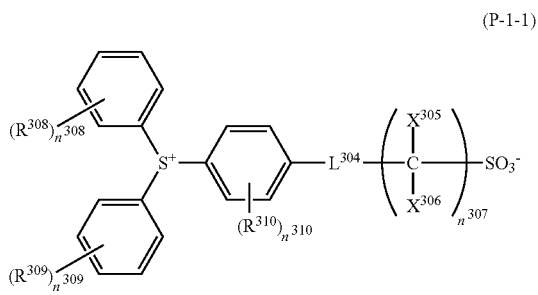

(P-1-1)

In the general formula (P-1-1), $R^{308}$, $R^{309}$, and $R^{310}$ each independently represent a hydrogen atom or a linear, branched, or cyclic monovalent hydrocarbon group having 1 to 20 carbon atoms optionally containing a hetero atom. Specific examples of the monovalent hydrocarbon group include a methyl group, an ethyl group, a propyl group, an isopropyl group, an n-butyl group, a sec-butyl group, a tert-butyl group, a tert-amyl group, an n-pentyl group, an n-hexyl group, an n-octyl group, an n-nonyl group, an n-decyl group, a cyclopentyl group, a cyclohexyl group, a 2-ethylhexyl group, a cyclopentylmethyl group, a cyclopentylethyl group, a cyclopentylbutyl group, a cyclohexylmethyl group, a cyclohexylethyl group, a cyclohexylbutyl group, a norbornyl group, an oxanorbornyl group, a tricyclo[5.2.1.0$^{2,6}$]decanyl group, an adamantyl group, and the like. Additionally, some of hydrogen atoms of these groups may be substituted with a hetero atom such as an oxygen atom, a sulfur atom, a nitrogen atom, and a halogen atom. The monovalent hydrocarbon group may contain a hetero atom such as an oxygen atom, a sulfur atom, or a nitrogen atom. As a result, a hydroxy group, a cyano group, a carbonyl group, an ether bond, an ester bond, a sulfonic acid ester bond, a carbonate bond, a lactone ring, a sultone ring, carboxylic anhydride, a haloalkyl group, or the like may be formed or contained. The monovalent hydrocarbon group is preferably a methyl group, a methoxy group, a tert-butyl group, or a tert-butoxy group.

In the general formula (P-1-1), $n^{308}$ and $n^{309}$ each represent an integer of 0 to 5, preferably 0 or 1. $n^{310}$ represents an integer of 0 to 4, preferably 0 or 2. $L^{304}$, $X^{305}$, $X^{306}$, and $n^{307}$ are as defined above.

The compound (photo-acid generator) shown by the general formula (P-0) is further preferably shown by the following general formula (P-1-2).

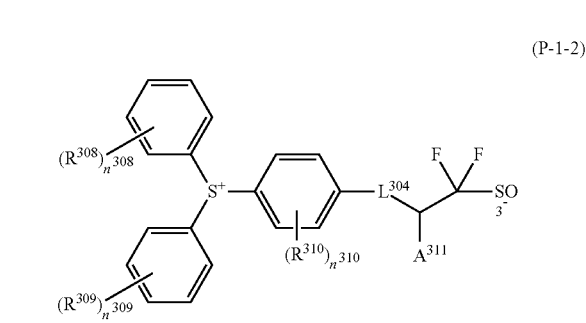

(P-1-2)

In the general formula (P-1-2), $A^{311}$ represents a hydrogen atom or a trifluoromethyl group. $R^{308}$, $R^{309}$, $R^{310}$, $n^{308}$, $n^{309}$, $n^{310}$, and $L^{304}$ are as defined above.

More specific examples of the photo-acid generators shown by the general formulae (P-0), (P-1), (P-1-1), and (P-1-2) include ones with structures shown below. Nevertheless, the photo-acid generator is not limited thereto.

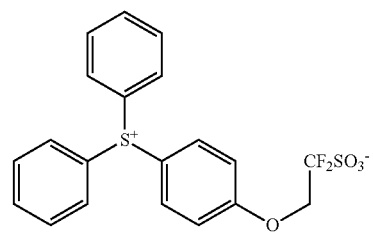

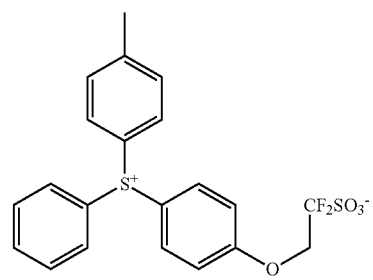

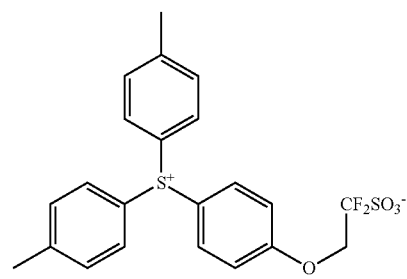

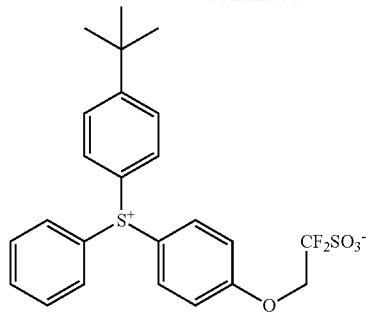
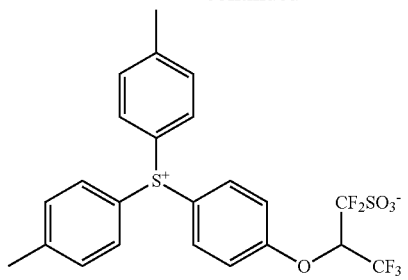
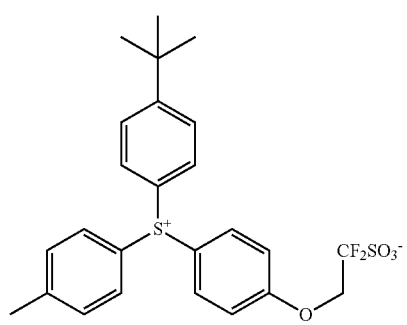
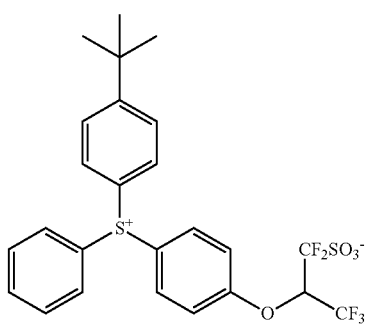
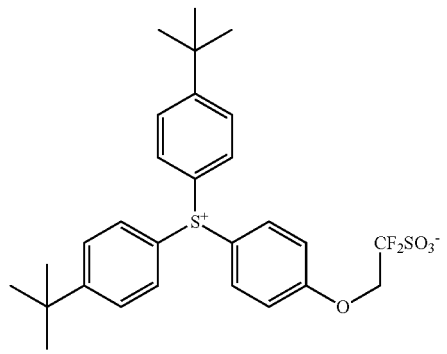
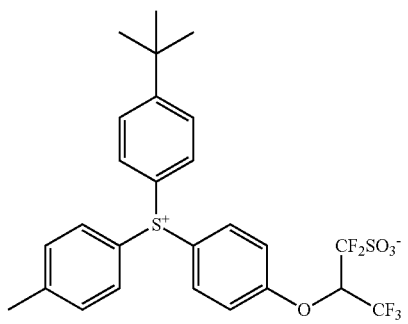
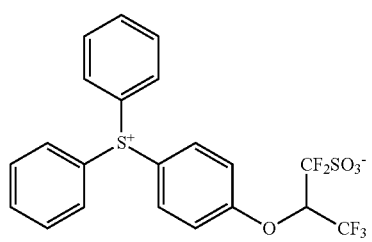
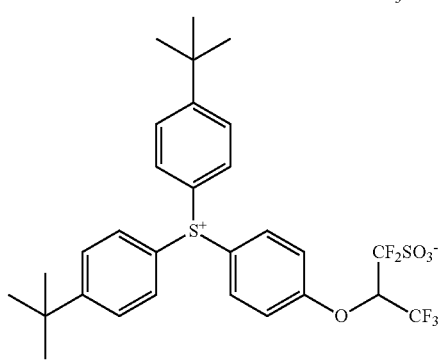
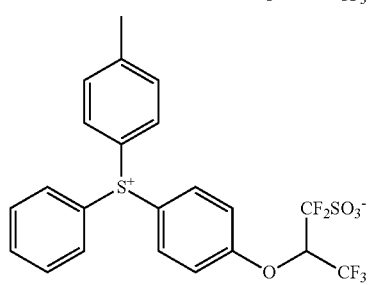
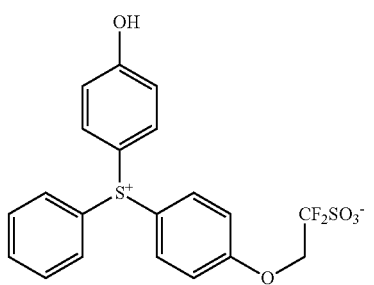

-continued
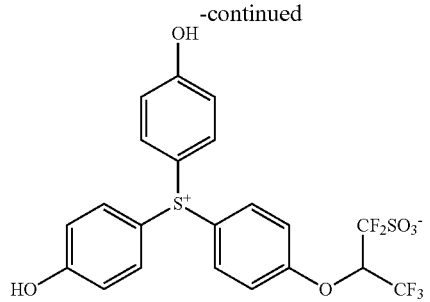
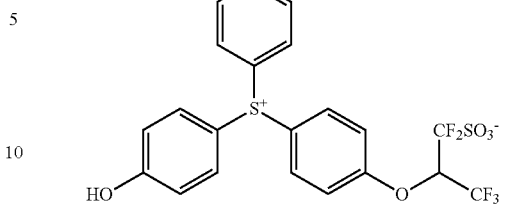
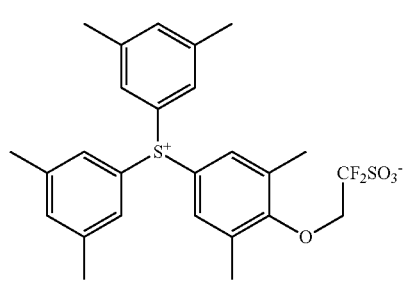
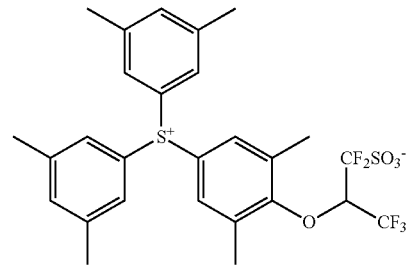
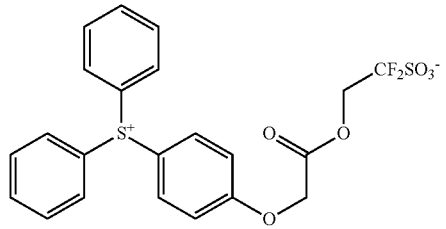
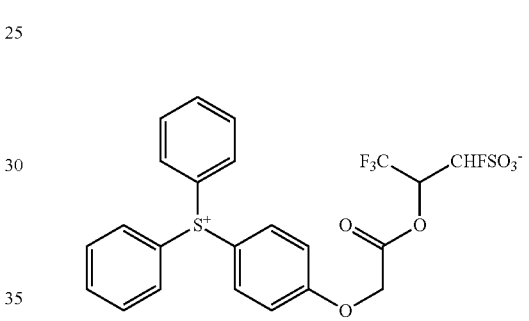
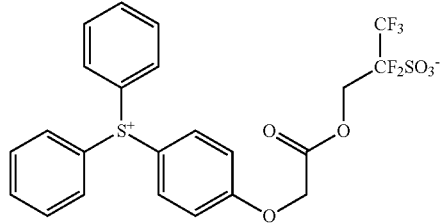
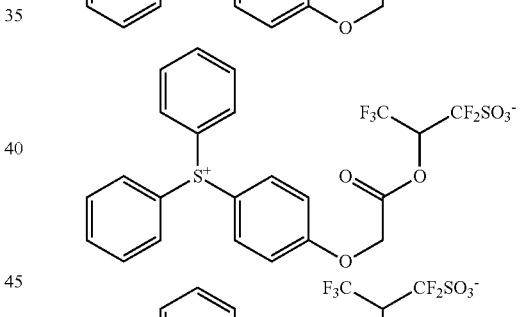
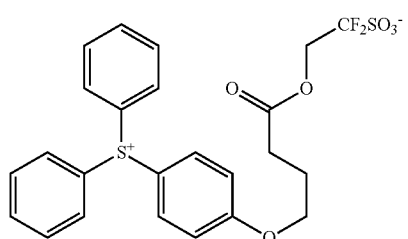
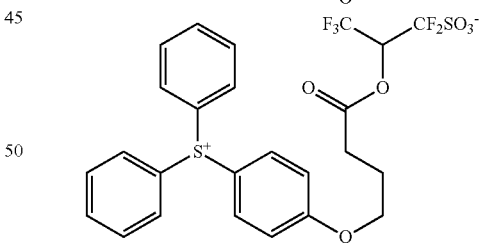
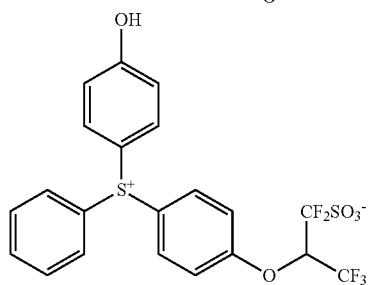
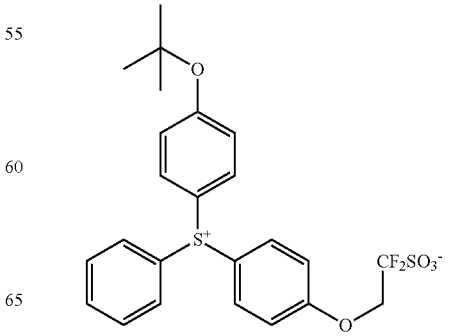

-continued
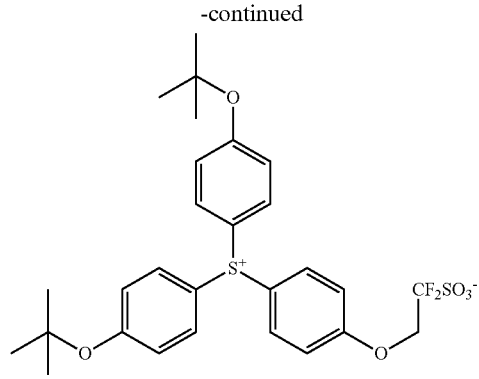
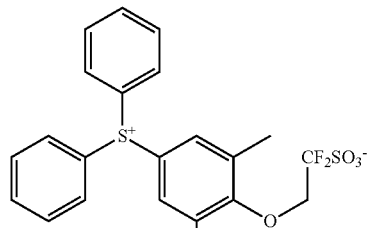
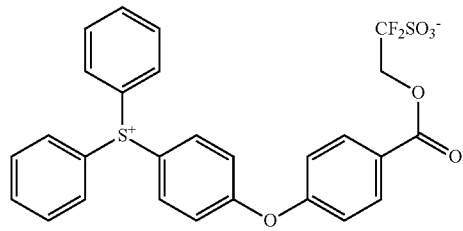
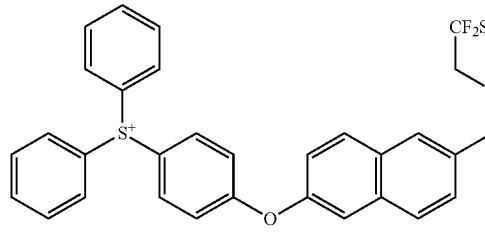
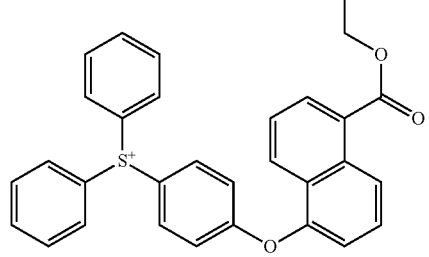
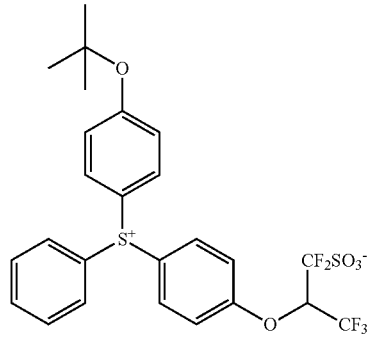
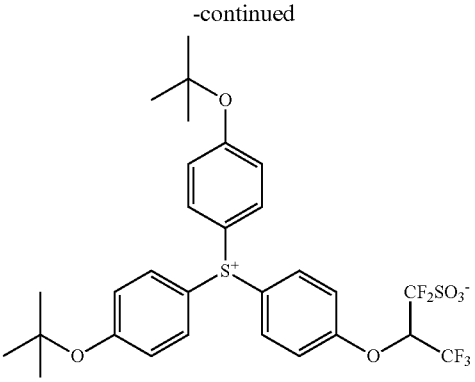
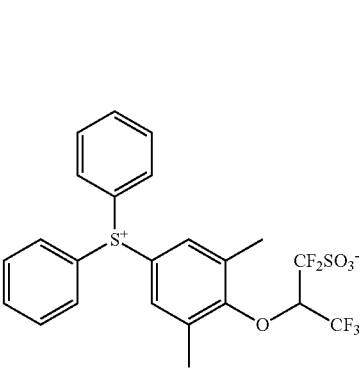
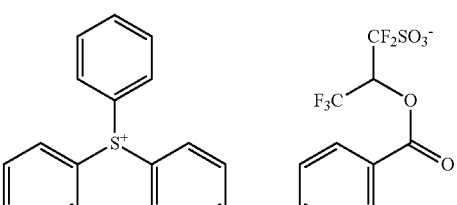
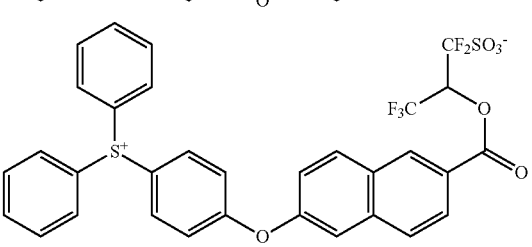
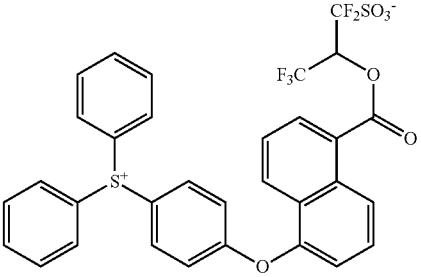
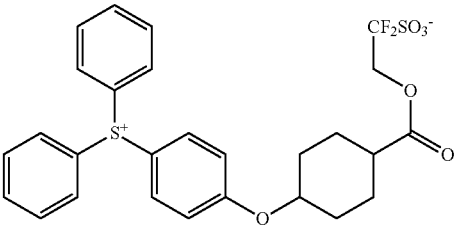

-continued
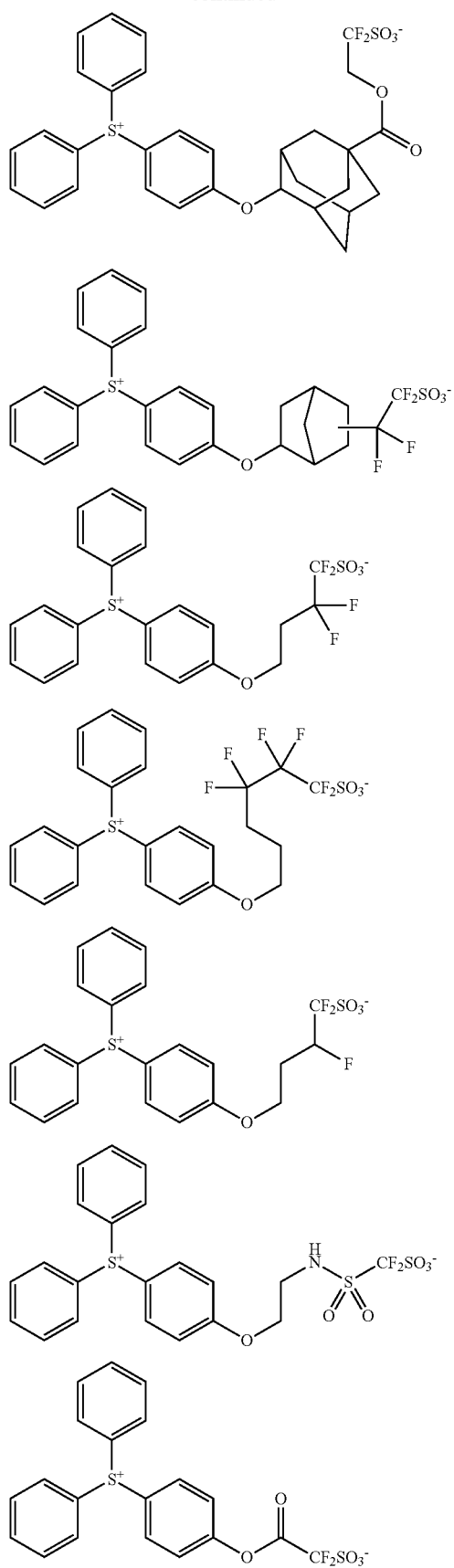
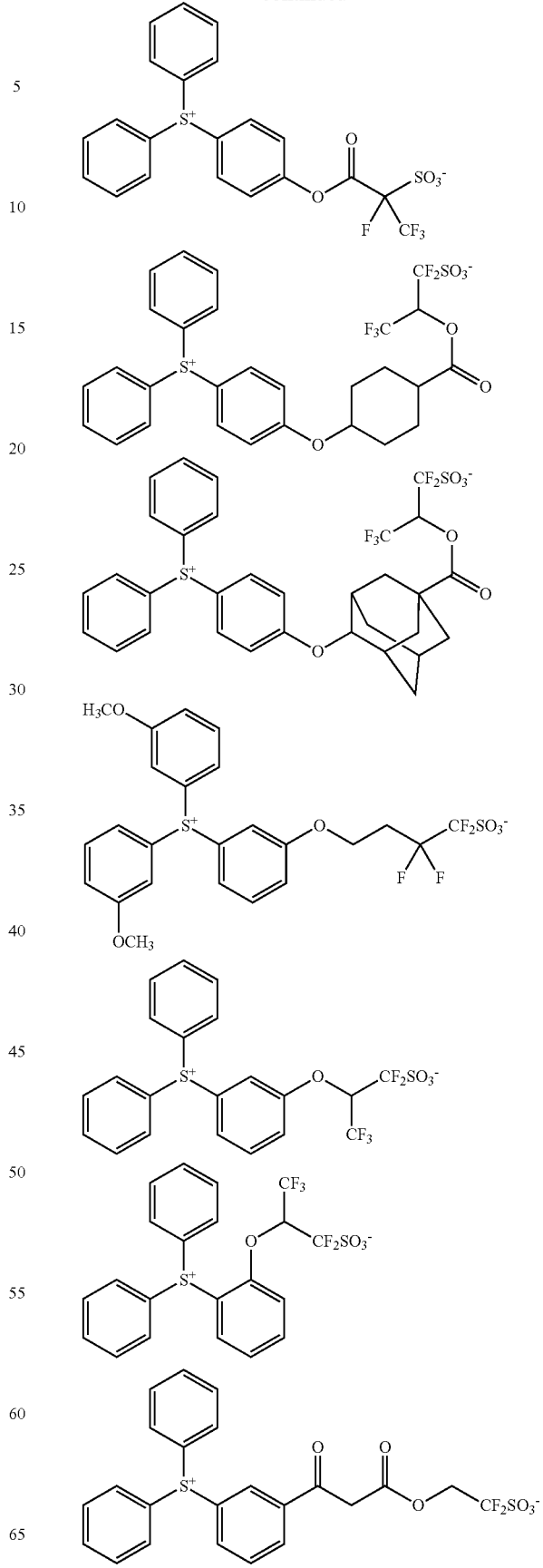

111
-continued
112
-continued
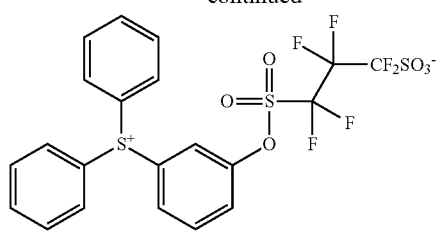
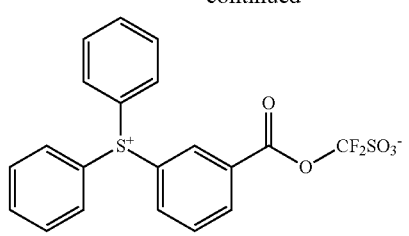
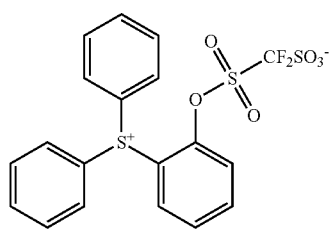
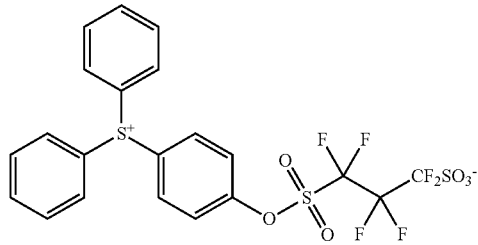
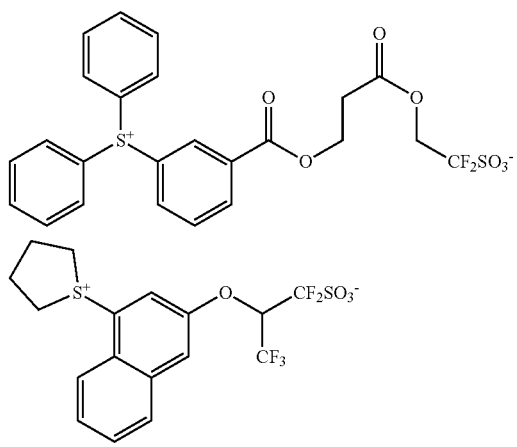
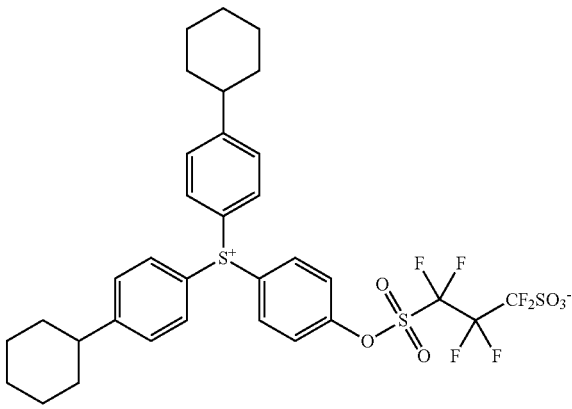
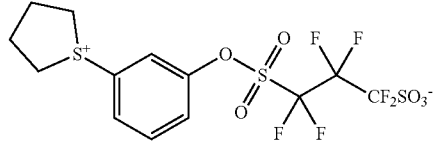
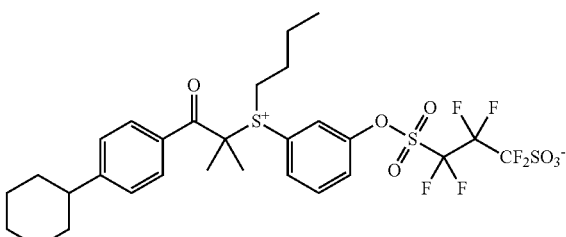
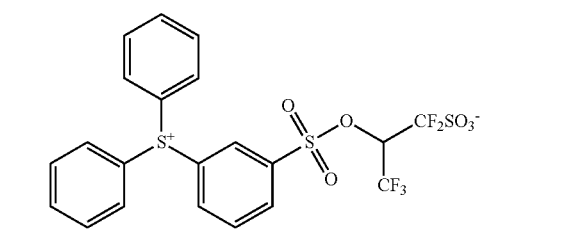
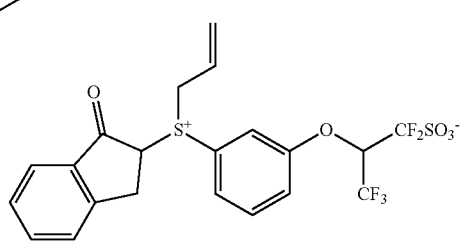
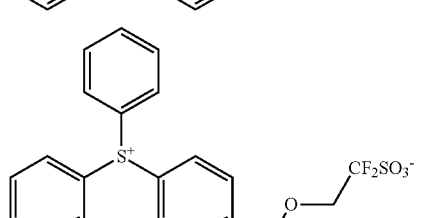
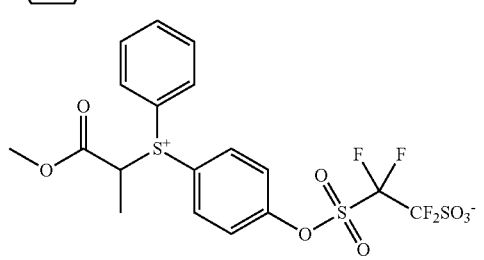

113
-continued
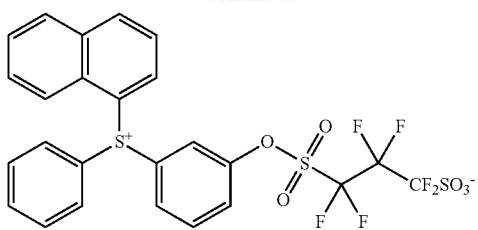
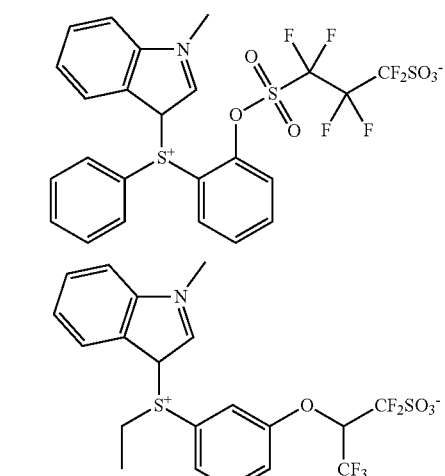
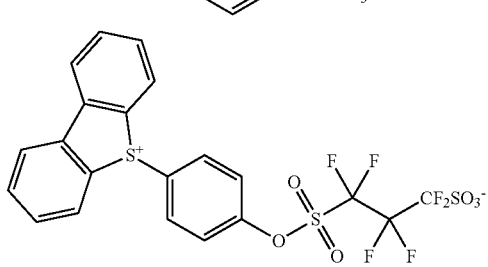
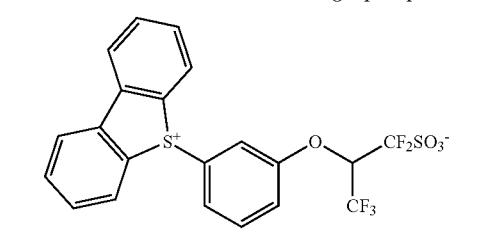
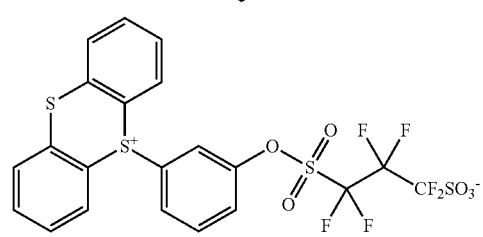
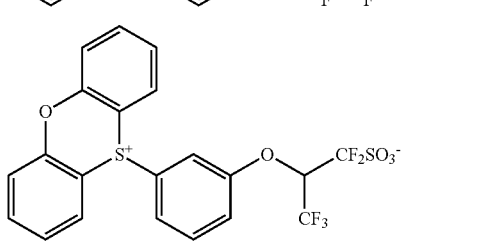
114
-continued
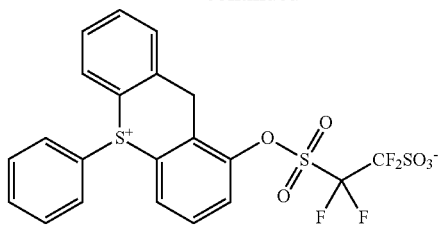
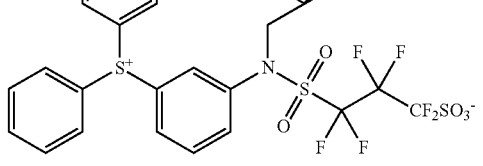

115
-continued
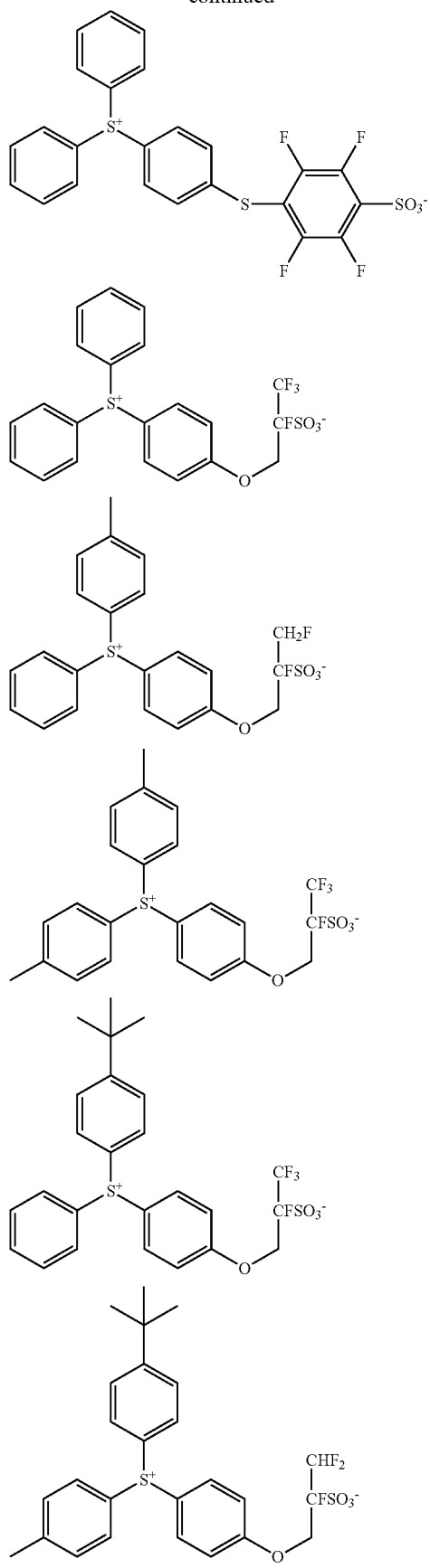
116
-continued
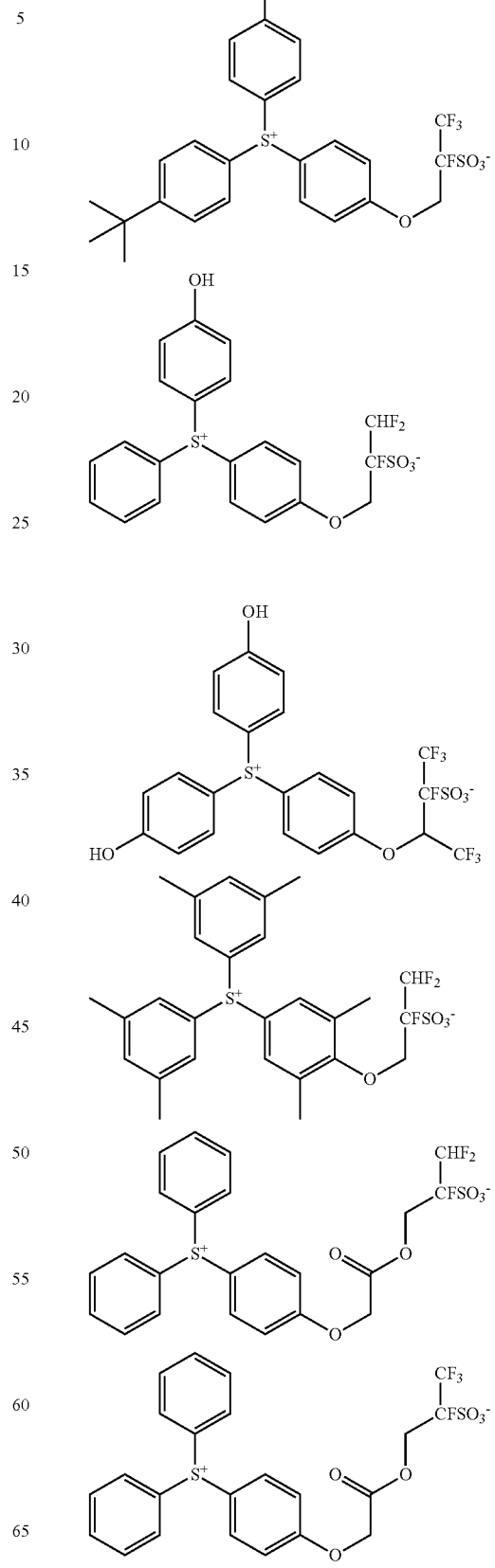

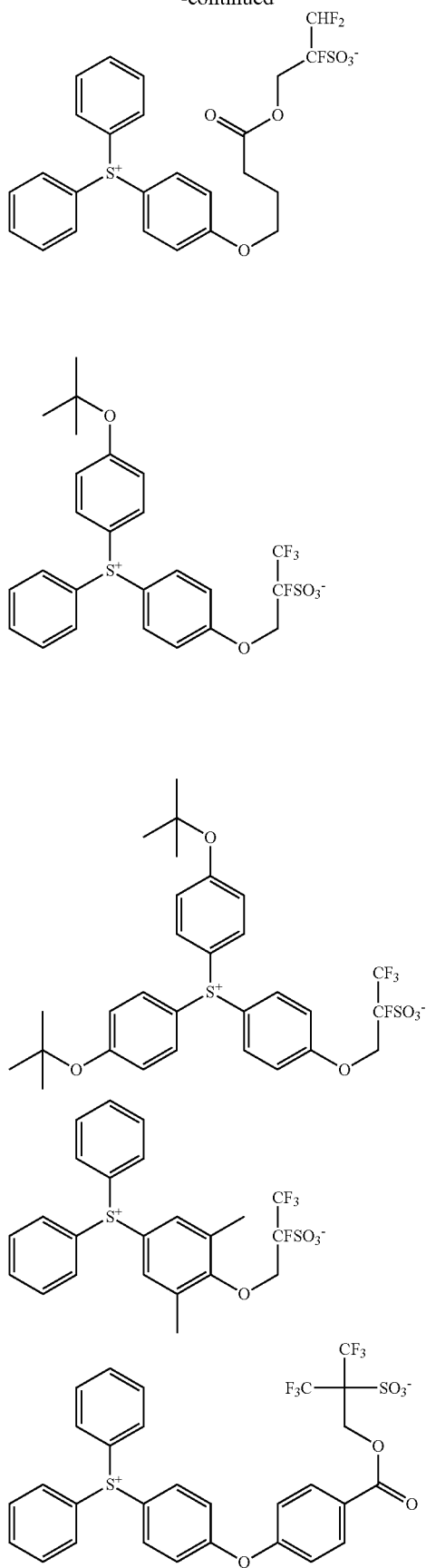

The compound shown by the general formula (P-0) can be added in an amount of 0.001 to 40 parts by mass, preferably 0.1 to 40 parts by mass, further preferably 0.1 to 20 parts by mass, based on 100 parts by mass of the thermally cross-linkable polysiloxane. By adding photo-acid generators as described above, the residue of an exposed part of an upper layer resist is reduced, so that a pattern with small LWR can be formed.

(Stabilizer)

Further, in the present invention, a stabilizer can be added to the composition. As the stabilizer, a monohydric, dihydric, or polyhydric alcohol having cyclic ether substituent can be added. Particularly, adding stabilizers shown in paragraphs (0181) to (0182) of Japanese Unexamined Patent Application Publication No. 2009-126940 enables stability improvement of the composition for forming a silicon-containing resist underlayer film.

(Surfactant)

Further, in the present invention, a surfactant can be blended into the composition as necessary. Specifically, the materials described in paragraph (0185) of Japanese Unexamined Patent Application Publication No. 2009-126940 can be added as the surfactant.

(Other Component)

Further, in the present invention, a high-boiling-point solvent having a boiling point of 180° C. or more can also be added to the composition as necessary. Examples of the high-boiling-point solvent include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, gamma-butyrolactone, tripropylene glycol monomethyl ether, diacetone alcohol, n-nonyl acetate, ethylene glycol monoethyl ether acetate, 1,2-diacetoxyethane, 1-acetoxy-2-methoxyethane, 1,2-diacetoxypropane, diethylene glycol monomethyl ether acetate, diethylene glycol monoethyl ether acetate, diethylene glycol mono-n-butyl ether acetate, propylene glycol monomethyl ether acetate, propylene glycol monopropyl ether acetate, propylene glycol monobutyl ether acetate, dipropylene glycol monomethyl ether acetate, dipropylene glycol monoethyl ether acetate, and the like.

[Patterning Process]

(Positive Patterning Process 1)

The present invention can further provide a patterning process including:

forming an organic underlayer film on a body to be processed by using a coating-type organic underlayer film material;

forming a silicon-containing resist underlayer film on the organic underlayer film by using the above-described inventive composition for forming a silicon-containing resist underlayer film;

forming a photoresist film on the silicon-containing resist underlayer film by using a chemically amplified resist composition;

after heat treatment, exposing the photoresist film to an EUV beam and dissolving an exposed part of the photoresist film by using an alkaline developer to form a positive pattern;

transferring the pattern to the silicon-containing resist underlayer film by dry etching using the photoresist film having the formed pattern as a mask;

transferring the pattern to the organic underlayer film by dry etching using the silicon-containing resist underlayer film having the transferred pattern as a mask; and further transferring the pattern to the body to be processed by dry etching using the organic underlayer film having the transferred pattern as a mask (what is called "multilayer resist method").

(Positive Patterning Process 2)

In addition, the present invention can provide a patterning process including:

forming an organic hard mask mainly containing carbon on a body to be processed by a CVD method;

forming a silicon-containing resist underlayer film on the organic hard mask by using the above-described inventive composition for forming a silicon-containing resist underlayer film;

forming a photoresist film on the silicon-containing resist underlayer film by using a chemically amplified resist composition;

after heat treatment, exposing the photoresist film to an EUV beam and dissolving an exposed part of the photoresist film by using an alkaline developer to form a positive pattern;

transferring the pattern to the silicon-containing resist underlayer film by dry etching using the photoresist film having the formed pattern as a mask;

transferring the pattern to the organic hard mask by dry etching using the silicon-containing resist underlayer film having the transferred pattern as a mask; and further transferring the pattern to the body to be processed by dry etching using the organic hard mask having the transferred pattern as a mask (what is called "multilayer resist method").

When a pattern is formed using the inventive composition for forming a silicon-containing resist underlayer film, the combination with the CVD film or the organic underlayer film is optimized as described above, so that the pattern formed in the photoresist can be formed onto the substrate without changing the size during the transfer.

In a positive patterning process, after photoresist film formation and heat treatment, exposure and alkaline development with alkaline developer are carried out to obtain a positive resist pattern. In addition, it is preferable to perform post exposure bake (PEB) after the exposure.

As the alkaline developer, tetramethylammonium hydroxide (TMAH) can be used, for example.

[Inventive Patterning Process according to Three-Layer Resist Method]

A positive patterning process of the present invention according to a 3-layer resist method is as follows (see FIG. 1). In this process, first, on a body 1 to be processed, an organic underlayer film 2 is formed by spin coating (FIG. 1 (I-A)). This organic underlayer film 2 acts as a mask when the body 1 to be processed is etched. Thus, the organic underlayer film 2 desirably has high etching resistance. Further, the organic underlayer film 2 is desirably crosslinked by heat or acid after formed by spin coating because the film 2 is supposed to not mix with a silicon-containing resist underlayer film to be formed thereon.

Then, such a silicon-containing resist underlayer film 3 is formed on the organic underlayer film 2 by spin coating using the inventive composition for forming a silicon-containing resist underlayer film (FIG. 1 (I-B)). Subsequently, a photoresist film 4 is formed thereon by spin coating (FIG. 1 (I-C)).

The photoresist film 4 is subjected to a usual pattern exposure using a light source corresponding to the photoresist film 4, for example, KrF excimer laser beam, ArF excimer laser beam, F2 laser beam, or EUV beam. A pattern can be formed preferably by any of a photolithography with a wavelength of 10 nm or more and 300 nm or less, direct drawing with electron beam, and nanoimprinting, or a combination thereof. Nevertheless, patterning with EUV beam is most preferable in the present invention (FIG. 1 (I-D): Note that, "P" means exposure light and "5" means a mask.). Thereafter, heat treatment is performed under a condition matching with the photoresist film (FIG. 1 (I-E)). After that, development with an alkaline developer and then, if necessary, rinsing are performed, so that a positive resist pattern 4a can be obtained (FIG. 1 (I-F)).

Next, using this resist pattern 4a as an etching mask, dry etching is performed, for example, with fluorine-based gas plasma under a dry etching condition where the etching speed of the silicon-containing resist underlayer film 3 is significantly high relative to the photoresist film. As a result, a positive-type silicon-containing resist underlayer film pattern 3a can be obtained with little influence from pattern change due to the side etching of the resist film (FIG. 1 (I-G)).

Next, the organic underlayer film 2 is dry-etched under a dry etching condition where the etching speed of the organic underlayer film 2 is significantly high relative to the substrate having the positive-type silicon-containing resist underlayer film pattern 3a obtained by transferring the positive resist pattern. The dry etching may be, for example, reactive dry etching with gas plasma containing oxygen, or reactive dry etching with gas plasma containing hydrogen and nitrogen. By this etching, a positive-type organic underlayer film pattern 2a is obtained, and the uppermost photoresist film is usually lost at the same time (FIG. 1 (I-H)). Then, using the positive-type organic underlayer film pattern 2a thus obtained as an etching mask, the body 1 to be processed is dry-etched, for example, by employing fluorine-based dry etching or chlorine-based dry etching. In this way, the body to be processed can be etched precisely, thereby transferring a positive pattern 1a to the body 1 to be processed (FIG. 1 (I-I)).

Note that, in the above-described process according to the 3-layer resist method, an organic hard mask formed by a CVD method is also applicable in place of the organic underlayer film 2. In this case also, the body 1 to be processed can be processed by the same procedure as described above.

EXAMPLE

Hereinafter, the present invention will be specifically described with reference to Synthesis Example, Examples, and Comparative Examples. However, the present invention is not limited to these descriptions. Note that, in the following examples, % means mass %, and the molecular weight measurement was carried out by GPC.

Synthesis Example 1

To a mixture containing 120 g of methanol, 0.1 g of 10% nitric acid, and 60 g of deionized water, a mixture containing 19.8 g of Monomer 100, 13.6 g of Monomer 101, 22.8 g of Monomer 102, and 48.6 g of Monomer 110 was added and maintained at 40° C. for 12 hours to perform hydrolysis condensation. After completion of the reaction, 400 g of propylene glycol monoethyl ether (PGEE) was added thereto. Then, the water used for the hydrolysis condensation and by-produced alcohol were distilled off under reduced pressure. Thus, 450 g of PGEE solution of Iodine-Containing Polysiloxane Compound 1 was obtained (compound concentration: 20%). The molecular weight thereof was measured in terms of polystyrene and found Mw=2,500.

[Synthesis Example 2] to [Synthesis Example 27] were carried out under the same conditions as in Synthesis Example 1 by using monomers shown in Table 1-1 and Table 1-2 to obtain the target products.

Synthesis Example 28

To a mixture containing 120 g of methanol, 0.1 g of 10% nitric acid, and 60 g of deionized water, a mixture containing 61.3 g of Monomer 101 and 12.9 g of Monomer 130 was added and maintained at 40° C. for 12 hours to perform hydrolysis condensation. After completion of the reaction, 300 g of propylene glycol monoethyl ether (PGEE) was added thereto. Then, the water used for the hydrolysis condensation and by-produced alcohol were distilled off under reduced pressure. Thus, 250 g of PGEE solution of Ammonium Salt-Containing Polysiloxane Compound 28 (Z-1) was obtained (compound concentration: 20%). The molecular weight thereof was measured in terms of polystyrene and found Mw=1,500.

TABLE 1-1

| Synthesis Example | Raw materials for reaction | Mw |
|---|---|---|
| 1 | Monomer 100: 19.8 g, Monomer 101: 13.6 g, Monomer 102: 22.8 g, Monomer 110: 48.6 g | 2500 |
| 2 | Monomer 100: 19.8 g, Monomer 101: 13.6 g, Monomer 102: 30.4 g, Monomer 111: 35.2 g | 2100 |
| 3 | Monomer 100: 19.8 g, Monomer 101: 13.6 g, Monomer 102: 38.1 g, Monomer 112: 23.9 g | 2700 |
| 4 | Monomer 100: 9.9 g, Monomer 101: 13.6 g, Monomer 102: 45.7 g, Monomer 113: 28.8 g | 2600 |
| 5 | Monomer 101: 6.8 g, Monomer 102: 45.7 g, Monomer 114: 50.7 g | 2500 |
| 6 | Monomer 101: 6.8 g, Monomer 102: 49.5 g, Monomer 115: 49.5 g | 2200 |
| 7 | Monomer 101: 6.8 g, Monomer 102: 49.5 g, Monomer 116: 53.9 g | 2600 |
| 8 | Monomer 101: 6.8 g, Monomer 102: 50.8 g, Monomer 117: 47.8 g | 2400 |
| 9 | Monomer 102: 50.8 g, Monomer 118: 61.6 g | 2500 |
| 10 | Monomer 101: 10.2 g, Monomer 103: 69.6 g, Monomer 110: 29.7 g | 2800 |
| 11 | Monomer 101: 6.8 g, Monomer 103: 69.6 g, Monomer 110: 29.7 g, Monomer 120: 5.9 g | 2700 |
| 12 | Monomer 101: 6.8 g, Monomer 103: 69.6 g, Monomer 110: 29.7 g, Monomer 121: 6.4 g | 2100 |
| 13 | Monomer 101: 6.8 g, Monomer 103: 73.1 g, Monomer 110: 24.3 g, Monomer 122: 7 g | 2100 |
| 14 | Monomer 101: 6.8 g, Monomer 103: 73.1 g, Monomer 111: 26.4 g, Monomer 123: 6.6 g | 2800 |
| 15 | Monomer 101: 6.8 g, Monomer 103: 73.1 g, Monomer 111: 26.4 g, Monomer 124: 7.3 g | 2100 |
| 16 | Monomer 101: 6.8 g, Monomer 102: 53.3 g, Monomer 111: 26.4 g, Monomer 125: 6.2 g | 2300 |
| 17 | Monomer 101: 6.8 g, Monomer 102: 53.3 g, Monomer 112: 35.9 g, Monomer 126: 5.1 g | 2700 |
| 18 | Monomer 101: 6.8 g, Monomer 102: 57.1 g, Monomer 112: 23.9 g, Monomer 127: 6.8 g | 2100 |
| 19 | Monomer 100: 5.0 g, Monomer 101: 3.4 g, Monomer 102: 57.1 g, Monomer 112: 23.9 g, Monomer 128: 8.9 g | 2400 |
| 20 | Monomer 102: 60.9 g, Monomer 112: 35.9 g, Monomer 129: 8.0 g | 2300 |

TABLE 1-2

| Synthesis Example | Raw materials for reaction | Mw |
|---|---|---|
| 21 | Monomer 101: 3.4 g, Monomer 102: 60.9 g, Monomer 116: 21.6 g, Monomer 129: 8.0 g | 2500 |
| 22 | Monomer 101: 3.4 g, Monomer 102: 60.9 g, Monomer 118: 18.5 g, Monomer 129: 8.0 g | 2300 |
| 23 | Monomer 100: 14.9 g, Monomer 101: 6.8 g, Monomer 102: 53.3 g, Monomer 122: 7.0 g | 2300 |
| 24 | Monomer 100: 14.9 g, Monomer 101: 6.8 g, Monomer 102: 53.3 g, Monomer 123: 6.6 g | 2300 |
| 25 | Monomer 100: 14.9 g, Monomer 101: 6.8 g, Monomer 102: 53.3 g, Monomer 124: 7.3 g | 2600 |
| 26 | Monomer 100: 14.9 g, Monomer 101: 6.8 g, Monomer 102: 53.3 g, Monomer 125: 6.2 g | 2700 |
| 27 | Monomer 100: 14.9 g, Monomer 101: 6.8 g, Monomer 102: 53.3 g, Monomer 126: 5.1 g | 2000 |
| 28 | Monomer 101: 61.3 g, Monomer 130: 12.9 g | 1500 |

Monomer 100: $PhSi(OCH_3)_3$

Monomer 101: $CH_3Si(OCH_3)_3$

Monomer 102: $Si(OCH_3)_4$

Monomer 103: $Si(OC_2H_5)_4$

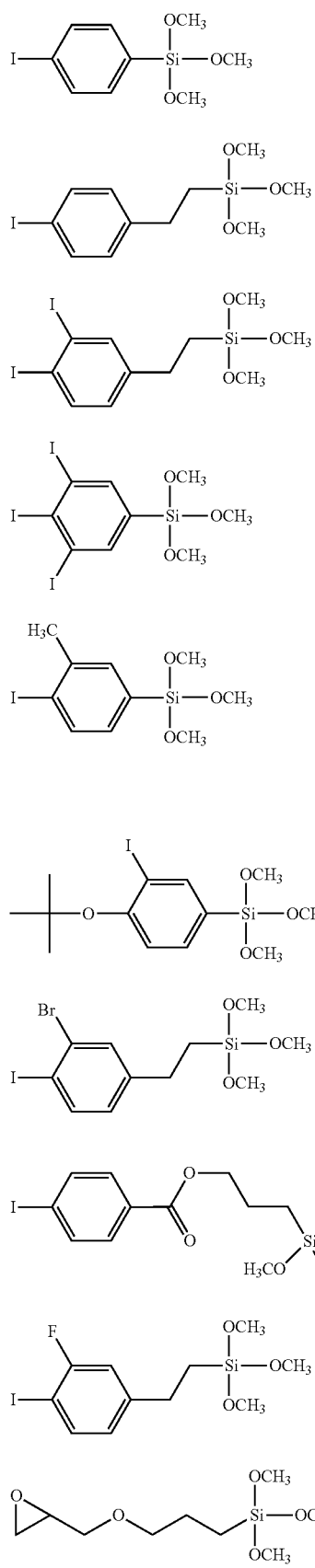
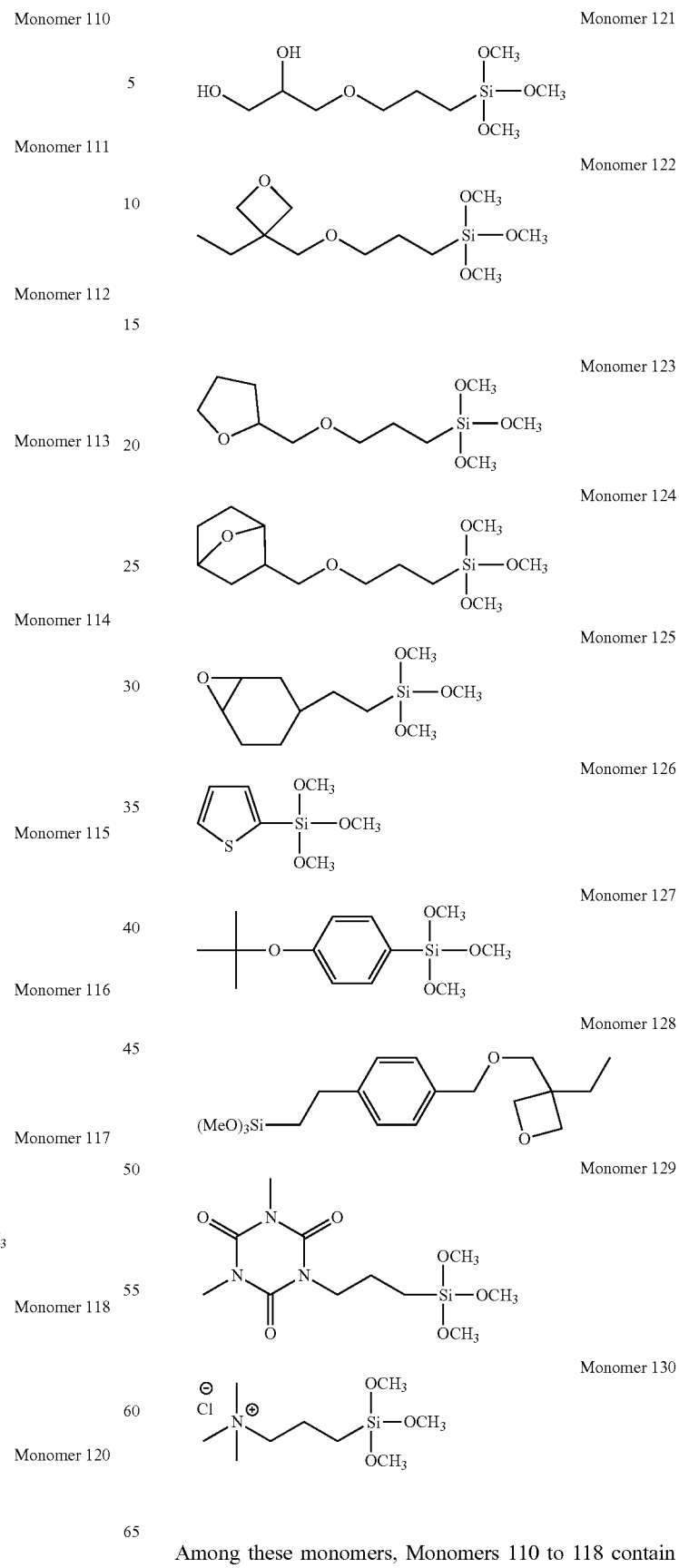
Among these monomers, Monomers 110 to 118 contain iodine. Monomers 120 to 130 do not contain iodine.

Examples, Comparative Examples

Polysiloxane Compounds 1 to 27 obtained in Synthesis Examples, crosslinking catalysts or Polysiloxane Compound 28 (Z-1), photo-acid generators, acid, solvents, and water were mixed at ratios shown in Table 2-1 and Table 2-2. Each mixture was filtered through a 0.1-μm filter made of fluorinated resin. Thus, composition solutions for forming a polysiloxane underlayer film were prepared and referred to as Sol. 1 to Sol. 38 hereinbelow.

(Compositions for Forming Polysiloxane Underlayer Film)

TABLE 2-1

| No. | Polysiloxane (parts by mass) | Crosslinking catalyst (parts by mass) | Photo-acid generator (parts by mass) | Acid (parts by mass) | Solvent (parts by mass) | Water (parts by mass) |
| --- | --- | --- | --- | --- | --- | --- |
| Sol. 1 | Compound 1 (1) | TPSNO$_3$ (0.01) | none | maleic acid (0.01) | PGEE (100) | water (10) |
| Sol. 2 | Compound 2 (1) | TPSNO$_3$ (0.01) | none | maleic acid (0.01) | PGEE (100) | water (10) |
| Sol. 3 | Compound 3 (1) | TPSNO$_3$ (0.01) | none | maleic acid (0.01) | PGEE (100) | water (10) |
| Sol. 4 | Compound 4 (1) | TPSNO$_3$ (0.01) | none | maleic acid (0.01) | PGEE (100) | water (10) |
| Sol. 5 | Compound 5 (1) | TPSNO$_3$ (0.01) | none | maleic acid (0.01) | PGEE (100) | water (10) |
| Sol. 6 | Compound 6 (1) | TPSNO$_3$ (0.01) | TPSNf (0.01) | maleic acid (0.01) | PGEE (100) | water (10) |
| Sol. 7 | Compound 7 (1) | TPSNO$_3$ (0.01) | none | maleic acid (0.01) | PGEE (100) | water (10) |
| Sol. 8 | Compound 8 (1) | TPSNO$_3$ (0.01) | none | maleic acid (0.01) | PGEE (100) | water (10) |
| Sol. 9 | Compound 9 (1) | TPSNO$_3$ (0.01) | none | maleic acid (0.01) | PGEE (100) | water (10) |
| Sol. 10 | Compound 10 (1) | TPSNO$_3$ (0.01) | none | maleic acid (0.01) | PGEE (100) | water (10) |
| Sol. 11 | Compound 10 (1) | TPSMA (0.01) | none | maleic acid (0.01) | PGEE (100) | water (10) |
| Sol. 12 | Compound 10 (1) | QMAMA (0.01) | none | maleic acid (0.01) | PGEE (100) | water (10) |
| Sol. 13 | Compound 10 (1) | QMATFA (0.01) | none | maleic acid (0.01) | PGEE (100) | water (10) |
| Sol. 14 | Compound 10 (1) | QBANO$_3$ (0.01) | none | maleic acid (0.01) | PGEE (100) | water (10) |
| Sol. 15 | Compound 10 (1) | Ph$_2$ICl (0.01) | none | maleic acid (0.01) | PGEE (100) | water (10) |
| Sol. 16 | Compound 10 (1) | Z-1 (0.5) | none | maleic acid (0.01) | PGEE (100) | water (10) |
| Sol. 17 | Compound 10 (1) | TPSNO$_3$ (0.01) | TPSNf (0.01) | maleic acid (0.01) | PGEE (100) | water (10) |
| Sol. 18 | Compound 10 (1) | QBANO$_3$ (0.01) | TPSNf (0.01) | maleic acid (0.01) | PGEE (100) | water (10) |
| Sol. 19 | Compound 10 (1) | TPSNO$_3$ (0.01) | TPSNf (0.01) | maleic acid (0.01) | PGEE (90) GBL (10) | water (10) |

TABLE 2-1-continued

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol. 20 | Compound 10 (1) | QBANO$_3$ (0.01) | TPSNf (0.01) | maleic acid (0.01) | PGEE (90) GBL (10) | water (10) |
| Sol. 21 | Compound 10 (1) | QBANO$_3$ (0.01) | none | maleic acid (0.01) | PGEE (90) DAA (10) | water (10) |

TABLE 2-2

| No. | Polysiloxane (parts by mass) | Crosslinking catalyst (parts by mass) | Photo-acid generator (parts by mass) | Acid (parts by mass) | Solvent (parts by mass) | Water (parts by mass) |
|---|---|---|---|---|---|---|
| Sol. 22 | Compound 11 (1) | QBANO$_3$ (0.01) | none | maleic acid (0.01) | PGEE (100) | water (10) |
| Sol. 23 | Compound 12 (1) | QBANO$_3$ (0.01) | none | maleic acid (0.01) | PGEE (100) | water (10) |
| Sol. 24 | Compound 13 (1) | TMPANO$_3$ (0.01) | none | maleic acid (0.01) | PGEE (100) | water (10) |
| Sol. 25 | Compound 14 (1) | TMPANO$_3$ (0.01) | none | maleic acid (0.01) | PGEE (100) | water (10) |
| Sol. 26 | Compound 15 (1) | TMPANO$_3$ (0.01) | none | maleic acid (0.01) | PGEE (100) | water (10) |
| Sol. 27 | Compound 16 (1) | TMPANO$_3$ (0.01) | PAG-1 (0.01) | maleic acid (0.01) | PGEE (100) | water (10) |
| Sol. 28 | Compound 17 (1) | QBANO$_3$ (0.01) | TPSNf (0.01) | maleic acid (0.01) | PGEE (100) | water (10) |
| Sol. 29 | Compound 18 (1) | QBANO$_3$ (0.01) | PAG-1 (0.01) | maleic acid (0.01) | PGEE (100) | water (10) |
| Sol. 30 | Compound 19 (1) | QBANO$_3$ (0.01) | none | maleic acid (0.01) | PGEE (100) | water (10) |
| Sol. 31 | Compound 20 (1) | QBANO$_3$ (0.01) | none | maleic acid (0.01) | PGEE (100) | water (10) |
| Sol. 32 | Compound 21 (1) | QBANO$_3$ (0.01) | none | maleic acid (0.01) | PGEE (100) | water (10) |
| Sol. 33 | Compound 22 (1) | QBANO$_3$ (0.01) | none | maleic acid (0.01) | PGEE (100) | water (10) |
| Sol. 34 | Compound 23 (1) | QBANO$_3$ (0.01) | none | maleic acid (0.01) | PGEE (100) | water (10) |
| Sol. 35 | Compound 24 (1) | QBANO$_3$ (0.01) | none | maleic acid (0.01) | PGEE (100) | water (10) |
| Sol. 36 | Compound 25 (1) | QBANO$_3$ (0.01) | none | maleic acid (0.01) | PGEE (100) | water (10) |
| Sol. 37 | Compound 26 (1) | QBANO$_3$ (0.01) | none | maleic acid (0.01) | PGEE (100) | water (10) |
| Sol. 38 | Compound 27 (1) | QBANO$_3$ (0.01) | none | maleic acid (0.01) | PGEE (100) | water (10) |

TPSNO$_3$: triphenylsulfonium nitrate
TPSMA: mono(triphenylsulfonium)maleate
QMAMA: mono(tetramethylammonium)maleate
QMATFA: tetramethylammonium trifluoroacetate
QBANO$_3$: tetrabutylammonium nitrate
Ph$_2$ICl: diphenyliodonium chloride
TMPANO$_3$: trimethylphenylammonium nitrate
Z-1: PGEE solution containing 20% Polysiloxane Compound 28
TPSNf: triphenylsulfonium nonafluorobutane sulfonate
PAG-1: see the following formula

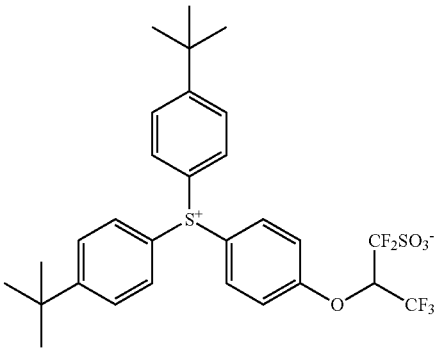

PGEE: propylene glycol monoethyl ether
GBL: gamma-butyrolactone
DAA: diacetone alcohol Patterning Test A Si substrate was obtained by forming an organic underlayer film on a silicon wafer by using a coating-type organic underlayer film material. Next, the Si substrate was spin-coated with one of the composition Sols. 1 to 38 for forming a silicon-containing resist underlayer film, and heated at 220° C. for 60 seconds. Thus, silicon-containing resist underlayer films as Films 1 to 38 were prepared each of which had a film thickness of 20 nm. Separately from these, a Si substrate as described above was spin-coated with a silicon-containing spin-on hard mask SHB-A940 manufactured by Shin-Etsu Chemical CO., Ltd., and heated at 220° C. for 60 seconds. Thus, a silicon-containing film as Film 39 was prepared which had a film thickness of 20 nm.

Subsequently, Films 1 to 39 were each spin-coated with a resist material in which the following components were dissolved at ratios in Table 3, and prebaked at 105° C. for 60 seconds using a hot plate to prepare a resist film having a film thickness of 60 nm. The resultant was exposed using an EUV scanner NXE3300 (manufactured by ASML, NA: 0.33, σ: 0.9/0.6, quadrupole illumination, with a mask having a hole pattern with a pitch of 46 nm and +20% bias (on-wafer size)), followed by PEB at 100° C. for 60 seconds on the hot plate and development with a 2.38 mass % TMAH aqueous solution for 30 seconds. Thus, a hole pattern with a dimension of 23 nm was obtained.

Using a CD-SEM (CG5000) manufactured by Hitachi High-Technologies Corporation, an exposure dose at which a hole dimension of 23 nm was formed was determined as sensitivity. Moreover, in this event, the dimensions of 50 holes were measured, from which the dimensional variation (CDU, 3σ) was computed. Table 4 shows the result.

Polymer:

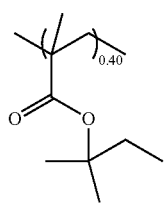
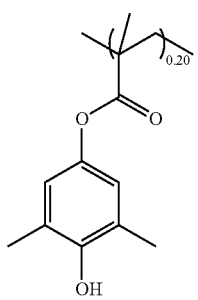
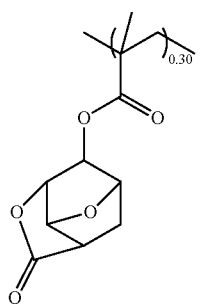
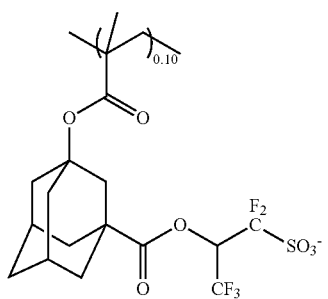

Mw = 8,900
Mw/Mn = 1.89

Quencher:

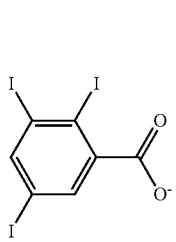
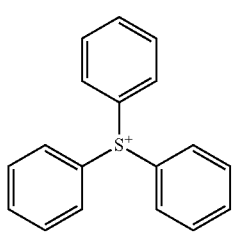

Sensitizer:

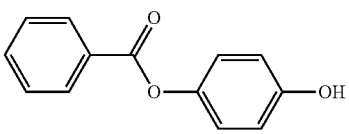

Surfactant: FC-4430 Manufactured by 3M

TABLE 3

| Components | Polymer | Quencher | Sensitizer | Surfactant | Organic solvent |
|---|---|---|---|---|---|
| Composition (parts by mass) | (100) | (4.0) | (2.1) | (0.25) | PGMEA (400) CyHO (2000) PGME (100) |

Organic solvent: PGMEA (propylene glycol monomethyl ether acetate) CyHO (cyclohexanone) PGME (propylene glycol monomethyl ether)

TABLE 4

| Examples | Polysiloxane resist underlayer film | Sensitivity (mJ/cm$^2$) | CDU (nm) |
|---|---|---|---|
| Example 1 | Film 1 | 22 | 3.1 |
| Example 2 | Film 2 | 24 | 3.0 |
| Example 3 | Film 3 | 22 | 3.1 |
| Example 4 | Film 4 | 23 | 3.0 |
| Example 5 | Film 5 | 23 | 3.2 |
| Example 6 | Film 6 | 23 | 3.0 |
| Example 7 | Film 7 | 23 | 3.0 |
| Example 8 | Film 8 | 23 | 3.0 |
| Example 9 | Film 9 | 23 | 2.9 |
| Example 10 | Film 10 | 23 | 3.1 |
| Example 11 | Film 11 | 24 | 3.2 |
| Example 12 | Film 12 | 22 | 3.2 |
| Example 13 | Film 13 | 23 | 3.0 |
| Example 14 | Film 14 | 23 | 3.1 |
| Example 15 | Film 15 | 22 | 3.0 |
| Example 16 | Film 16 | 24 | 3.0 |
| Example 17 | Film 17 | 24 | 2.8 |
| Example 18 | Film 18 | 22 | 2.9 |
| Example 19 | Film 19 | 24 | 2.8 |
| Example 20 | Film 20 | 24 | 3.0 |
| Example 21 | Film 21 | 22 | 3.2 |
| Example 22 | Film 22 | 22 | 3.0 |
| Example 23 | Film 23 | 23 | 2.9 |
| Example 24 | Film 24 | 22 | 2.9 |
| Example 25 | Film 25 | 23 | 2.8 |
| Example 26 | Film 26 | 22 | 2.9 |
| Example 27 | Film 27 | 22 | 3.0 |
| Example 28 | Film 28 | 22 | 2.8 |
| Example 29 | Film 29 | 22 | 2.9 |
| Example 30 | Film 30 | 24 | 2.9 |
| Example 31 | Film 31 | 23 | 3.0 |
| Example 32 | Film 32 | 24 | 3.0 |
| Example 33 | Film 33 | 22 | 3.1 |
| Comparative Example 1 | Film 34 | 28 | 3.3 |
| Comparative Example 2 | Film 35 | 29 | 3.1 |
| Comparative Example 3 | Film 36 | 27 | 3.1 |
| Comparative Example 4 | Film 37 | 27 | 3.2 |
| Comparative Example 5 | Film 38 | 28 | 3.0 |
| Comparative Example 6 | Film 39 | 28 | 3.2 |

The result shown in Table 4 revealed that patterns were successfully formed with high sensitivity without CDU degradation by using the resist underlayer films each prepared from a polysiloxane film which contained an iodine-substituted aromatic ring, and which was formed using a composition for forming a silicon-containing resist underlayer film, the composition containing the inventive thermosetting silicon-containing material (Examples 1 to 33). This suggests that the resist underlayer films are capable of contributing to sensitivity enhancement of an upper layer resist while keeping LWR thereof from degrading.

Meanwhile, although the CDU was comparable to that in Examples, the sensitivity result was inferior in the cases of the resist underlayer films each formed using a composition for forming a resist underlayer film, the composition containing a thermosetting silicon-containing material not containing iodine (Comparative Examples 1 to 6).

As has been described above, the present invention overcomes the trade-off relationship between sensitivity and LWR, and makes it possible to form a resist underlayer film which are capable of contributing to sensitivity enhancement of an upper layer resist while keeping LWR thereof from degrading. Therefore, the present invention is highly valuable in the field of EUV lithography.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A composition for forming a silicon-containing resist underlayer film for EUV lithography, comprising:
    a thermosetting silicon-containing material; and
    a crosslinking catalyst, wherein
    the thermosetting silicon-containing material comprises:
    (i) one or more of
    a repeating unit shown by the following general formula (Sx-1),
    a repeating unit shown by the following general formula (Sx-2), and
    a partial structure shown by the following general formula (Sx-3),

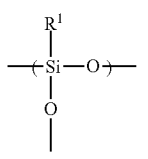

(Sx-1)

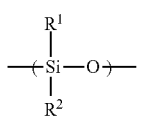

(Sx-2)

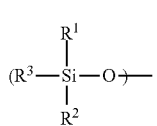

(Sx-3)

wherein R1 represents an iodine-containing organic group shown by the following general formula (Sx-R1):

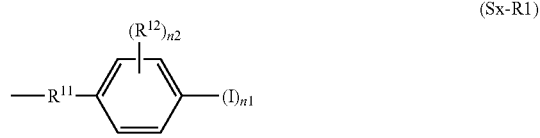

(Sx-R1)

wherein $R^{11}$ represents a single bond; $R^{12}$ represents a monovalent organic group having 1 to 10 carbon atoms, a hydroxyl group, or a halogen atom other than iodine; n1 is 1, 2, or 3; and n2 is 0, 1, or 2; and $R^2$ and $R^3$ are each independently identical to $R^1$, a hydrogen atom, or a monovalent organic group having 1 to 30 carbon atoms, and
    (ii) one or more of partial structures shown by the following formulae (Sx-x),

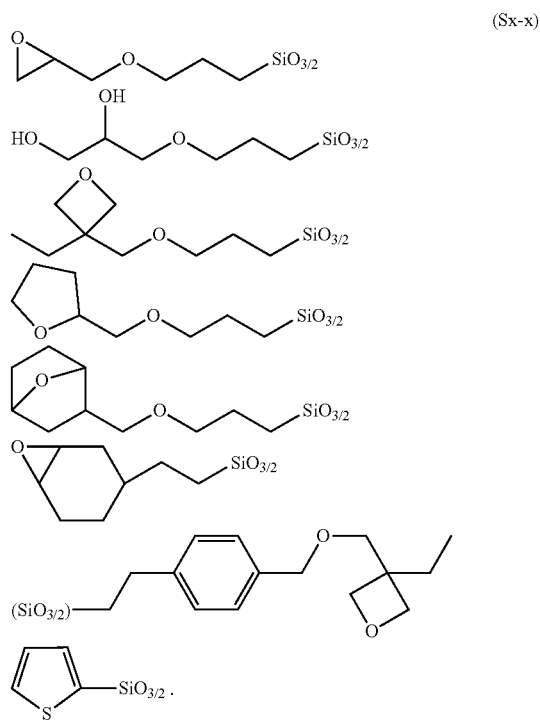

(Sx-x)

2. The composition for forming a silicon-containing resist underlayer film for EUV lithography according to claim 1, wherein the crosslinking catalyst is a sulfonium salt, an iodonium salt, a phosphonium salt, an ammonium salt, a polysiloxane having a structure containing one of these salts as a part, or an alkaline metal salt.

3. The composition for forming a silicon-containing resist underlayer film for EUV lithography according to claim 1, further comprising at least one compound shown by the following general formula (P-0):

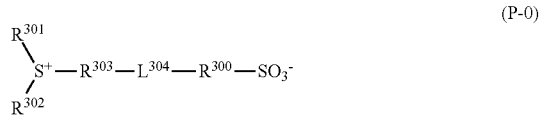

(P-0)

wherein $R^{300}$ represents a divalent organic group substituted with one or more fluorine atoms; $R^{301}$ and $R^{302}$ each independently represent a linear, branched, or cyclic monovalent hydrocarbon group having 1 to 20 carbon atoms optionally substituted with a hetero atom or optionally containing a hetero atom; $R^{303}$ represents a linear, branched, or cyclic divalent hydrocarbon group having 1 to 20 carbon atoms optionally substituted with a hetero atom or optionally containing a hetero atom; $R^{301}$ and $R^{302}$, or $R^{301}$ and $R^{303}$, are optionally bonded to each other to form a ring with a sulfur atom in the formula; and $L^{304}$ represents a single bond or a linear, branched, or cyclic divalent hydrocarbon group having 1 to 20 carbon atoms optionally substituted with a hetero atom or optionally containing a hetero atom.

4. The composition for forming a silicon-containing resist underlayer film for EUV lithography according to claim 2, further comprising at least one compound shown by the following general formula (P-0):

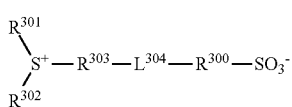

(P-0)

wherein $R^{300}$ represents a divalent organic group substituted with one or more fluorine atoms; $R^{301}$ and $R^{302}$ each independently represent a linear, branched, or cyclic monovalent hydrocarbon group having 1 to 20 carbon atoms optionally substituted with a hetero atom or optionally containing a hetero atom; $R^{303}$ represents a linear, branched, or cyclic divalent hydrocarbon group having 1 to 20 carbon atoms optionally substituted with a hetero atom or optionally containing a hetero atom; $R^{301}$ and $R^{302}$, or $R^{301}$ and $R^{303}$, are optionally bonded to each other to form a ring with a sulfur atom in the formula; and $L^{304}$ represents a single bond or a linear, branched, or cyclic divalent hydrocarbon group having 1 to 20 carbon atoms optionally substituted with a hetero atom or optionally containing a hetero atom.

5. The composition for forming a silicon-containing resist underlayer film for EUV lithography according to claim 3, wherein the compound shown by the general formula (P-0) is a compound shown by the following general formula (P-1):

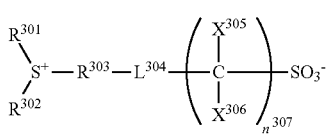

(P-1)

wherein $X^{305}$ and $X^{306}$ each independently represent a hydrogen atom, a fluorine atom, or a trifluoromethyl group, but both are not hydrogen atoms simultaneously; $n^{307}$ represents an integer of 1 to 4; and $R^{301}$, $R^{302}$, $R^{303}$, and $L^{304}$ are as defined above.

6. The composition for forming a silicon-containing resist underlayer film for EUV lithography according to claim 4, wherein the compound shown by the general formula (P-0) is a compound shown by the following general formula (P-1):

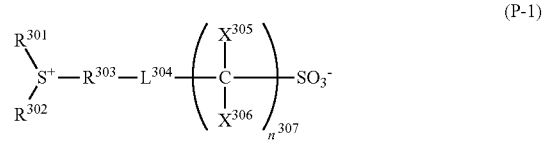

(P-1)

wherein $X^{305}$ and $X^{306}$ each independently represent a hydrogen atom, a fluorine atom, or a trifluoromethyl group, but both are not hydrogen atoms simultaneously; $n^{307}$ represents an integer of 1 to 4; and $R^{301}$, $R^{302}$, $R^{303}$, and $L^{304}$ are as defined above.

7. A patterning process comprising:
forming an organic underlayer film on a body to be processed by using a coating-type organic underlayer film material;
forming a silicon-containing resist underlayer film on the organic underlayer film by using the composition for forming a silicon-containing resist underlayer film according to claim 1;
forming a photoresist film on the silicon-containing resist underlayer film by using a chemically amplified resist composition;
after heat treatment, exposing the photoresist film to an EUV beam and dissolving an exposed part of the photoresist film by using an alkaline developer to form a positive pattern;
transferring the pattern to the silicon-containing resist underlayer film by dry etching using the photoresist film having the formed pattern as a mask;
transferring the pattern to the organic underlayer film by dry etching using the silicon-containing resist underlayer film having the transferred pattern as a mask; and
further transferring the pattern to the body to be processed by dry etching using the organic underlayer film having the transferred pattern as a mask.

8. A patterning process comprising:
forming an organic hard mask mainly containing carbon on a body to be processed by a CVD method;
forming a silicon-containing resist underlayer film on the organic hard mask by using the composition for forming a silicon-containing resist underlayer film according to claim 1;
forming a photoresist film on the silicon-containing resist underlayer film by using a chemically amplified resist composition;
after heat treatment, exposing the photoresist film to an EUV beam and dissolving an exposed part of the photoresist film by using an alkaline developer to form a positive pattern;
transferring the pattern to the silicon-containing resist underlayer film by dry etching using the photoresist film having the formed pattern as a mask;
transferring the pattern to the organic hard mask by dry etching using the silicon-containing resist underlayer film having the transferred pattern as a mask; and
further transferring the pattern to the body to be processed by dry etching using the organic hard mask having the transferred pattern as a mask.

9. The patterning process according to claim 7, wherein the body to be processed is a semiconductor device substrate, a metal film, an alloy film, a metal carbide film, a metal oxide film, a metal nitride film, a metal oxycarbide film, or a metal oxynitride film.

10. The patterning process according to claim 8, wherein the body to be processed is a semiconductor device substrate, a metal film, an alloy film, a metal carbide film, a metal oxide film, a metal nitride film, a metal oxycarbide film, or a metal oxynitride film.

11. The patterning process according to claim 7, wherein the metal of the body to be processed is silicon, gallium, titanium, tungsten, hafnium, zirconium, chromium, germanium, copper, aluminum, cobalt, iron, or an alloy thereof.

12. The patterning process according to claim 8, wherein the metal of the body to be processed is silicon, gallium, titanium, tungsten, hafnium, zirconium, chromium, germanium, copper, aluminum, cobalt, iron, or an alloy thereof.

* * * * *